(12) United States Patent
Young et al.

(10) Patent No.: US 11,770,934 B2
(45) Date of Patent: Sep. 26, 2023

(54) SEMICONDUCTOR STRUCTURE AND METHOD OF FABRICATING THE SAME

(71) Applicant: Taiwan Semiconductor Manufacturing Company, Ltd., Hsinchu (TW)

(72) Inventors: Bo-Feng Young, Taipei (TW); Sai-Hooi Yeong, Hsinchu County (TW); Shih-Lien Linus Lu, Hsinchu (TW); Chia-En Huang, Hsinchu County (TW); Yih Wang, Hsinchu (TW); Yu-Ming Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/400,087

(22) Filed: Aug. 11, 2021

(65) Prior Publication Data

US 2022/0231051 A1 Jul. 21, 2022

Related U.S. Application Data

(60) Provisional application No. 63/137,760, filed on Jan. 15, 2021.

(51) Int. Cl.
*G11C 11/22* (2006.01)
*H10B 51/20* (2023.01)
*G11C 5/06* (2006.01)
*H01L 23/522* (2006.01)

(52) U.S. Cl.
CPC .............. *H10B 51/20* (2023.02); *G11C 5/06* (2013.01); *G11C 11/223* (2013.01); *H01L 23/5221* (2013.01)

(58) Field of Classification Search
CPC ........ H10B 51/20; H10B 41/20; H10B 43/20; G11C 5/06; G11C 11/223; G11C 11/1657; G11C 11/2257; G11C 16/08; G11C 8/14; H01L 23/5221
See application file for complete search history.

(56) References Cited

U.S. PATENT DOCUMENTS

| | | | |
|---|---|---|---|
| 9,842,657 B1* | 12/2017 | Dutta | G11C 11/5628 |
| 2017/0256551 A1* | 9/2017 | Lee | H01L 27/1157 |
| 2020/0357813 A1* | 11/2020 | Tanzawa | H01L 27/11582 |
| 2021/0296232 A1* | 9/2021 | Zhang | H01L 21/76877 |

(Continued)

*Primary Examiner* — S M Sohel Imtiaz
(74) *Attorney, Agent, or Firm* — JCIPRNET

(57) ABSTRACT

A semiconductor structure includes a memory array, a staircase unit, conductive bridge structures, a word line driver and conductive routings. The memory array is disposed in an array region of the semiconductor structure and includes word lines. The staircase unit is disposed in a staircase region and surrounded by the array region. The staircase unit includes first and second staircase steps extending from the word lines of the memory array. The first staircase steps and the second staircase steps face towards each other. The conductive bridge structures are electrically connecting the first staircase steps to the second staircase step. The word line driver is disposed below the memory array and the staircase unit, wherein a central portion of the word line driver is overlapped with a central portion of the staircase unit. The conductive routings extend from the first and the second staircase steps to the word line driver.

20 Claims, 41 Drawing Sheets

(56) References Cited

U.S. PATENT DOCUMENTS

| | | | |
|---|---|---|---|
| 2021/0296335 A1* | 9/2021 | Sun | H01L 27/11578 |
| 2021/0366923 A1* | 11/2021 | Oh | H01L 27/11575 |
| 2022/0028440 A1* | 1/2022 | Tang | H01L 27/11575 |
| 2022/0108987 A1* | 4/2022 | Lee | H01L 27/0688 |
| 2022/0139950 A1* | 5/2022 | Guo | H01L 27/11519 |
| | | | 257/314 |
| 2022/0384341 A1* | 12/2022 | Tessariol | H01L 21/76877 |

\* cited by examiner

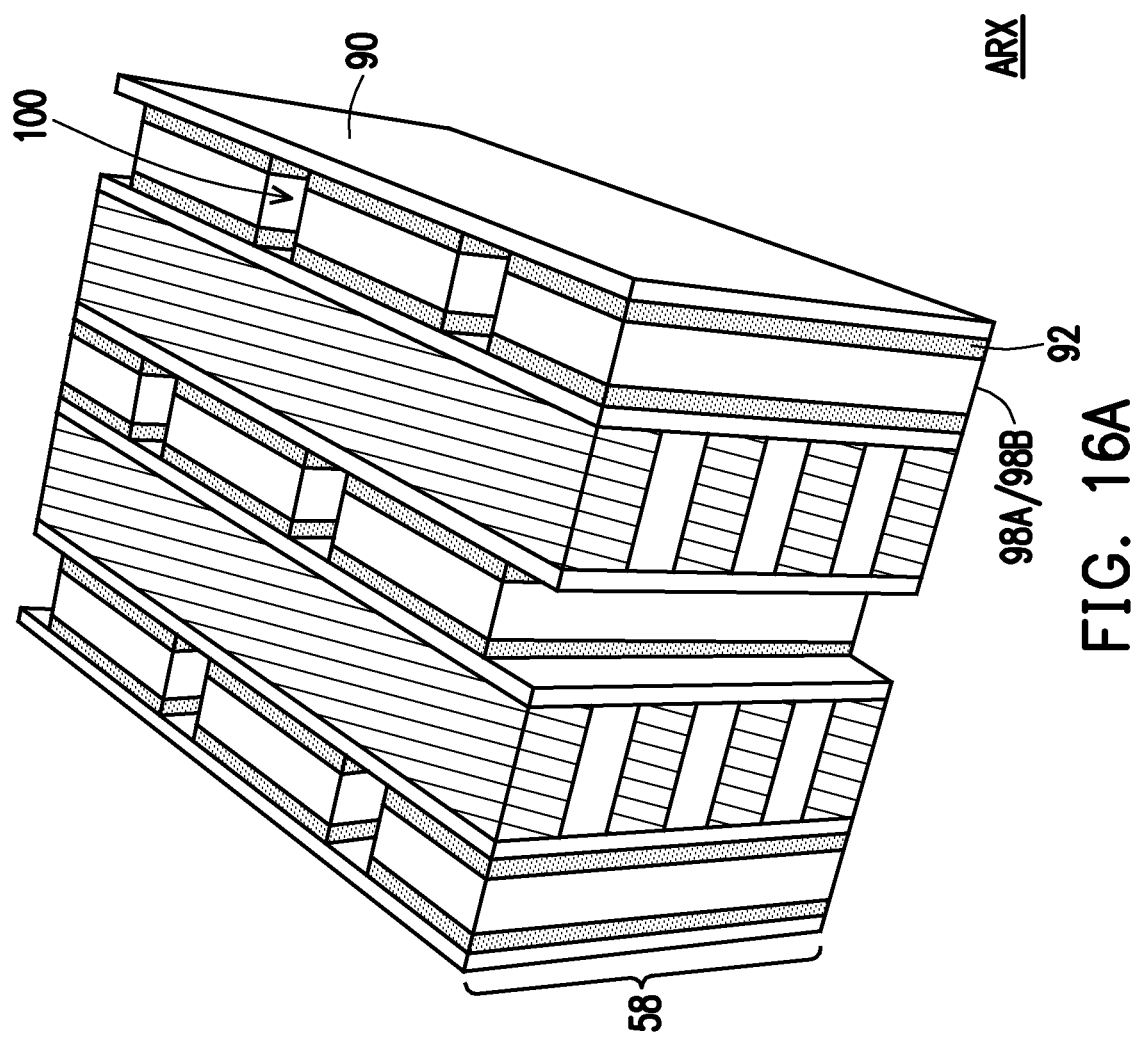

SEMICONDUCTOR STRUCTURE AND METHOD OF FABRICATING THE SAME

CROSS-REFERENCE TO RELATED APPLICATION

This application claims the priority benefit of U.S. provisional application Ser. No. 63/137,760, filed on Jan. 15, 2021. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
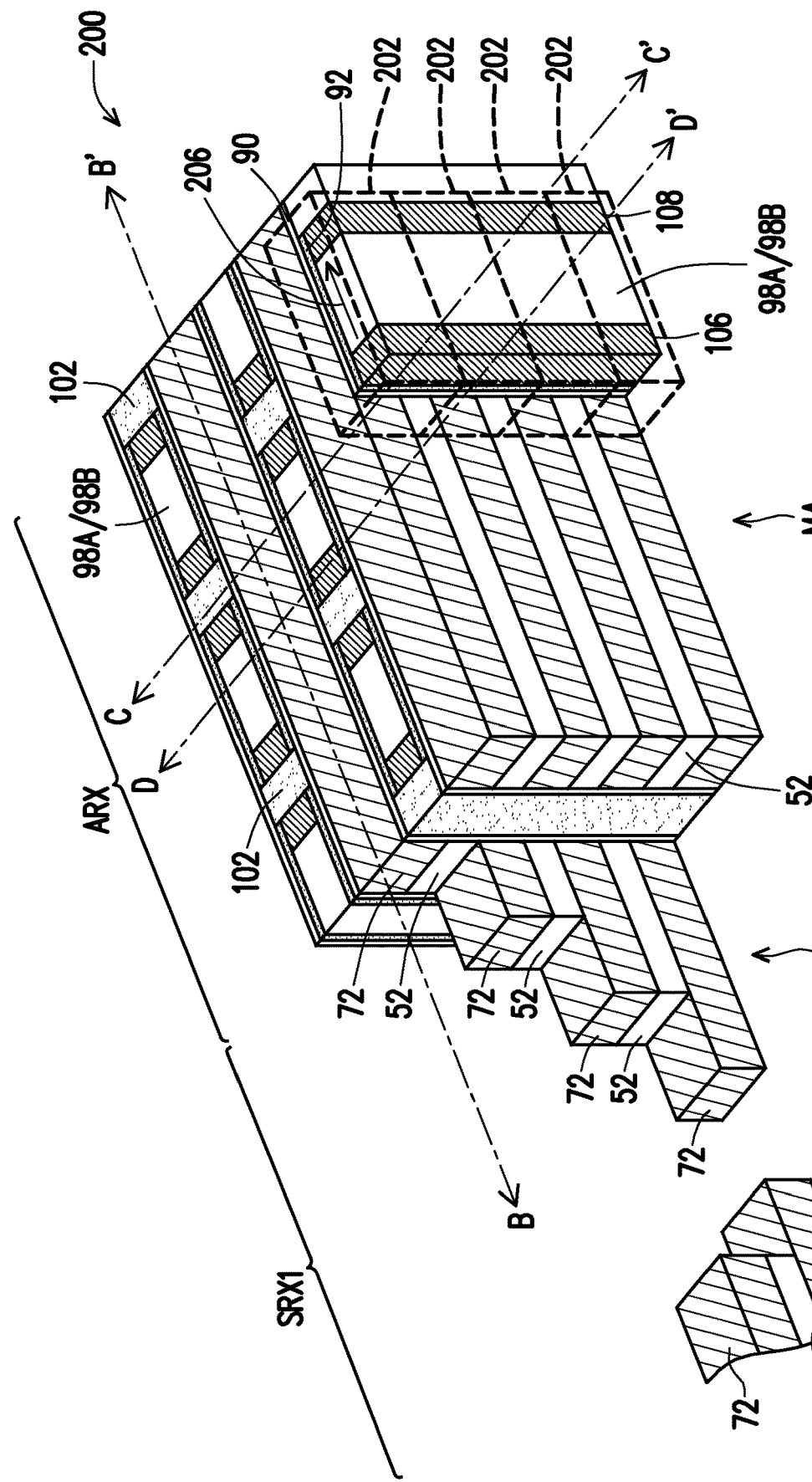
FIG. 1A to FIG. 1C illustrate a simplified perspective view, a circuit diagram, and a top down view of a semiconductor structure in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a semiconductor structure such as a 3D memory structure. In some embodiments, the 3D memory structure is a field effect transistor (FET) memory circuit including a plurality of vertically stacked memory cells. In some embodiments, each memory cell of the 3D memory structure is regarded as a FET that includes a word line region acting as a gate electrode, a bit line region acting as a first source/drain electrode, and a source line region acting as a second source/drain electrode, a gate dielectric, and an oxide semiconductor (OS) as a channel region. In some embodiments, each memory cell is regarded as a thin film transistor (TFT).

In conventional 3D memory structures, the word line staircases are usually disposed at two opposing edge regions of the memory array, with the staircase steps facing away from one another. Furthermore, single directional routing would be used for connecting each of the staircase steps (word lines) to a respective word line driver located below. As such, the routing of the word lines from the staircase steps to the word line driver usually include an enormous number of metallization layers and is cost inefficient. In some embodiments of the present disclosure, the routing of the word lines from the staircase steps to the word line driver is adjusted to simplify the process flow, and to reduce the fabrication costs.

Figure 1B:
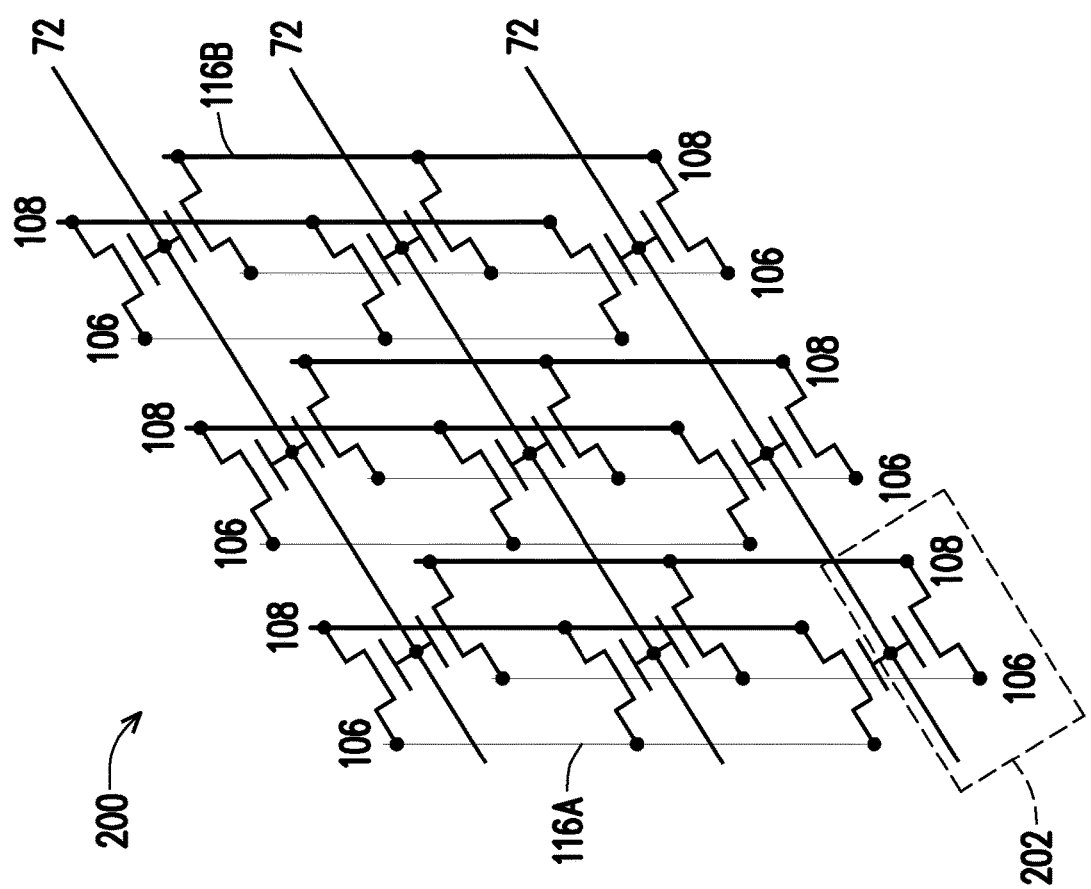
Figure 1C:
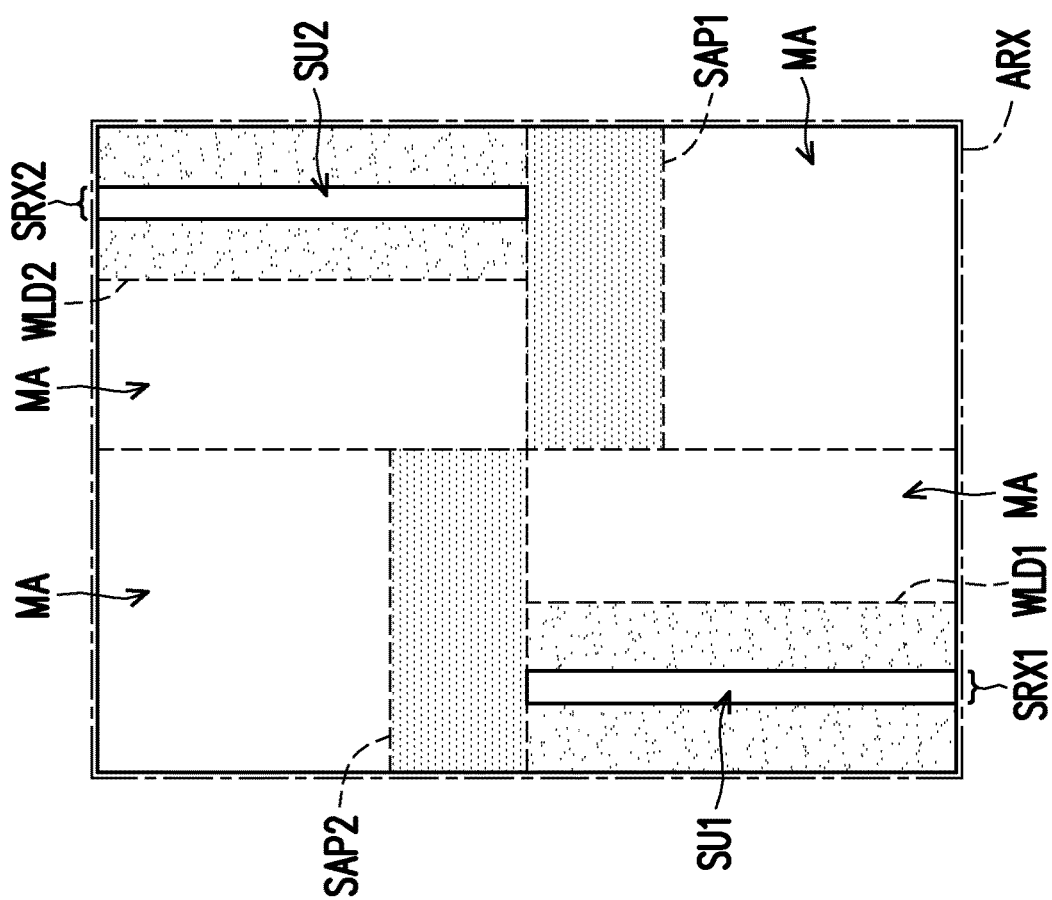

FIGS. 1A, 1B, and 1C illustrate examples of a semiconductor structure SMP (or memory device) according to some embodiments, FIG. 1A illustrates an example of a portion of a simplified memory device 200 in a partial three-dimensional view of the semiconductor structure SMP; FIG. 1B illustrates a circuit diagram of the memory device 200; and FIG. 1C illustrates a top down view of the semiconductor structure SMP in accordance with some embodiments. As illustrated in FIG. 1A to FIG. 1C, the memory device 200 includes a plurality of memory cells 202, which may be arranged in a grid of rows and columns to form a memory array MA in an array region ARX of the semiconductor structure SMP. The memory cells 202 may be further stacked vertically to provide a three-dimensional memory device, thereby increasing device density. The memory device 200 further includes a first staircase unit SU1 disposed in a first staircase region SRX1 of the semiconductor structure SMP, and a second staircase unit SU2 disposed in a second staircase region SRX2 of the semiconductor structure SMP (see FIG. 1C). For example, the first staircase unit SU1 and the second staircase unit SU2 are surrounded by the array region ARX, or surrounded by the memory array MA. In some embodiments, the memory device 200 may be disposed in the back end of line (BEOL) of a semiconductor die. For example, the memory device may be disposed in the interconnect layers of the semiconductor die, such as, above one or more active devices (e.g., transistors) formed on a semiconductor substrate.

Referring to FIGS. 1A to 1C, in some embodiments, the memory device 200 is a flash memory device, such as a NOR flash memory device, or the like. In some other embodiments, the memory device 200 is another type of non-volatile memory array, such as a magnetoresistive random-access memory (MRAM) array, a resistive random-access memory (RRAM) array, or the like. In some embodiments, a gate of each memory cell 202 is electrically coupled to a respective word line (e.g., conductive line 72 (or conductive layer)), a first source/drain region of each memory cell 202 is electrically coupled to a respective bit line (e.g., conductive line 116B), and a second source/drain region of each memory cell 202 is electrically coupled to a respective source line (e.g., conductive line 116A), which electrically couples the second source/drain region to ground. The memory cells 202 in a same horizontal row of the memory device 200 may share a common word line while the memory cells 202 in a same vertical column of the memory device 200 may share a common source line and a common bit line.

The memory device 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B), or extend from the array region ARX to the first staircase region SRX1 and the second staircase region SRX2 (illustrated in FIG. 1C). The conductive lines 72 may form a staircase configuration (first staircase unit SU1, second staircase unit SU2) such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above or below the memory device 200, and conductive contacts may be made to exposed portions of the conductive lines 72, respectively. Furthermore, the conductive lines 72 are also arranged so that the staircase steps formed in the first staircase unit SU1 and the second staircase unit SU2 are facing one another to form mirror image steps. In some embodiments, the word lines of the first staircase unit SU1 and the second staircase unit SU2 are connected to the word line drivers (first word line driver WLD1 and second word line driver WLD2) located underneath the memory array MA, or underneath the memory device 200.

The memory device 200 further includes conductive pillars 106 (e.g., electrically connected to bit lines) and conductive pillars 108 (e.g., electrically connected to source lines) arranged alternately in the memory array MA. The conductive pillars 106 and 108 (or electrode layers) may each extend in a direction perpendicular to the conductive lines 72. The conductive pillars 106 may be electrically connected to the underlying sense amplifiers (first sense amplifier SAP1 and second sense amplifier SAP2), which are part of the read circuitry that is used when data is read from the memory. Furthermore, a dielectric material 98A/98B is disposed between and isolates adjacent ones of the conductive pillars 106 and the conductive pillars 108.

Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground. Although FIG. 1A illustrates a particular placement of the conductive pillars 106 relative the conductive pillars 108, it should be appreciated that the placement of the conductive pillars 106 and 108 may be exchanged in other embodiments.

The memory structure 200 may also include an oxide semiconductor (OS) material as a channel material layer 92. The channel material layer 92 (or oxide semiconductor layer) may provide channel regions for the memory cells 202. For example, when an appropriate voltage (e.g., higher than a respective threshold voltage ($V_{th}$) of a corresponding memory cell 202) is applied through a corresponding conductive line 72, a region of the channel material layer 92 that intersects the conductive line 72 may allow current to flow from the conductive pillars 106 to the conductive pillars 108 (e.g., in the direction indicated by arrow 206).

In some embodiments, a dielectric layer 90 (or ferroelectric layer 90) is disposed between the channel material layer 92 and each of the conductive lines 72 and the dielectric layers 52, and the dielectric layer 90 may serve as a gate dielectric for each memory cell 202. In some embodiments, the dielectric layer 90 includes a ferroelectric material, such as a hafnium oxide, hafnium zirconium oxide, silicon-doped hafnium oxide, or the like. In some embodiments, the dielectric layer 90 includes a layer of SiNx between two SiOx layers (e.g., an ONO structure).

In some embodiments, when the dielectric layer 90 includes a ferroelectric material, the dielectric layer 90 may be polarized in one of two different directions, and the polarization direction may be changed by applying an appropriate voltage differential across the dielectric layer 90 and generating an appropriate electric field. The polarization may be relatively localized (e.g., generally contained within each boundaries of the memory cells 202), and a continuous region of the dielectric layer 90 may extend across a plurality of memory cells 202. Depending on a polarization direction of a particular region of the dielectric layer 90 (or ferroelectric layer 90), a threshold voltage of a corresponding memory cell 202 varies, and a digital value (e.g., 0 or 1) can be stored. For example, when a region of the dielectric layer 90 (or ferroelectric layer 90) has a first electrical polarization direction, the corresponding memory cell 202 may have a relatively low threshold voltage, and when the region of the dielectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the dielectric layer 90 (or ferroelectric layer 90) corresponding to the memory cell 202. In some embodiments, the write voltage is applied, for example, by applying appropriate voltages to a corresponding conductive line 72 (e.g., the word line) and the corresponding conductive pillars 106/108 (e.g., the bit line/source line). By applying the write voltage across the portion of the dielectric layer 90, a polarization direction of the region of the dielectric layer 90 can be changed. As a result, the corresponding threshold voltage of the corresponding memory cell 202 can also be switched from a low threshold voltage to a high threshold voltage or vice versa, and a digital value can be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the dielectric layer 90 (or ferroelectric layer 90), the memory cell 202 may or may not be turned on. As a result, the conductive pillar 106 may or may not be discharged through the conductive pillar 108 (e.g., a source line that is coupled to ground), and the digital value stored in the memory cell 202 can be determined. As the conductive lines 72 intersect the conductive pillars 106 and 108, individual memory cells 202 may be selected for the read operation.

FIG. 1A further illustrates reference cross-sections of the memory device 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98A/98B and the isolation pillars 102. Cross-section D-D' is perpendicular to cross-section B-B' and extends through the dielectric materials 98A/98B and the conductive pillars 106. Subsequent figures refer to these reference cross-sections for clarity.

Figure 2:
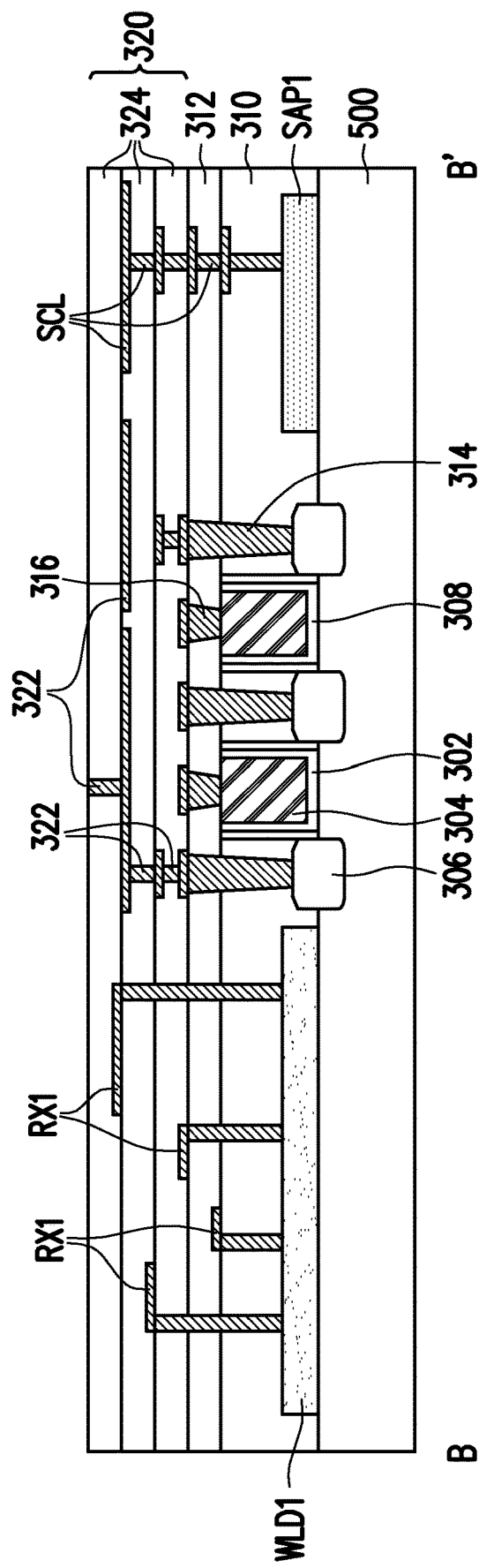
FIG. 2 to FIG. 21 illustrate various views in a method of manufacturing a semiconductor structure in accordance with some embodiments of the disclosure.

FIG. 2 to FIG. 21 illustrate various views in a method of manufacturing a semiconductor structure in accordance with some embodiments of the disclosure. Referring to FIG. 2, a substrate 500 is provided. The substrate 500 may be a semiconductor substrate, such as a bulk semiconductor, a semiconductor-on-insulator (SOI) substrate, or the like, which may be doped (e.g., with a p-type or an n-type dopant) or undoped. The substrate 500 may be an integrated circuit die, such as a logic die, a memory die, an ASIC die, or the like. The substrate 500 may be a complementary metal oxide semiconductor (CMOS) die and may be referred to as a CMOS under array (CUA). The substrate 500 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 500 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 500 (e.g. circuits forming a bottom interconnection array). The circuits include transistors at a top surface of the substrate 500. The transistors may include gate dielectric layers 302 over top surfaces of the substrate 500 and gate electrodes 304 over the gate dielectric layers 302. Source/drain regions 306 are disposed in the substrate 500 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 500, other active devices (e.g., diodes or the like) and/or passive devices (e.g., capacitors, resistors, or the like) may also be formed as part of the functional circuits.

As further illustrated in FIG. 2, in some embodiments, the circuits of the bottom interconnection array further includes a first word line driver WLD1 and a first sense amplifier SAP1 disposed over the semiconductor substrate 500. Although not particularly shown in FIG. 2, a second word line driver WLD2 and a second sense amplifier SAP2 may also be disposed over the semiconductor substrate 500 in the same manner (in the arrangement shown in FIG. 1C). A first portion of routings RX1 may be formed to extend through the dielectric layers 324, the second ILD 312 and the first ILD 310 to be electrically connected to the word line drivers (WLD1 and WLD2). Similarly, conductive layers SCL may be formed to extend through the dielectric layers 324, the second ILD 312 and the first ILD 310 to be electrically connected to the sense amplifiers (SAP1 and SAP2). In some embodiments, the first portion of routings RX1 and the conductive layers SCL may be made of conductive materials formed by electroplating or deposition, such as aluminum, titanium, copper, nickel, tungsten, and/or alloys thereof, which may be patterned using a photolithography and etching process.

Figure 3A:
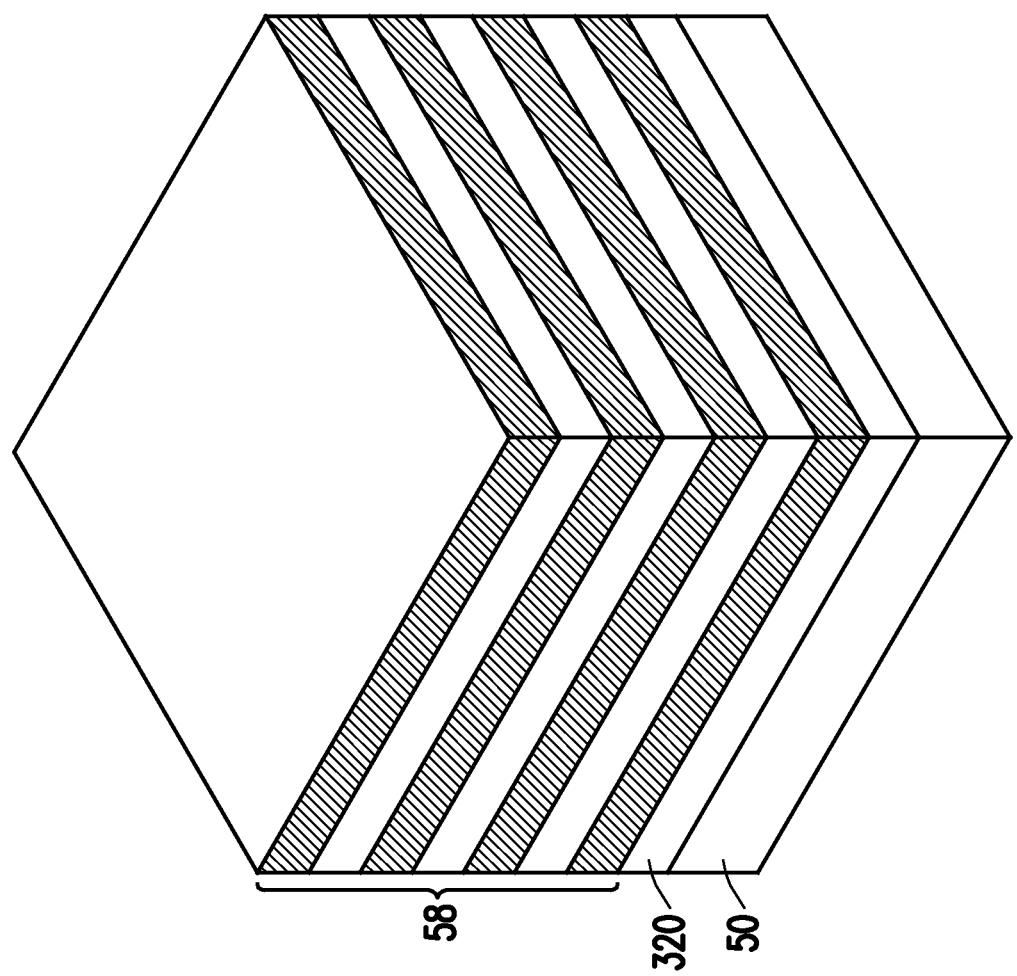
Figure 3B:
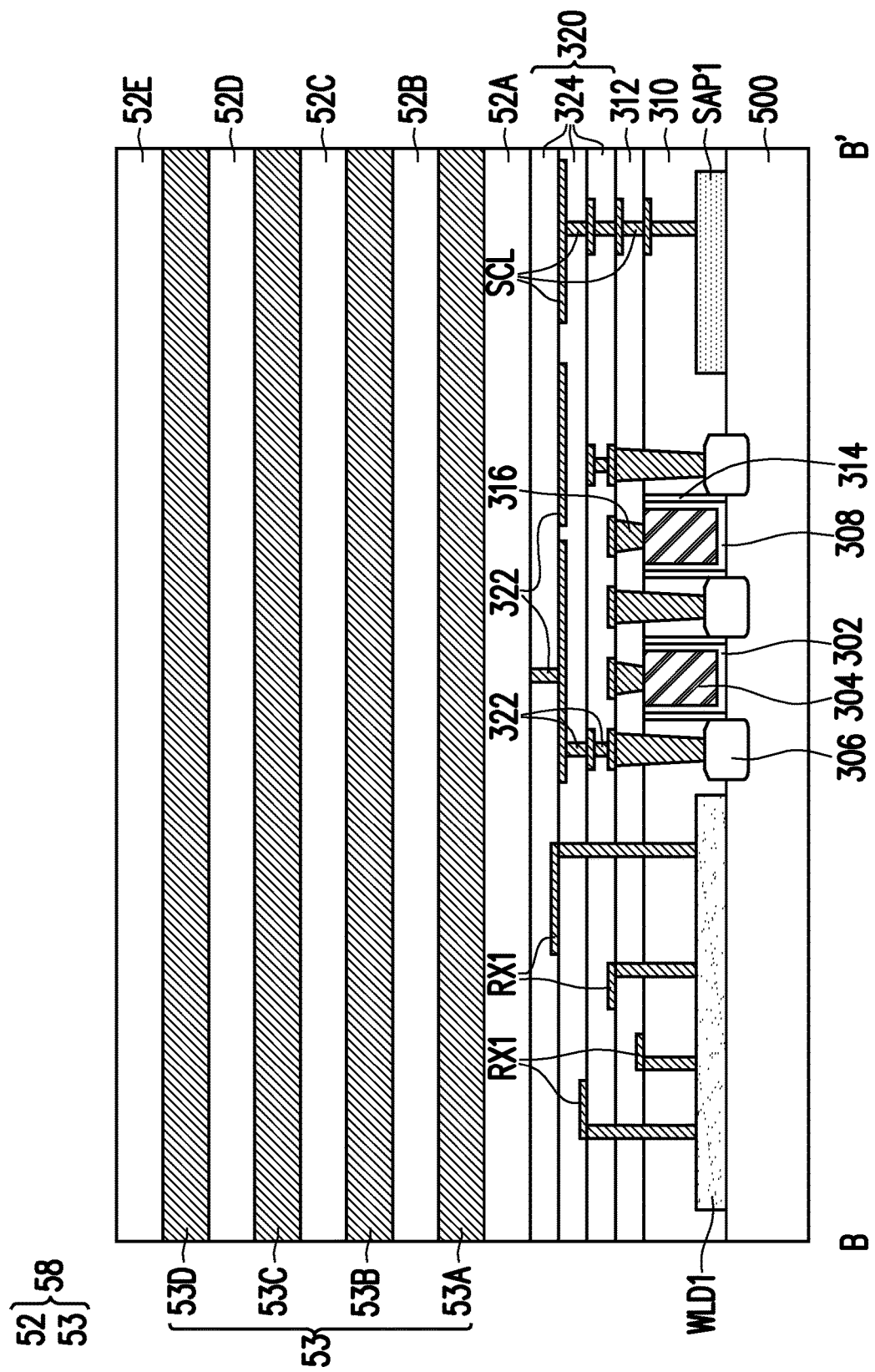

Referring to FIGS. 3A and 3B, a multi-layer stack 58 is formed over the structure of FIG. 2. Although the multi-layer stack 58 is illustrated as contacting the dielectric layers 324 of the interconnect structure 320, any number of intermediate layers may be disposed between the substrate 500 and the multi-layer stack 58. For example, one or more additional interconnect layers comprising conductive features in insulting layers (e.g., low-k dielectric layers) may be disposed between the substrate 500 and the multi-layer stack 58. In some embodiments, conductive features may be patterned to provide power, ground, and/or signal lines for the active devices on the substrate 500 and/or the memory device 200 (see FIGS. 1A and 1B). In some embodiments, one or more interconnect layers including conductive features in insulting layers (e.g., low-k dielectric layers) may be disposed over the multi-layer stack 58.

The multi-layer stack 58 includes alternating layers of conductive layers 53A-53D (collectively referred to as conductive layers 53) and dielectric layers 52A-52E (collectively referred to as dielectric layers 52). The conductive layers 53 may be patterned in subsequent steps to define the conductive lines 72 (e.g., word lines). The conductive layers 53 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 53 and dielectric layers 52 may be each formed using, for example, chemical vapor deposition (CVD), atomic layer deposition (ALD), physical vapor deposition (PVD), plasma enhanced CVD (PECVD), or the like.

Although FIGS. 3A and 3B illustrate a particular number of conductive layers 53 and dielectric layers 52, other embodiments may include a different number of conductive layers 53 and dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a conductive layer.

Figure 5:
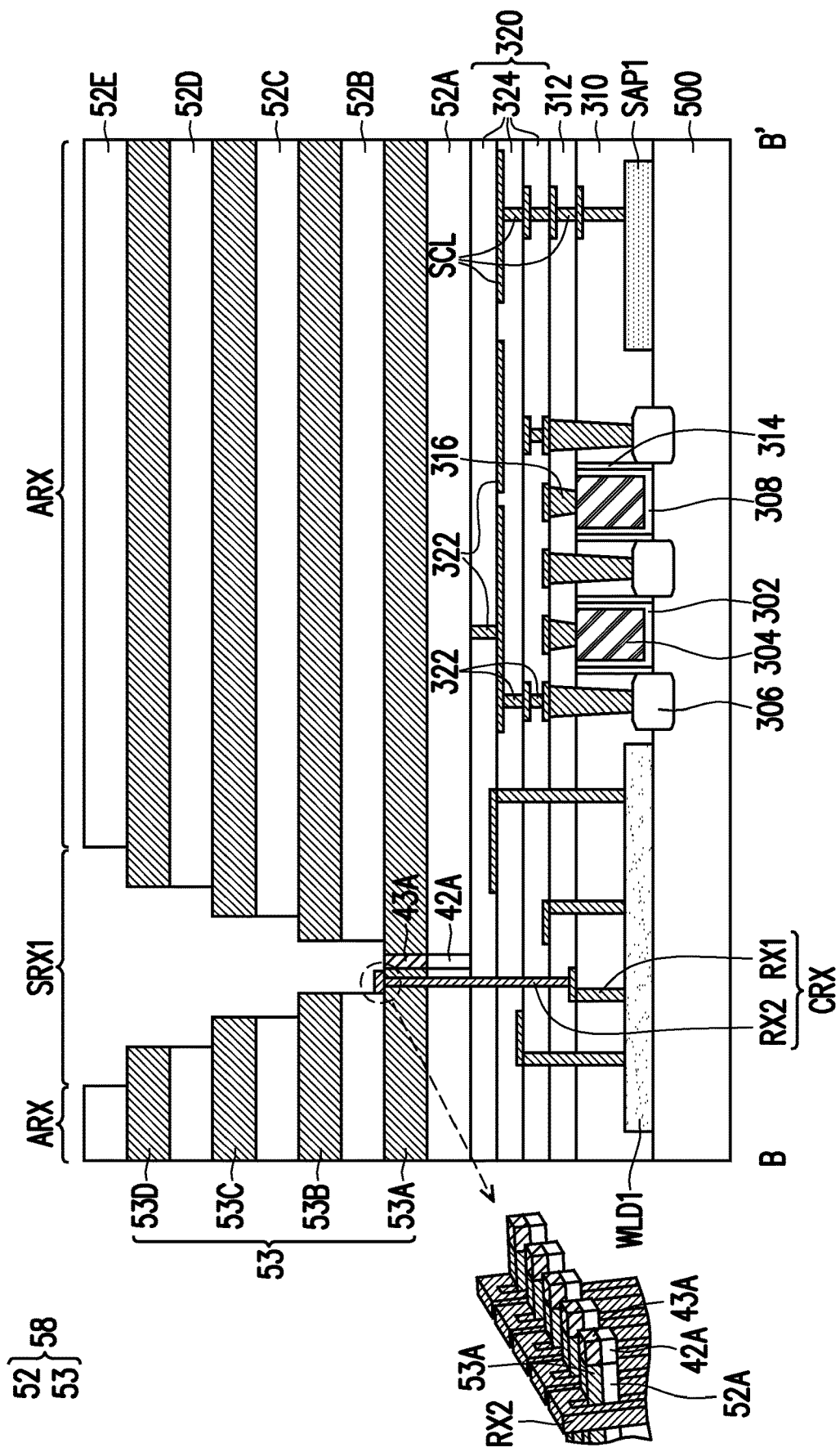
Figure 6A:
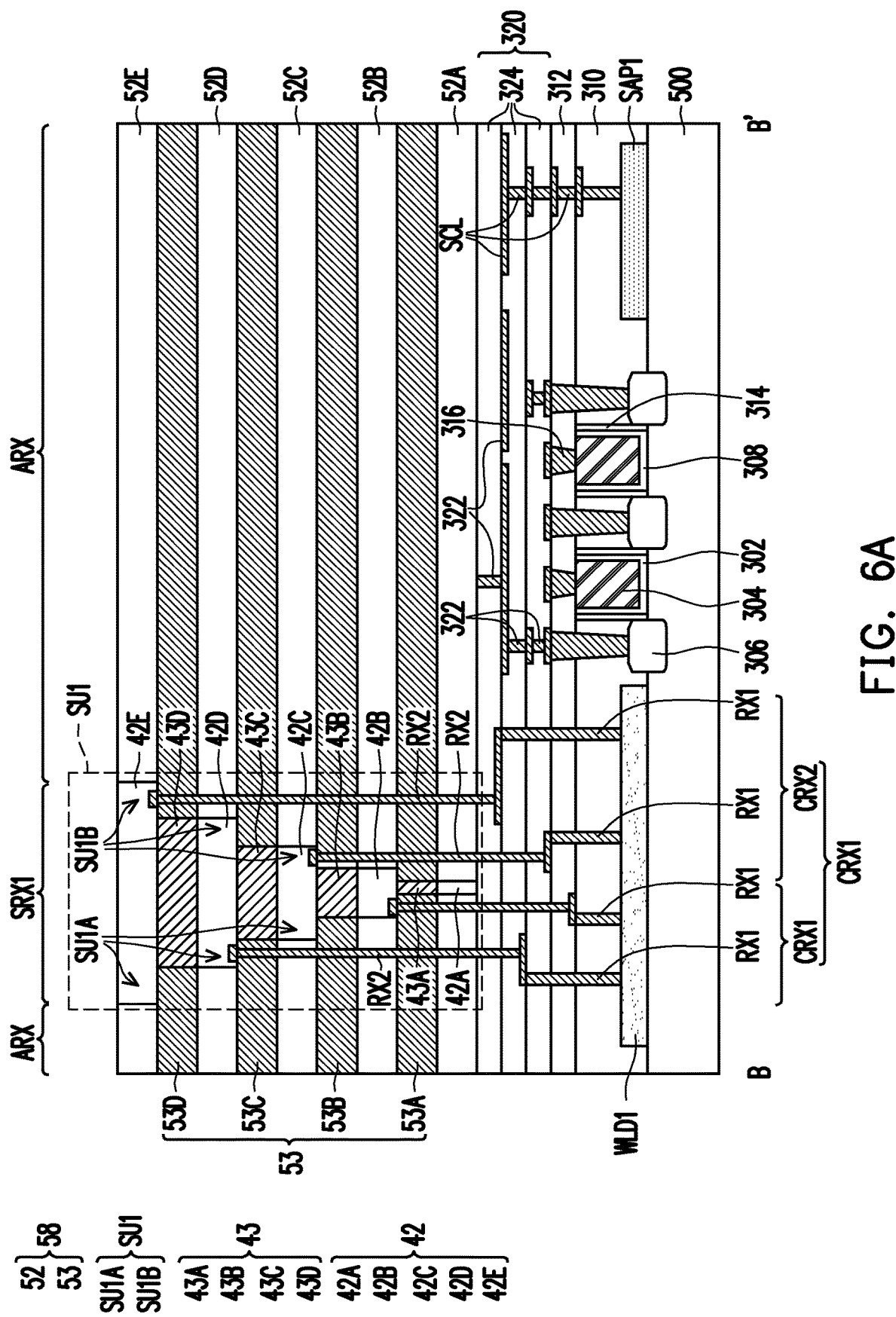
Figure 6B:
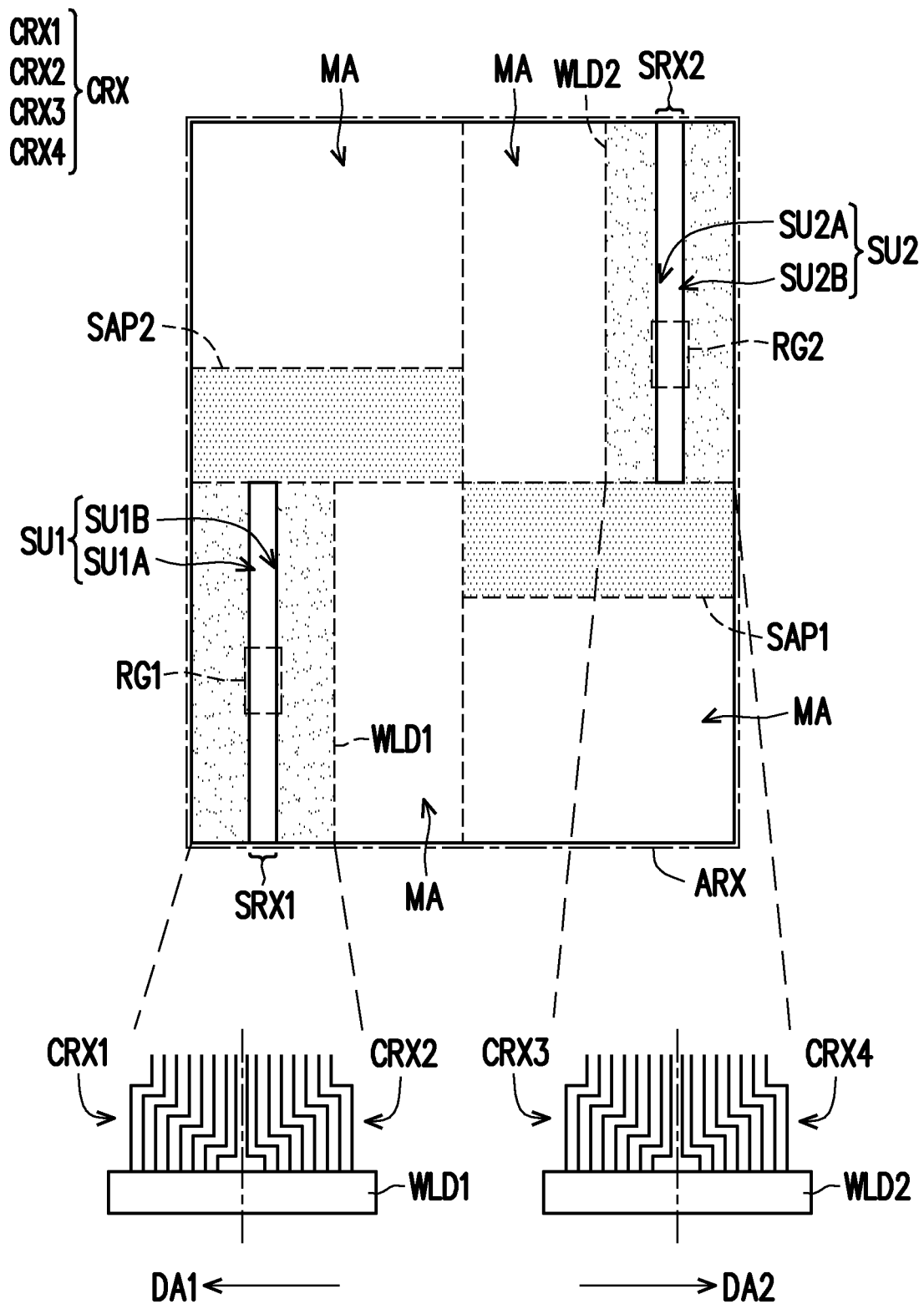
Figure 7A:
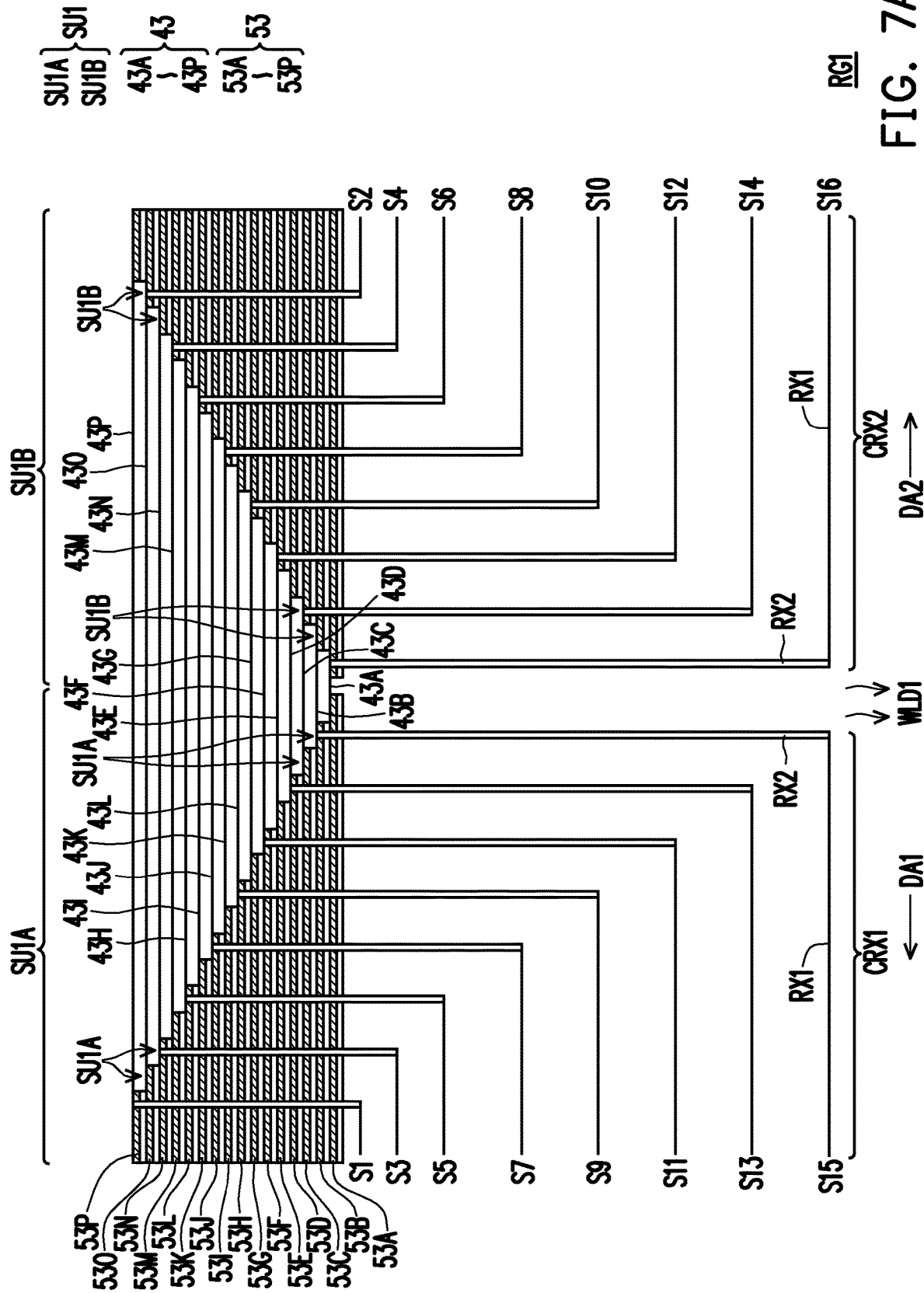
Figure 7B:
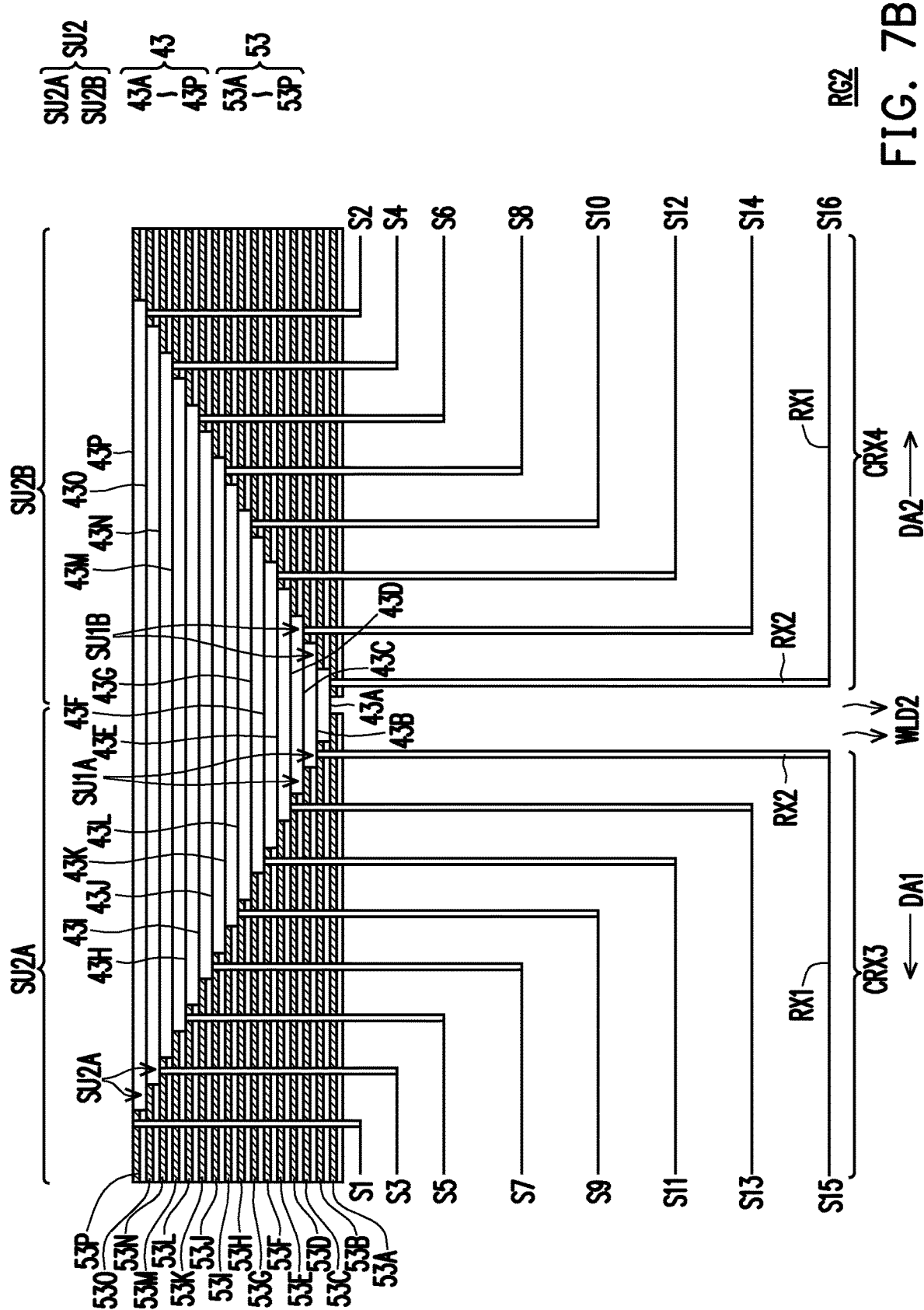

FIG. 4 through FIG. 7B are various views of intermediate stages in the manufacturing of a staircase unit (first staircase unit SU1) of the memory device 200, in accordance with some embodiments. FIG. 4 through FIG. 6A are illustrated along cross-section B-B' shown in FIG. 1A. FIG. 6B illustrates a top view of the structure shown in FIG. 6A. FIG. 7A and FIG. 7B illustrate enlarged sectional views of the staircase units (first staircase unit SU1 and second staircase unit SU2) shown in FIG. 6B.

Figure 4:
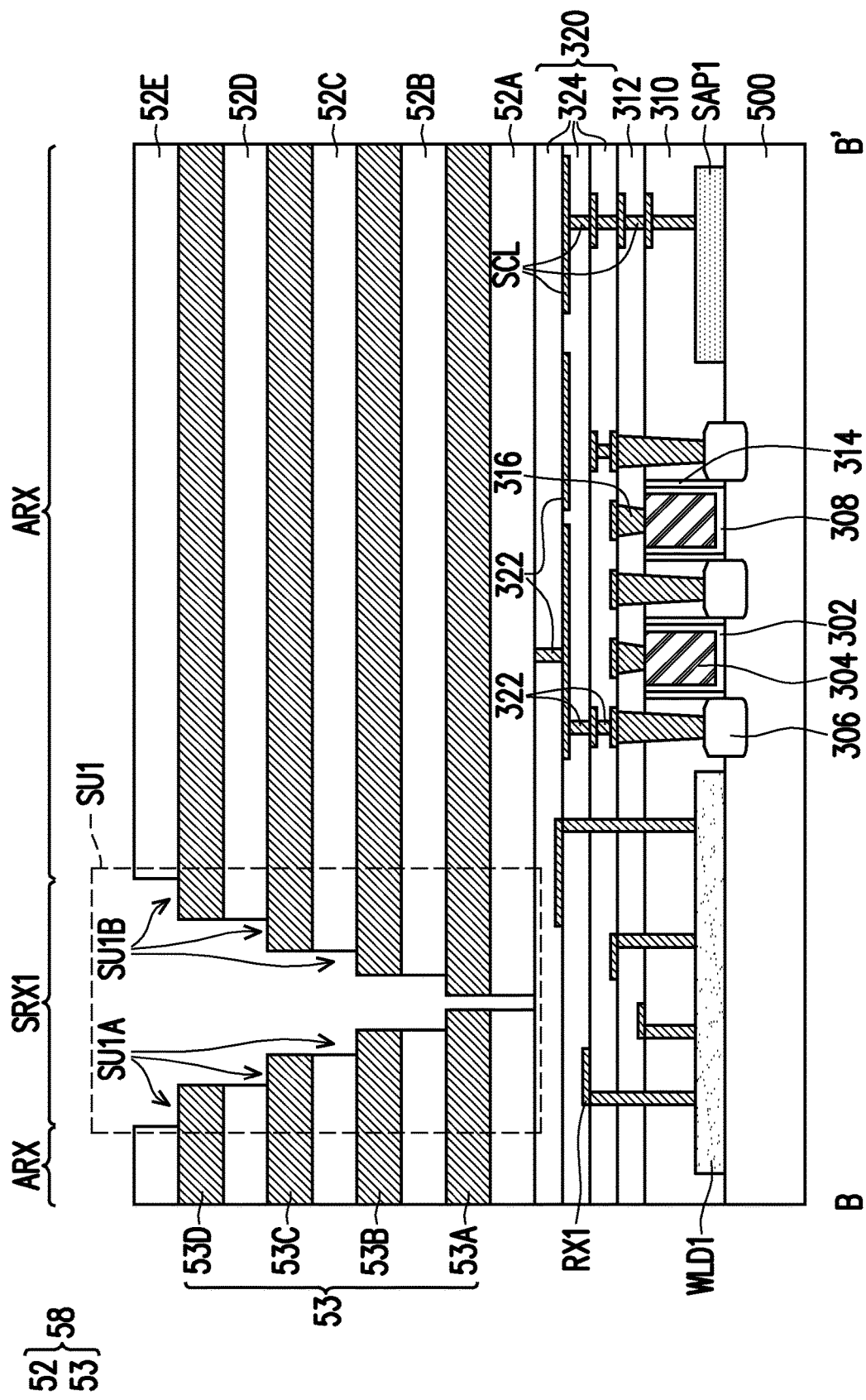

As illustrated in FIG. 4, in some embodiments, the multi-layer stack 58 is patterned to form a first staircase unit SU1 in the first staircase region SRX1. For example, the first staircase unit SU1 is formed with first staircase steps SU1A and second staircase steps SU1B, wherein the first staircase steps SU1A and the second staircase steps SU1B face towards each other. The first staircase steps SU1A and the second staircase steps SU1B are mirror image steps. In some embodiments, the first staircase steps SU1A and the second staircase steps SU1B are formed by forming a photoresist pattern (not shown) over the multi-layer stack 58, and etching the multi-layer stack 58 by using the photoresist pattern as a mask. The etching may be any acceptable etching process, such as a dry etch (e.g., a reactive ion etch (RIE), a neutral beam etch (NBE), the like), a wet etch, the like, or a combination thereof. The formation of the photoresist pattern and the etching process may be repeated until the first staircase steps SU1A and the second staircase steps SU1B of the first staircase unit SU1 are formed in the multi-layer stack 58.

In some embodiments, the first staircase region SRX1 is surrounded by the array region ARX. Furthermore, the first staircase steps SU1A and the second staircase steps SU1B may extend from the conductive layers 53 (the word lines) of the array region ARX into the first staircase region SRX1. In some embodiments, the first staircase region SRX1 (or the first staircase unit SU1) is formed over the first word line driver WLD1 so that a central portion of the word line driver WLD1 is overlapped with a central portion of the staircase unit SU1. In certain embodiments, the lateral dimension or size of the staircase unit SU1 is smaller than a lateral dimension or size of the word line driver WLD1 (see FIG. 4). The first staircase region SRX1 may also be located within an area overlapped with a top surface of the word line driver WLD1.

Referring to FIG. 5, in a subsequent step, a dielectric layer 42A is formed in the opening of the dielectric layer 52A in the first staircase region SRX1 between the first staircase steps SU1A and the second staircase steps SU1B. Thereafter, a conductive bridge structure 43A is formed in the opening of the conductive layer 53A in the first staircase region SRX1, and electrically connecting the first staircase steps SU1A to the second staircase steps SU1B. In the illustrated embodiment, although the conductive bridge structure 43A is formed with the same height as the conducive layer 53A, however, the disclosure is not limited thereto. In alternative embodiments, the conductive bridge structure 43A may have a height that is smaller than a height of the conductive layer 53A (word lines). Thereafter, dielectric materials may be formed over the conductive bridge structure 43A so that the dielectric materials are leveled with the conductive layer 53A.

A material of the conductive bridge structure 43A may be similar to a material of the conductive layers 53. For example, the conductive bridge structure 43A may comprise a conductive material, such as, copper, titanium, titanium nitride, tantalum, tantalum nitride, tungsten, ruthenium, aluminum, combinations thereof, or the like. Similarly, a material of the dielectric layer 42A may be similar to a material of the dielectric layers 52. For example, the dielectric layer 42A may comprise an insulating material, such as silicon oxide, silicon nitride, silicon oxynitride, combinations thereof, or the like.

After forming the dielectric layer 42A and the conductive bridge structure 43A, a second portion of routings RX2 is formed on the bottommost first staircase steps SU1A (part of conductive layer 53A) to electrically connect the conductive layer 53A (the word line) to the first portion of routings RX1. For example, the second portion of routings RX2 formed on the first staircase steps SU1A will extend through a space (or dielectric layer) between neighboring staircase steps to reach the first portion of routings RX1 located underneath (see enlarged 3D view in FIG. 5 indicated by an arrow). In some embodiments, the first portion of routings RX1 and the second portion of routings RX2 together constitute conductive routings CRX of the semiconductor structure. The conductive routings CRX (including routings RX1 and RX2) electrically connect the first staircase steps SU1A (part of conductive layer 53A/word line) to the first word line driver WLD1.

Referring to FIG. 6A and FIG. 6B, dielectric layers 42B~42E and conductive bridge structures 43B~43D may be alternately formed in between the first staircase steps SU1A and the second staircase steps SU1B in a way similar to the formation of the dielectric layer 42A and the conductive bridge structure 43A. The dielectric layers 42A~42E are collectively referred to as dielectric layers 42, while the conductive bridge structures 43A~43D are collectively referred to as conductive bridge structures 43. In addition, second portion of routings RX2 may be respectively formed on the first staircase steps SU1A (on conductive layer 53C) or on the second staircase steps SU1B (on conductive layers 53B and 53D) to electrically connect the conductive layers 53 (the word lines) to the first portion of routings RX1 underneath.

In some embodiments, the conductive routings CRX (including routings RX1 and RX2) located on the first staircase steps SU1A are the first conductive routings CRX1, while the conductive routings CRX (RX1, RX2) located on the second staircase steps SU1B are the second conductive routings CRX2. In the exemplary embodiment, the first conductive routings CRX1 extend in a first direction DA1 from the first staircase steps SU1A to a first half (left portion) of the first word line driver WLD1. Furthermore, the second conductive routings CRX2 extend in a second direction DA2 from the second staircase steps SU1B to a second half (right portion) of the first word line driver WLD1, wherein the first direction DA1 is opposite to second direction DA2. As such, bi-directional routing of the conductive layers 53 (the word lines) from the first staircase unit SU1 to the first word line driver WLD1 can be achieved.

Although FIG. 6A illustrates the formation of a first staircase unit SU1 with four conductive layers 53 (53A~53D), it should be noted that more than four conductive layers 53 (word lines) may in fact be formed in the first staircase unit SU1, and more staircase units may also be formed in other regions of the semiconductor structure. For example, as illustrated in FIG. 6B, while the first staircase unit SU1 is formed in the first staircase region SRX1 over the first word line driver WLD1, a second staircase unit SU2 may be formed in a second staircase region SRX2 over a second word line driver WLD2. The second staircase unit SU2 may be formed by the same method as described for the first staircase unit SU1, thus its details will not be repeated herein.

In the exemplary embodiment, the first staircase region SRX1 and the second staircase region SRX2 are surrounded by the array region ARX and separated from one another. For example, the first stair case region SRX1 and the second staircase region SRX2 do not overlap one another in an extension direction of the conductive layers 53 (the word lines). In some embodiments, the first word line driver WLD1 overlaps with the first sense amplifier SAP1 along the extension direction of the conductive layers 53 (the word lines), while the second word line driver WLD2 overlaps with the second sense amplifier SAP2 along the extension direction of the conductive layers 53 (the word lines).

The second staircase unit SU2 located in the second staircase region SRX2 may include third staircase steps SU2A and fourth staircase steps SU2B extending from the conductive layers 53 (the word lines). The third staircase steps SU2A and the fourth staircase steps SU2B are similar to the first staircase steps SU1A and the second staircase steps SU1B described above, thus its details will be omitted herein. Furthermore, the conductive routings CRX (inclusive of routings RX1 and RX2) may further include third conductive routings CRX3 and fourth conducive routings CRX4 for electrically connecting the second staircase unit SU2 to the second word line driver WLD2. For example, the third conductive routings CRX3 extend in a first direction DA1 from the third staircase steps SU2A to a first half (left portion) of the second word line driver WLD2. Furthermore, the fourth conductive routings CRX4 extend in a second direction DA2 from the fourth staircase steps SU2B to a second half (right portion) of the second word line driver WLD1, wherein the first direction DA1 is opposite to second direction DA2. As such, bi-directional routing of the conductive layers 53 (the word lines) from the second staircase unit SU2 to the second word line driver WLD2 can be achieved.

FIG. 7A is the enlarged sectional view of the region RG1 shown in FIG. 6B, while FIG. 7B is the enlarged sectional view of the region RG2 shown in FIG. 6B. The connections of the conductive routings CRX from the staircase units (SU1, SU2) to the word line drivers (WLD1, WLD2) will be described in more detail by referring to the enlarged views of region RG1 and region RG2.

As illustrated in FIG. 7A, in some embodiments, the first staircase unit SU1 is formed with sixteen conductive layers 53 (53A~53P). In other words, the first staircase steps SU1A and the second staircase steps SU1B respectively include sixteen steps. In the exemplary embodiment, sixteen conductive bridge structures 43 (43A~43P) are respectively used to connect each of the first staircase steps SU1A to each of the second staircase steps SU1B. The dielectric layers 42 in between the conductive bridge structures 43 are omitted for ease of illustration. In some embodiments, the first staircase steps SU1A and the second staircase steps SU1B respectively include odd number steps (steps S1, S3, S5, S7, S9, S11, S13 and S15; counting from top to bottom) and even number steps (steps S2, S4, S6, S8, S10, S12, S14 and S16; counting from top to bottom).

In the first staircase steps SU1A, the odd number steps (steps S1, S3, S5, S7, S9, S11, S13 and S15) are electrically connected to the first word line driver WLD1 directly through the first conductive routing CRX1. Furthermore, the even numbers steps (steps S2, S4, S6, S8, S10, S12, S14 and S16) are electrically connected to the first word line driver WLD1 through the conductive bridge structures 43 and the second conductive routings CRX2. Similarly, in the second staircase steps SU1B, the odd number steps (steps S1, S3, S5, S7, S9, S11, S13 and S15) are electrically connected to the first word line driver WLD1 through the conductive bridge structures 43 and the first conductive routings CRX1. Furthermore, the even number steps (steps S2, S4, S6, S8, S10, S12, S14 and S16) are electrically connected to the first word line driver WLD1 directly through the second conductive routings CRX2.

Since the first staircase steps SU1A and the second staircase steps SU1B are electrically connected to one another through the conductive bridge structures 43, the number of conductive routings (CRX1, CRX2) extending from the first staircase steps SU1A and the second staircase steps SU1B may be reduced to half. For example, when a first conductive routing CRX1 is electrically connecting the first step S1 (conductive layer 53P or word line) of the first staircase steps SU1A to the first word line driver WLD1, then the need of a conductive routing connecting the first step S1 (conductive layer 53P or word line) of the second staircase steps SU1B to the first word line driver WLD1 is omitted.

Similarly, referring to FIG. 7B, the second staircase unit SU2 is formed with sixteen conductive layers 53 (53A~53P). In other words, the third staircase steps SU2A and the fourth staircase steps SU2B respectively include sixteen steps. In the exemplary embodiment, sixteen conductive bridge structures 43 (43A~43P) are respectively used to connect each of the third staircase steps SU2A to each of the fourth staircase steps SU2B. The dielectric layers 42 in between the conductive bridge structures 43 are omitted for ease of illustration. In some embodiments, the third staircase steps SU2A and the fourth staircase steps SU2B respectively include odd number steps (steps S1, S3, S5, S7, S9, S11, S13 and S15; counting from top to bottom)

and even number steps (steps S2, S4, S6, S8, S10, S12, S14 and S16; counting from top to bottom).

In the third staircase steps SU2A, the odd number steps (steps S1, S3, S5, S7, S9, S11, S13 and S15) are electrically connected to the second word line driver WLD2 directly through the third conductive routing CRX3. Furthermore, the even numbers steps (steps S2, S4, S6, S8, S10, S12, S14 and S16) are electrically connected to the second word line driver WLD2 through the conductive bridge structures 43 and the fourth conductive routings CRX4. Similarly, in the fourth staircase steps SU2B, the odd number steps (steps S1, S3, S5, S7, S9, S11, S13 and S15) are electrically connected to the second word line driver WLD2 through the conductive bridge structures 43 and the third conductive routings CRX3. Furthermore, the even number steps (steps S2, S4, S6, S8, S10, S12, S14 and S16) are electrically connected to the second word line driver WLD2 directly through the fourth conductive routings CRX4.

Since the third staircase steps SU2A and the fourth staircase steps SU2B are electrically connected to one another through the conductive bridge structures 43, the number of conductive routings (CRX3, CRX4) extending from the third staircase steps SU2A and the fourth staircase steps SU2B may be reduced to half. For example, when a third conductive routing CRX3 is electrically connecting the first step S1 (conductive layer 53P or word line) of the third staircase steps SU2A to the second word line driver WLD2, then the need of a conductive routing connecting the first step S1 (conductive layer 53P or word line) of the fourth staircase steps SU2B to the second word line driver WLD2 is omitted.

Therefore, in a case when the number of layers of the conductive layers 53 (or word lines) is X, then the number A1 of the first conductive routings CRX1 extending from the first staircase steps SU1A in the first staircase region SRX1, the number A2 of the second conductive routings CRX2 extending from the second staircase steps SU1B in the first staircase region SRX1, the number A3 of the third conductive routings CRX3 extending from the third staircase steps SU2A in the second staircase region SRX2, the number A4 of the fourth conductive routings CRX4 extending from the fourth staircase steps SU2B in the second staircase region SRX2 will fulfill: X/A1=2; X/A2=2; X/A3=2 and X/A4=2.

In one embodiment, when there are sixteen conductive layers 53 (53A~53P; or sixteen layers of word lines), then the number of first conductive routings CRX1, the number of second conductive routings CRX2, the number of third conductive routings CRX3 and the number of fourth conductive routings CRX4 will be eight respectively. As such, in the present embodiment, as compared to conventional arrangements where routings or metallization layer will be present on each of the staircase steps, the total amount of conductive routings CRX (or metallization layers) extending from the mirror images steps (SU1A, SU1B) of the first staircase unit SU1 and the mirror image steps (SU2A, SU2B) of the second staircase unit SU2 may be reduced.

After patterning the bulk multi-layer stack 58 to form the first staircase unit SU1 and the second staircase unit SU2, the formation of the memory array MA in the array region ARX will then be described. It is noted that the sequence of patterning the multi-layer stack 58 to form the first staircase unit SU1, the second staircase unit SU2 and the memory array MA is not particularly limited, and the sequence may be adjusted based on process requirements.

FIG. 8 through FIG. 20B are various views of intermediate stages in the manufacturing of a memory array MA in an array region ARX of the memory device 200, in accordance with some embodiments of the disclosure. Portions of the array region ARX are illustrated in FIG. 8 through FIG. 20B. However, it should be noted that the manufacturing process described in FIG. 8 through FIG. 20B may be applied to the entire array region ARX illustrated in FIG. 6B. Furthermore, the substrate 500, the transistors, the word line drivers (WLD1 and WLD2), the sense amplifiers (SAP1 and SAP2), the ILDs, the interconnect structure 320 and the staircase regions (SRX1, SRX2) may be omitted from subsequent drawings for the purposes of simplicity and clarity.

Figure 8:
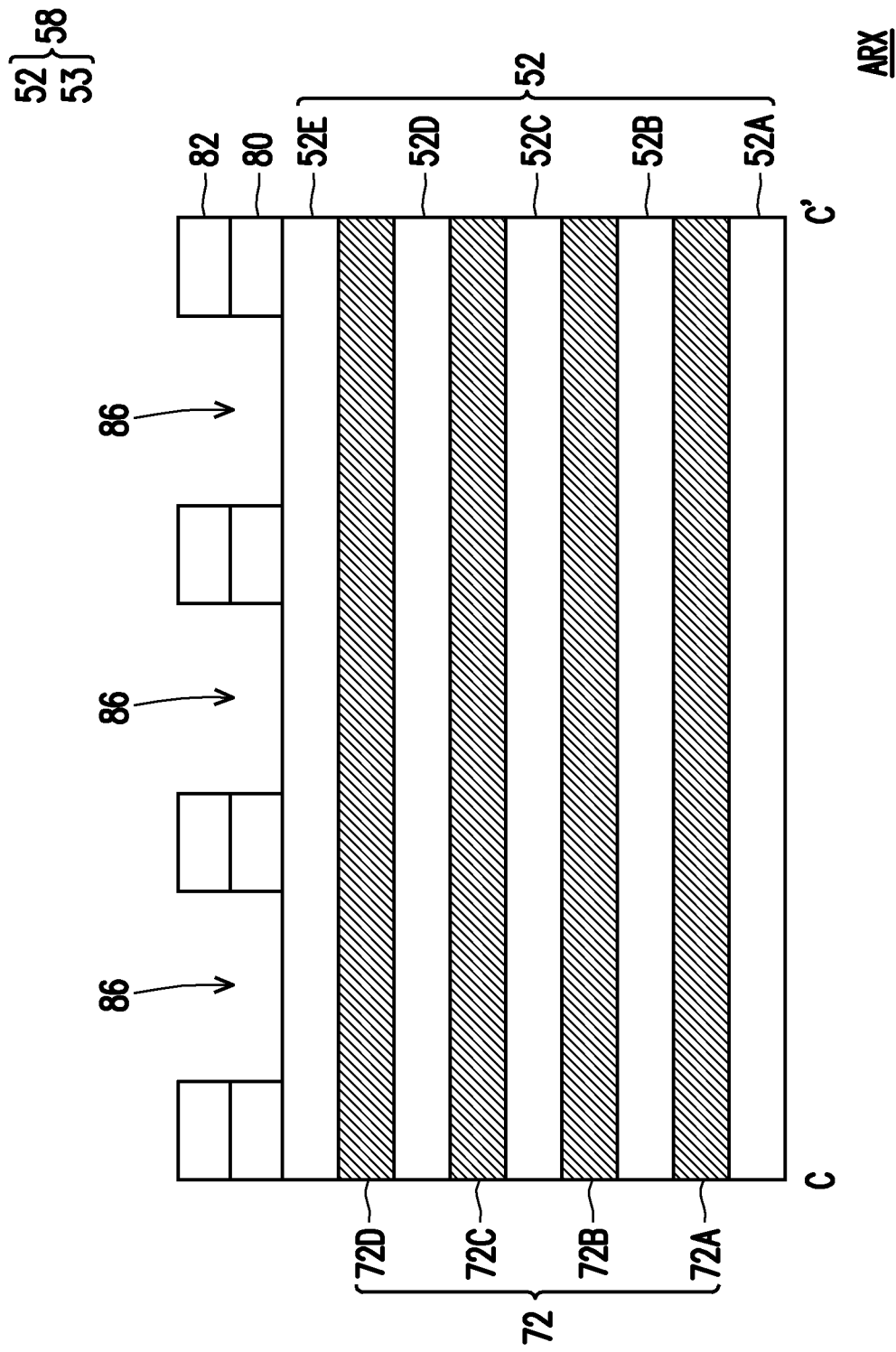
Figure 9A:
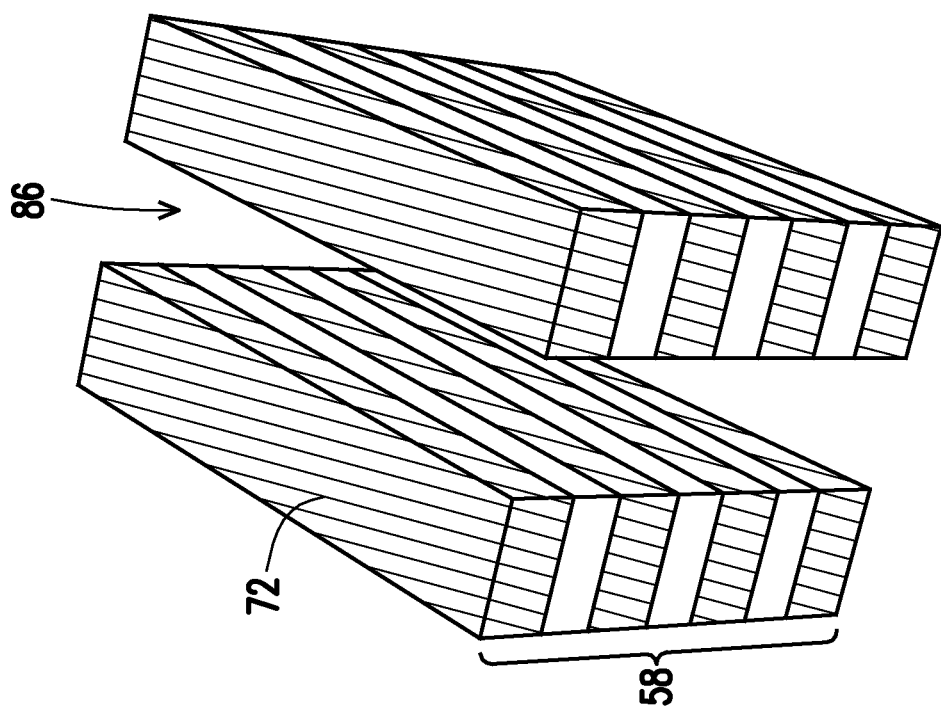
Figure 9B:
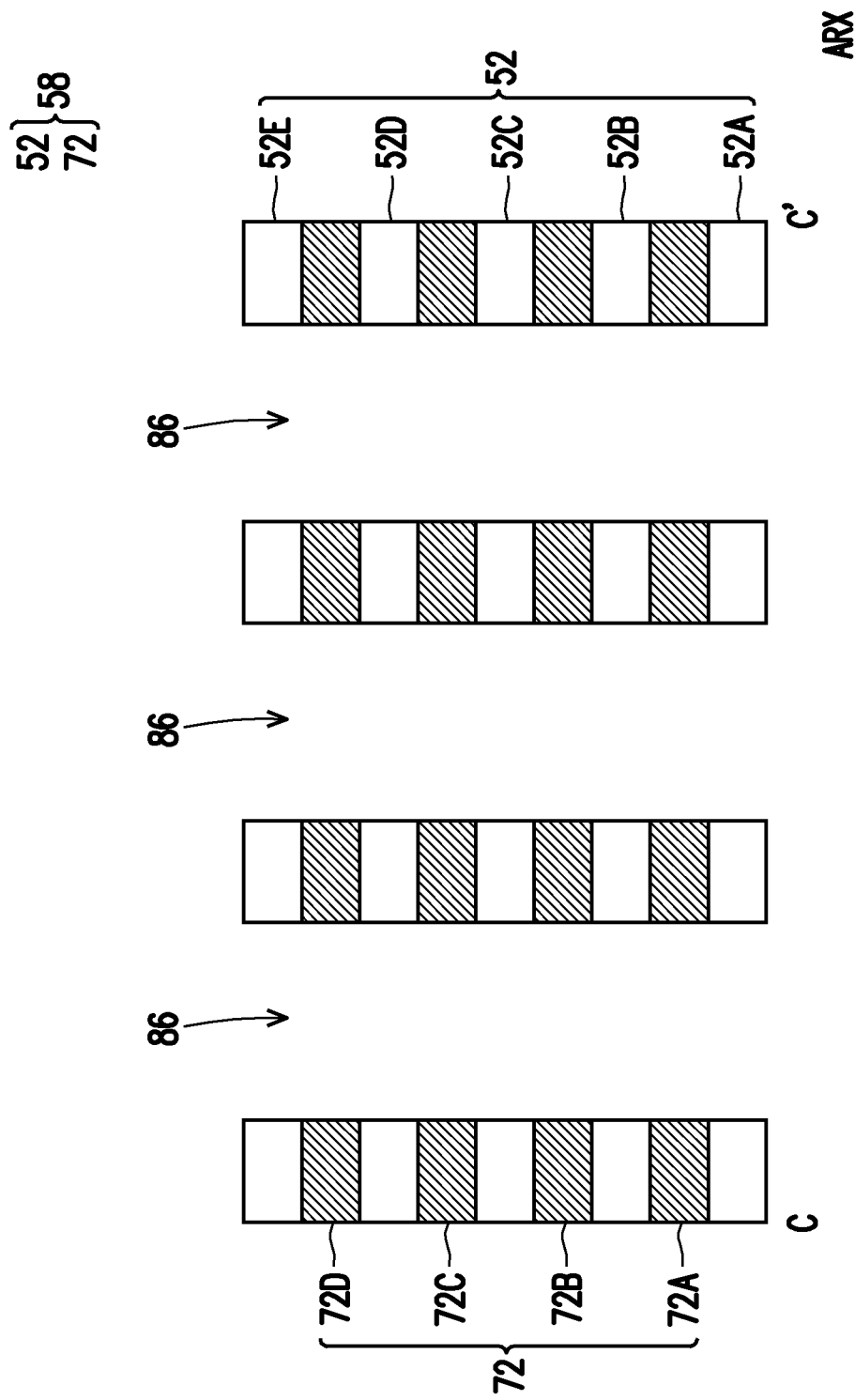

Referring to FIG. 8 to FIG. 9B, the bulk multi-layer stack 58 is patterned to form trenches 86 therethrough. The conductive layers 53 are patterned to form conductive lines 72. The conductive lines 72 may correspond to word lines in the memory device 200, and the conductive lines 72 may further provide gate electrodes for the resulting memory cells of the memory device 200. FIG. 8 and FIG. 9B are illustrated along reference cross-section C-C' illustrated in FIG. 1A. FIG. 9A is illustrated in a partial three-dimensional view.

As shown in FIG. 8, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist layer is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist 82 may be optionally removed by an ashing process, for example.

As illustrated in FIG. 9A and FIG. 9B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and form the strip-shaped conductive lines 72 (including conductive lines 72A~72D) and strip-shaped dielectric layers 52 (including dielectric layers 52A~52E). In some embodiments, the trenches 86 extend through the bulk staircase structure (through the staircase units), and strip-shaped staircase structures are accordingly defined. The hard mask patterns 80 may then be removed by an acceptable process, such as a wet etching process, a dry etching process, a planarization process, combinations thereof, or the like.

Figure 10A:
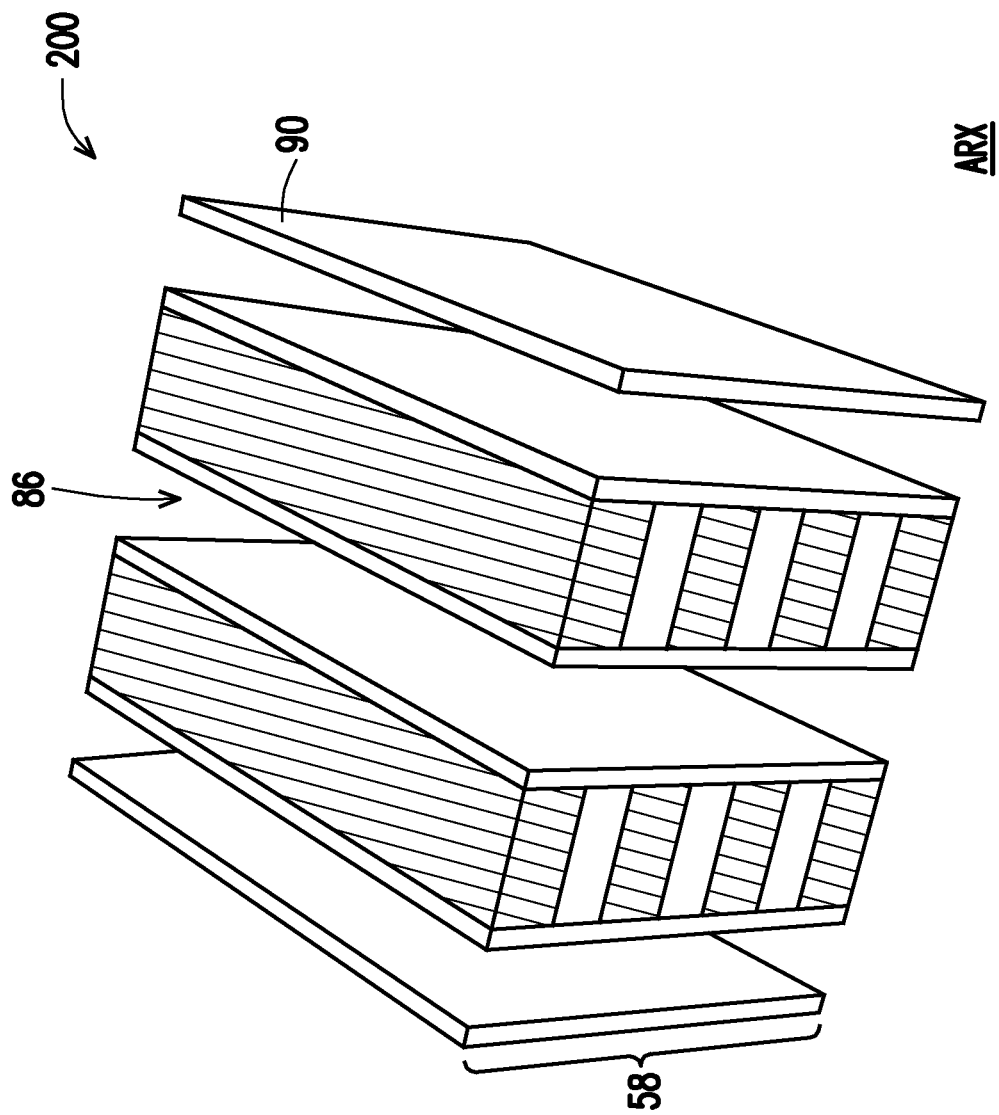

FIG. 10A through FIG. 15B illustrate forming and patterning channel regions for the memory cells 202 (see FIG. 1A) in the trenches 86. FIGS. 10A, 11A and FIG. 15A are illustrated in a partial three-dimensional view. In FIGS. 10B, 11B, 12, 13, 14 and 15B cross-sectional views are provided along line C-C' of FIG. 1A. As illustrated in FIG. 10A through FIG. 13, a dielectric layer 90 (ferroelectric layer), a channel layer 92 (oxide semiconductor layer), and a dielectric material 98A are deposited in the trenches 86.

Figure 10B:
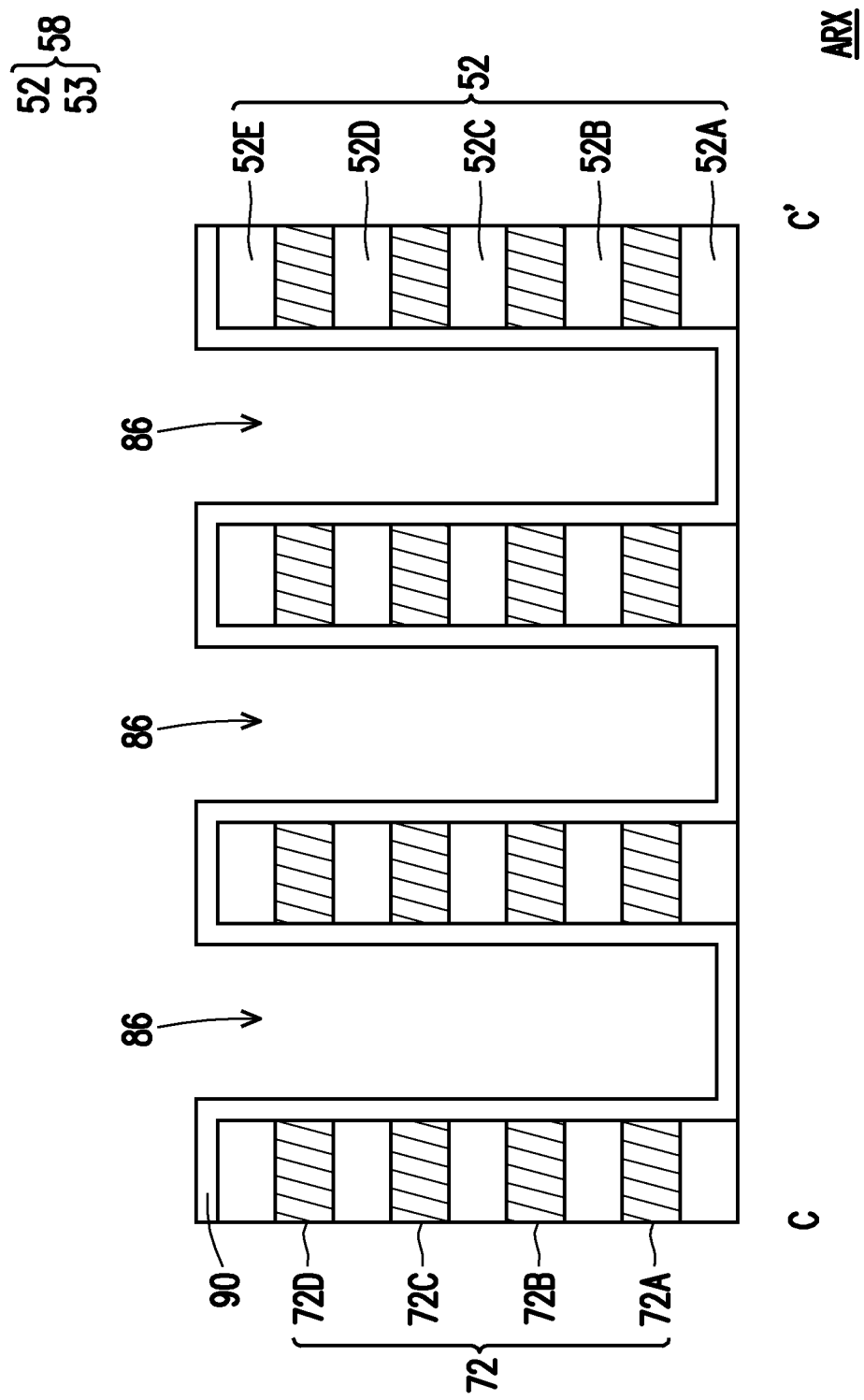

As illustrated in FIG. 10A and FIG. 10B, a dielectric layer 90 (or ferroelectric layer) may be deposited conformally in the trenches 86 along sidewalls of the conductive lines 72, sidewalls of the dielectric layers 52, over top surfaces of the dielectric layer 52 and along the bottom surfaces of the trenches 86. In some embodiments, a dielectric layer 90 (or ferroelectric layer) may be further deposited on the dielectric layer 42 over the first staircase region SRX1 and the second staircase region SRX2. The dielectric layer 90 (or ferroelectric layer) may include materials that are capable of switching between two different polarization directions by applying an appropriate voltage differential across the dielectric layer 90. For example, the dielectric layer 90 includes a high-k dielectric material, such as a hafnium (Hf) based dielectric materials or the like. In some embodiments, the dielectric layer 90 includes hafnium oxide, hafnium zirconium oxide, silicon-doped hafnium oxide, or the like.

In some other embodiments, the dielectric layer 90 may include barium titanium oxide ($BaTiO_3$), lead titanium oxide ($PbTiO_3$), lead zirconium oxide ($PbZrO_3$), lithium niobium oxide ($LiNbO_3$), sodium niobium oxide ($NaNbO_3$), potassium niobium oxide ($KNbO_3$), potassium tantalum oxide ($KTaO_3$), bismuth scandium oxide ($BiScO_3$), bismuth iron oxide ($BiFeO_3$), hafnium erbium oxide ($Hf_{1-x}Er_xO$), hafnium lanthanum oxide ($Hf_{1-x}La_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium zirconium oxide ($Hf_{1-x}Zr_xO$, HZO), hafnium titanium oxide ($Hf_{1-x}Ti_xO$), hafnium tantalum oxide ($Hf_{1-x}Ta_xO$), or the like. In some embodiments, the dielectric layer 90 may include different ferroelectric materials or different types of memory materials. For example, in some embodiments, the dielectric layer 90 is a non-ferroelectric material, such as a multilayer memory structure including a layer of $SiN_x$ between two $SiO_x$ layers (e.g., an ONO structure). In some embodiments, the method of forming the dielectric layer 90 includes performing a suitable deposition technique, such as CVD, PECVD, metal oxide chemical vapor deposition (MOCVD), ALD, RPALD, PEALD, MBD or the like.

In some embodiments, the dielectric layer 90 has a thickness of about 1-20 nm, such as 5-10 nm. Other thickness ranges (e.g., more than 20 nm or 5-15 nm) may be applicable. In some embodiments, the dielectric layer 90 is formed in a fully amorphous state. In alternative embodiments, the dielectric layer 90 is formed in a partially crystalline state; that is, the dielectric layer 90 is formed in a mixed crystalline-amorphous state and having some degree of structural order. In yet alternative embodiments, the dielectric layer 90 is formed in a fully crystalline state. In some embodiments, the dielectric layer 90 is a single layer. In alternative embodiments, the dielectric layer 90 is a multi-layer structure.

In some embodiments, an annealing process is performed to the dielectric layer 90. In some embodiments, upon the annealing process, the dielectric layer 90 is transformed from an amorphous state to a partially or fully crystalline state. In alternative embodiments, upon the annealing process, the dielectric layer 90 is transformed from a partially crystalline state to a fully crystalline state.

Figure 11A:
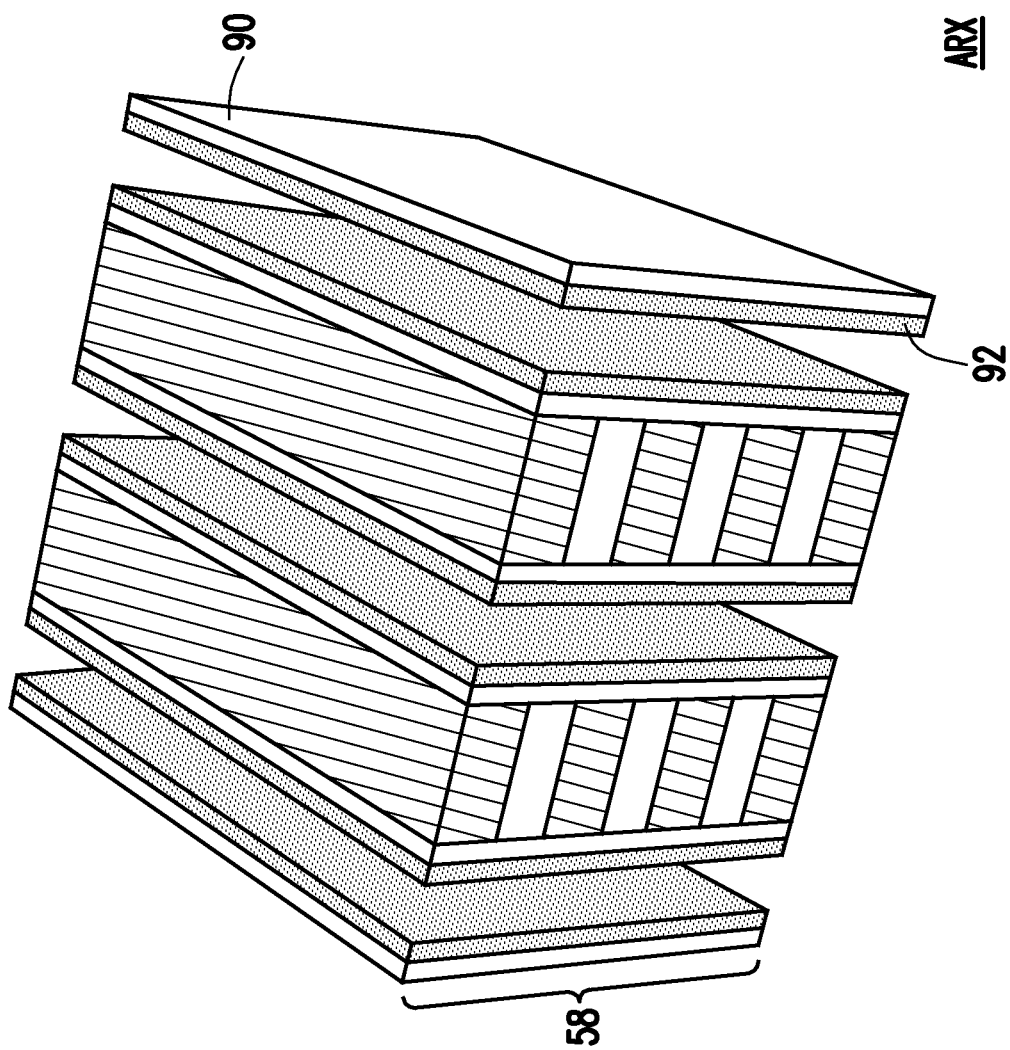
Figure 11B:
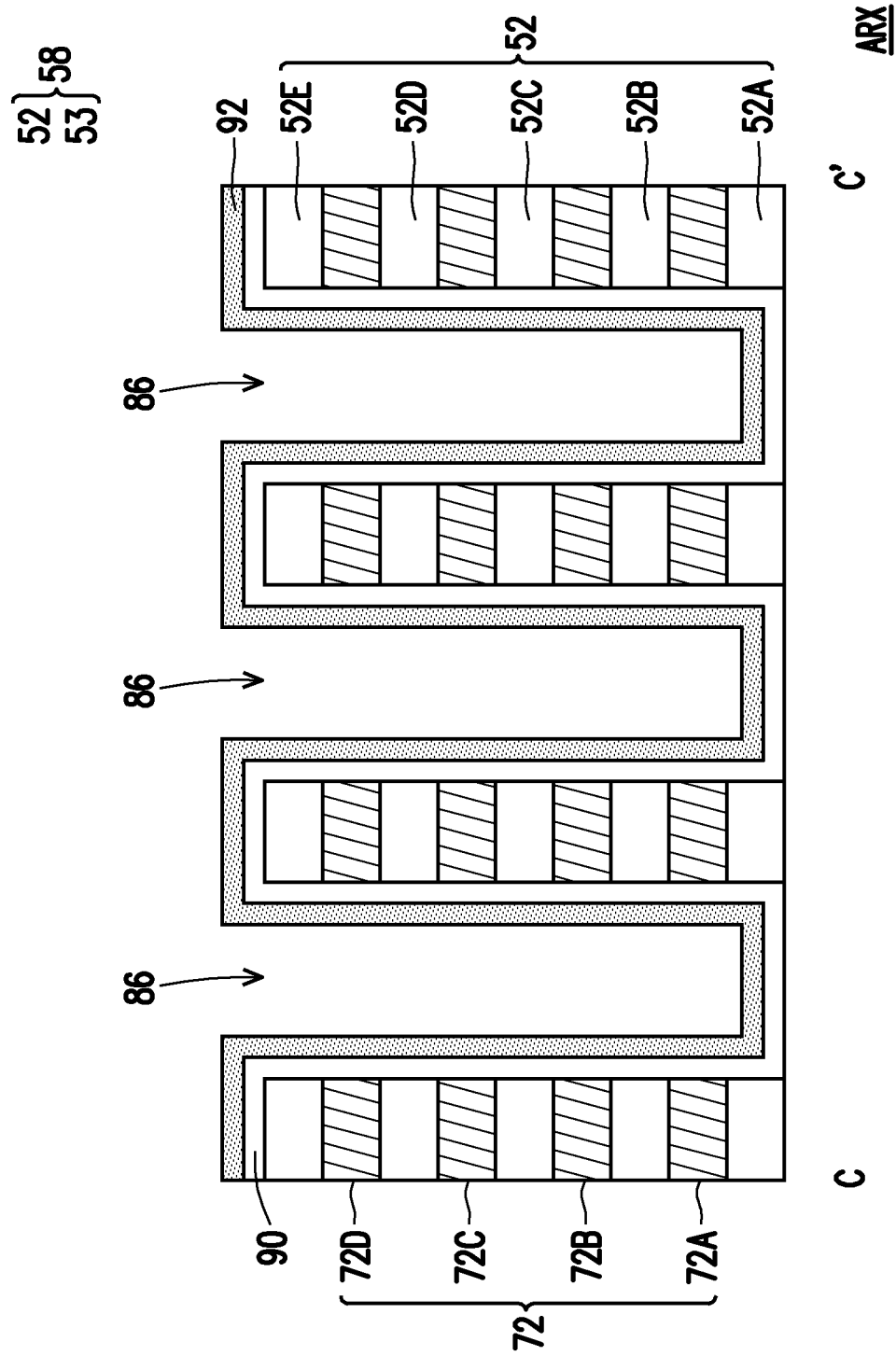

As illustrated in FIG. 11A and FIG. 11B, a channel layer 92 is conformally deposited in the trenches 86 over the dielectric layer 90. The channel layer 92 includes materials suitable for providing channel regions for the memory cells 202 (see FIG. 1A). For example, the channel layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. The channel layer 92 may be deposited by CVD, PVD, ALD, PECVD, or the like. The channel layer 92 may extend along sidewalls and bottom surfaces of the trenches 86 over the dielectric layer 90.

Figure 12:
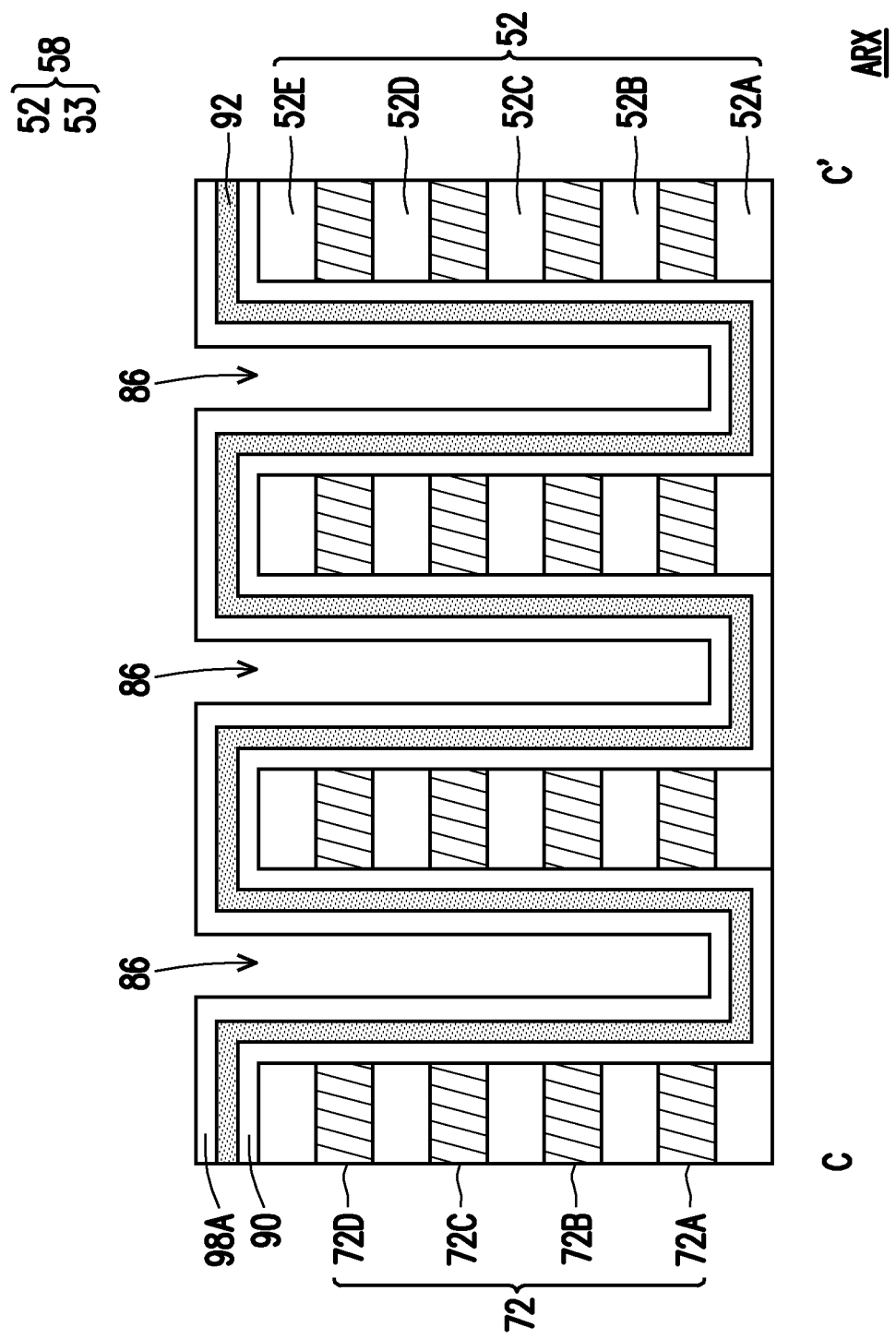

As illustrated in FIG. 12, in a subsequent step, a dielectric material 98A is deposited in the trenches 86 over the channel layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel layer 92. In some embodiments, the dielectric material 98A is optional and may be omitted as needed.

Figure 13:
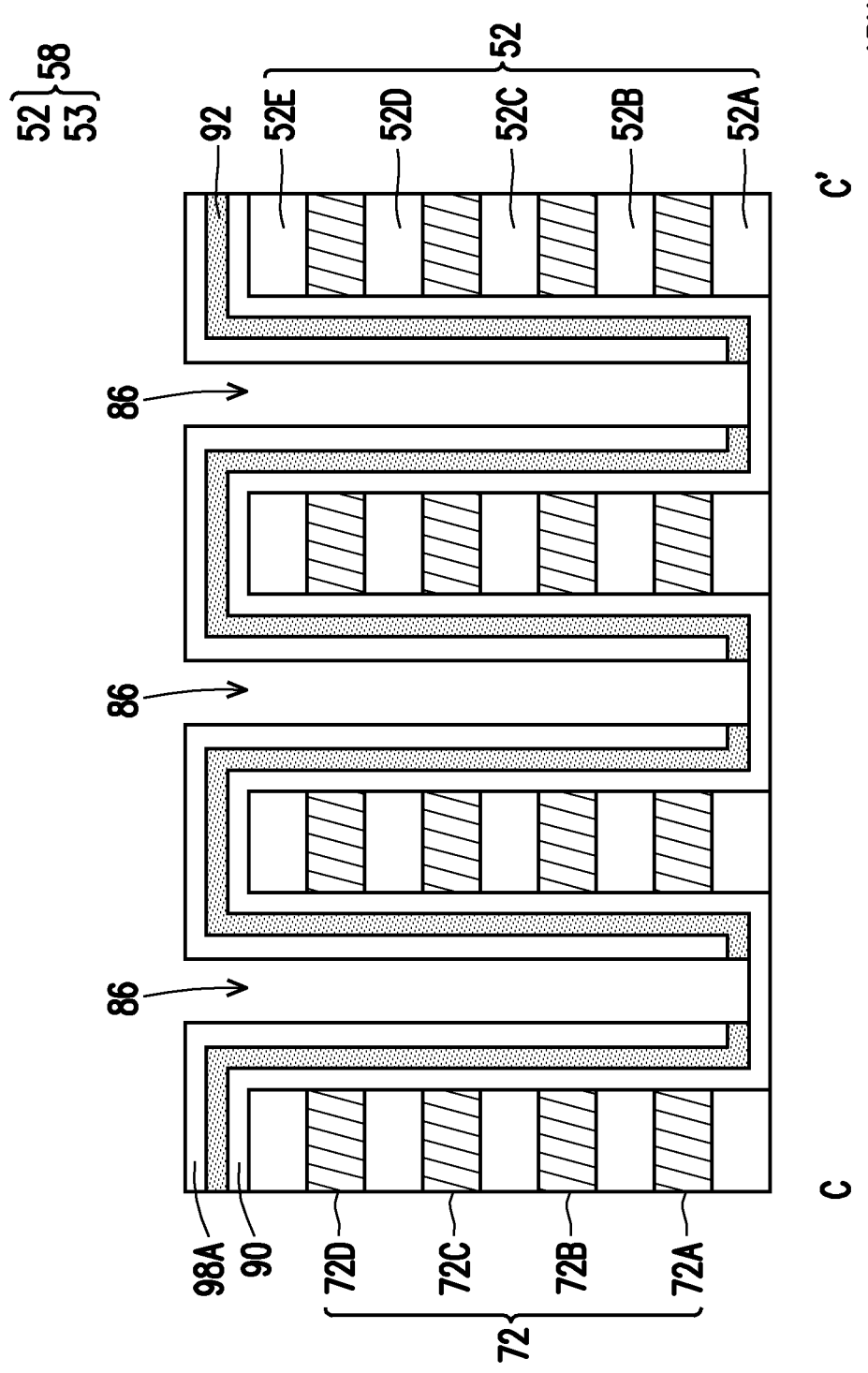

As illustrated in FIG. 13, bottom portions of the dielectric material 98A and the channel layer 92 are removed in the trenches 86. The removal process includes an acceptable etching process, such as a dry etch (e.g., RIE, NBE, the like), a wet etch, the like, or a combination thereof. The etching may be anisotropic. Accordingly, the remaining dielectric material 98A and the channel layer 92 may expose portions of the dielectric layer 90 on bottom surfaces of the trenches 86. Thus, portions of the channel layer 92 on opposing sidewalls of the trenches 86 may be separated from each other, which improves isolation between the memory cells 202 of the memory device 200 (see FIG. 1A).

Figure 14:
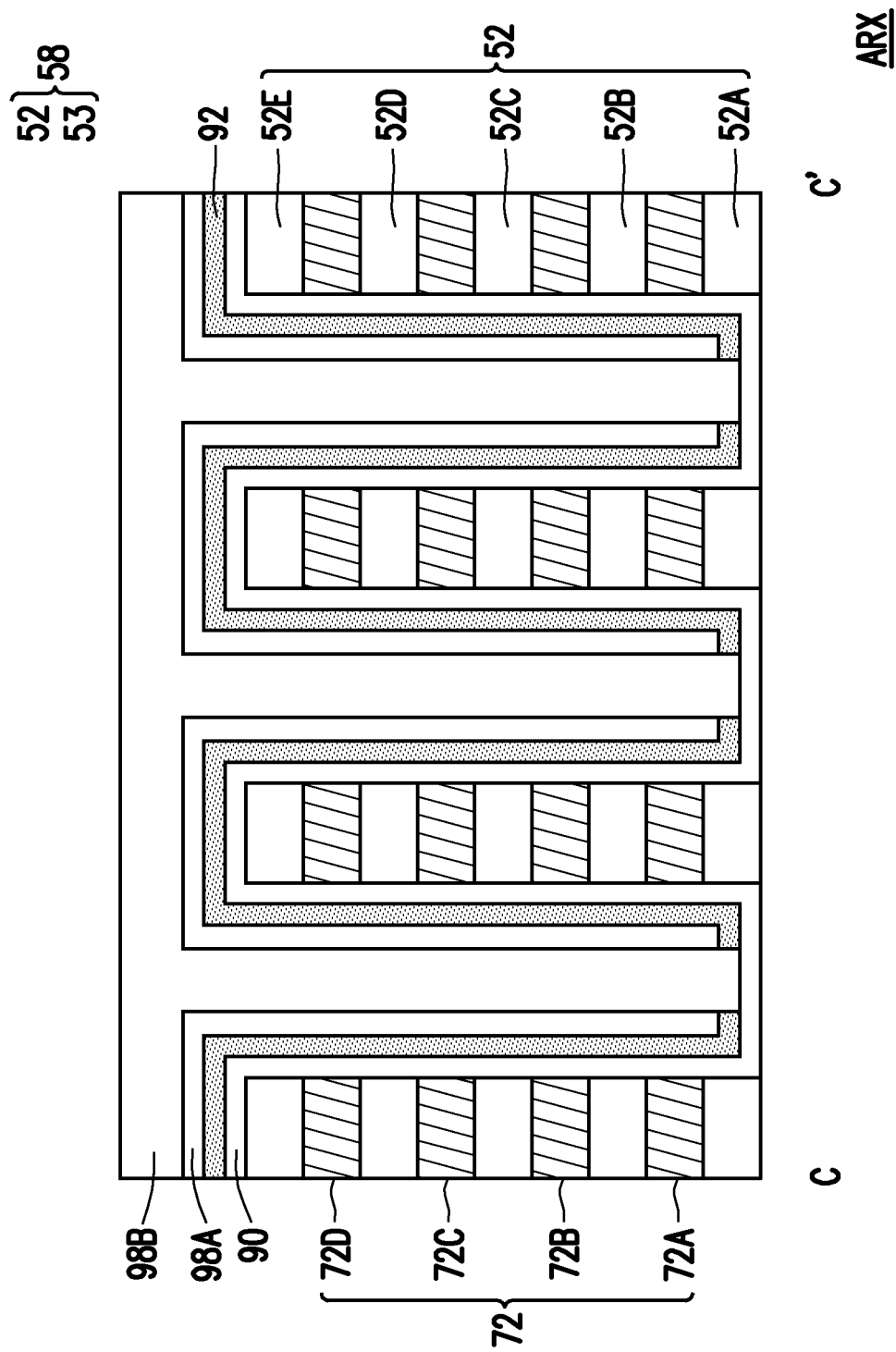

As illustrated in FIG. 14, a dielectric material 98B is deposited to completely fill the trenches 86. The dielectric material 98B may be formed of one or more materials and by processes the same as or similar to those of the dielectric material 98A. In some alternative embodiments, the dielectric material 98B and the dielectric material 98A include different materials.

Figure 15A:
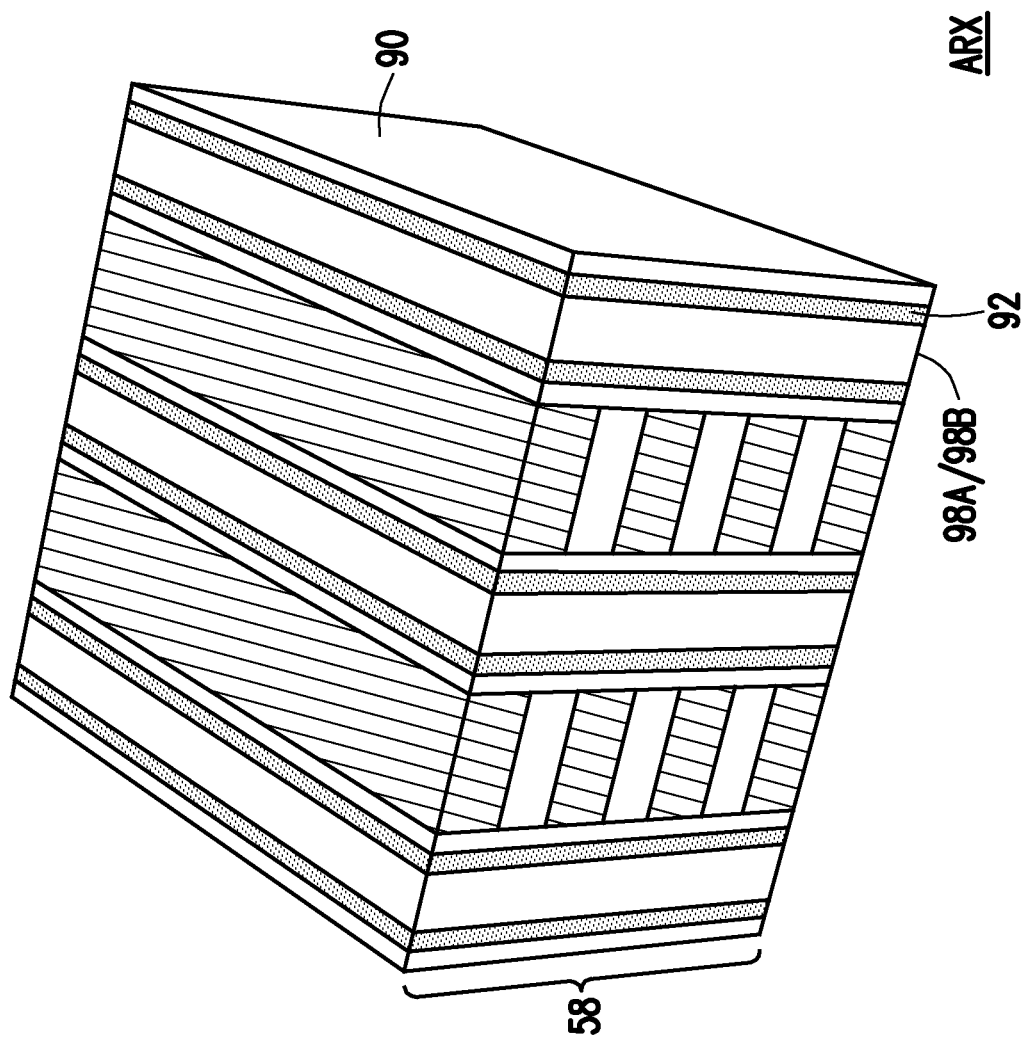
Figure 15B:
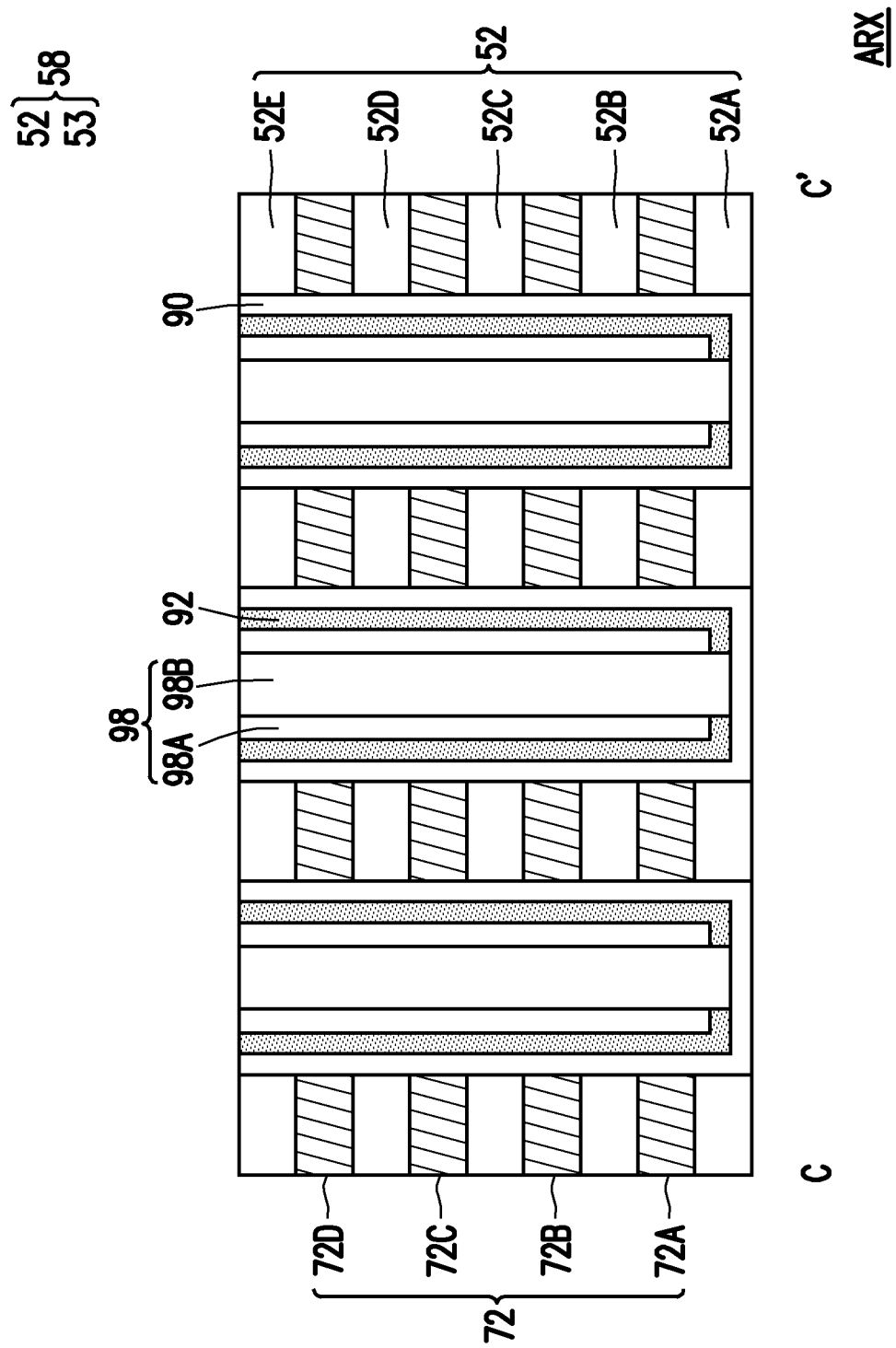

As illustrated in FIG. 15A and FIG. 15B, a removal process is applied to the dielectric materials 98A/98B, the channel layer 92, and the dielectric layer 90 to remove excess materials over the multi-layer stack 58. In some embodiments, a planarization process such as a CMP, an etch-back process, combinations thereof, or the like may be utilized. The planarization process exposes the multi-layer stack 58 such that top surfaces of the multi-layer stack 58 (e.g., the dielectric layer 52), the dielectric layer 90, the channel layer 92, the dielectric materials 98A/98B, and the dielectric layer 43 (in the staircase region) are leveled after the planarization process is completed.

Figure 17A:
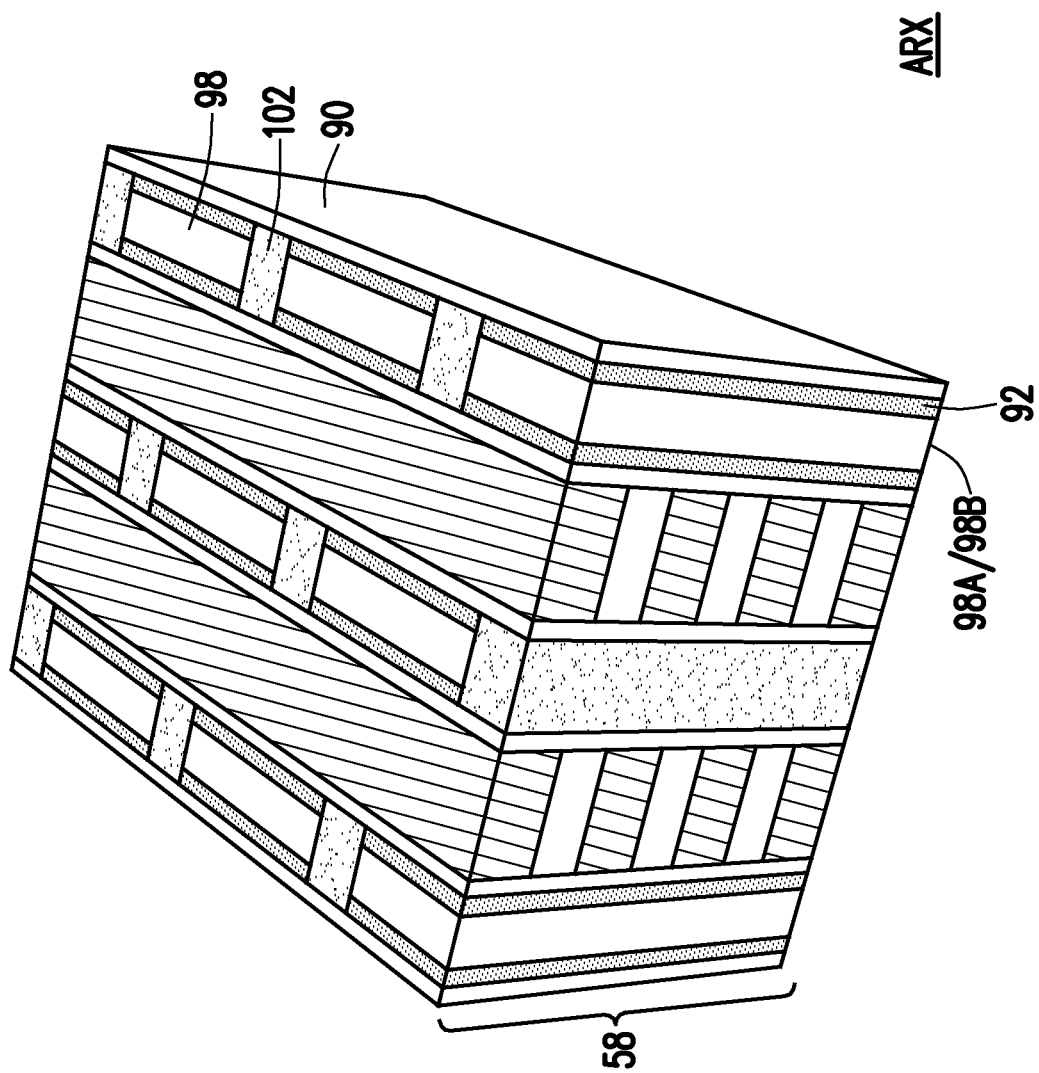
Figure 17B:
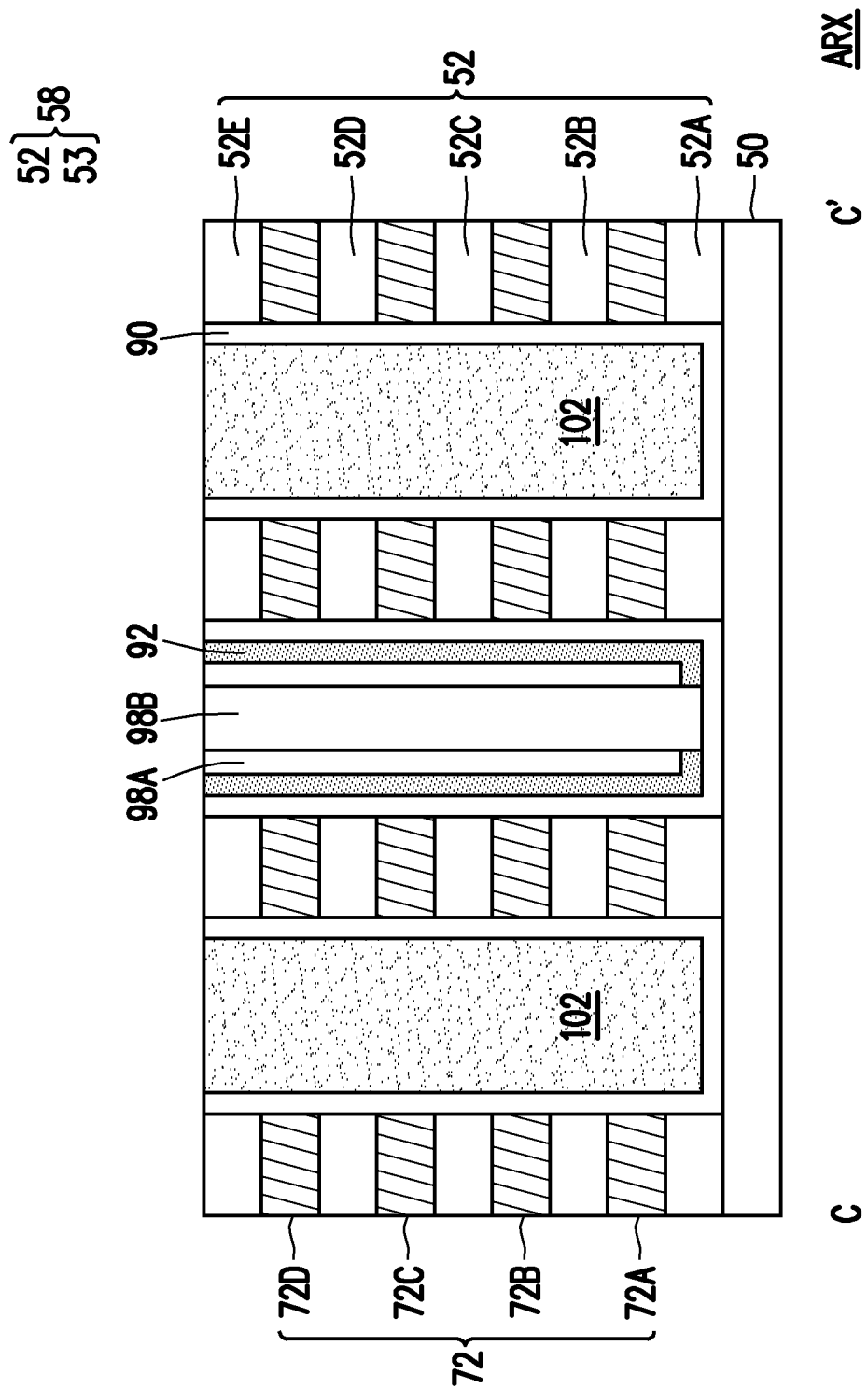
Figure 18A:
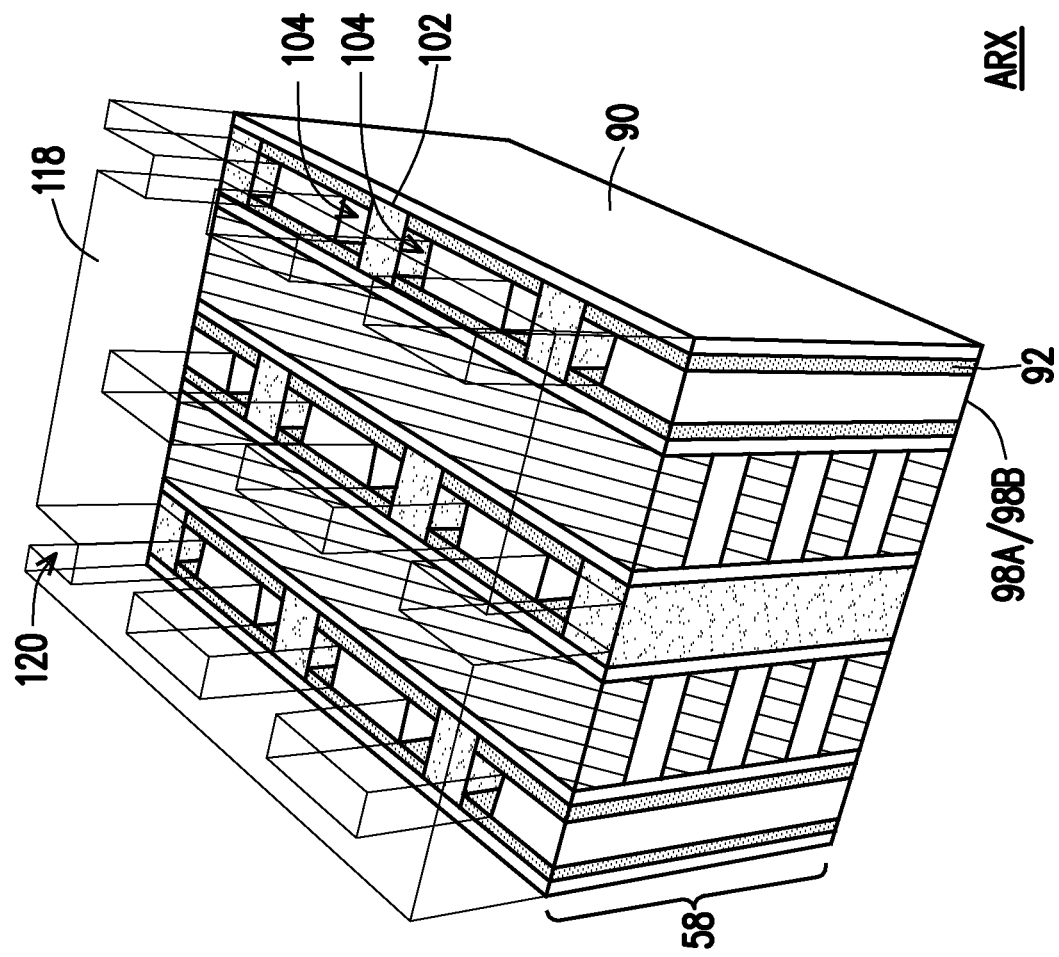
Figure 18B:
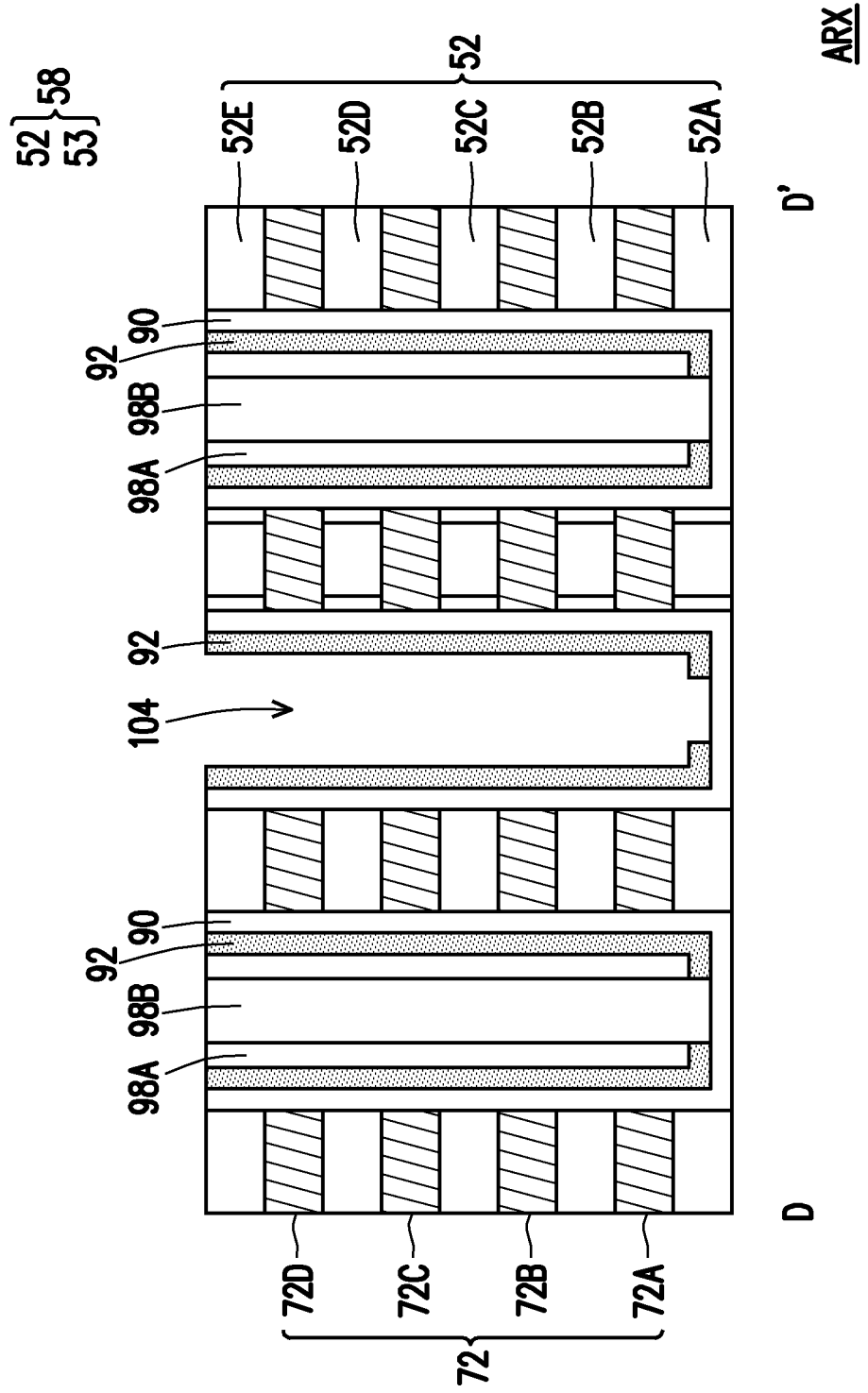
Figure 19A:
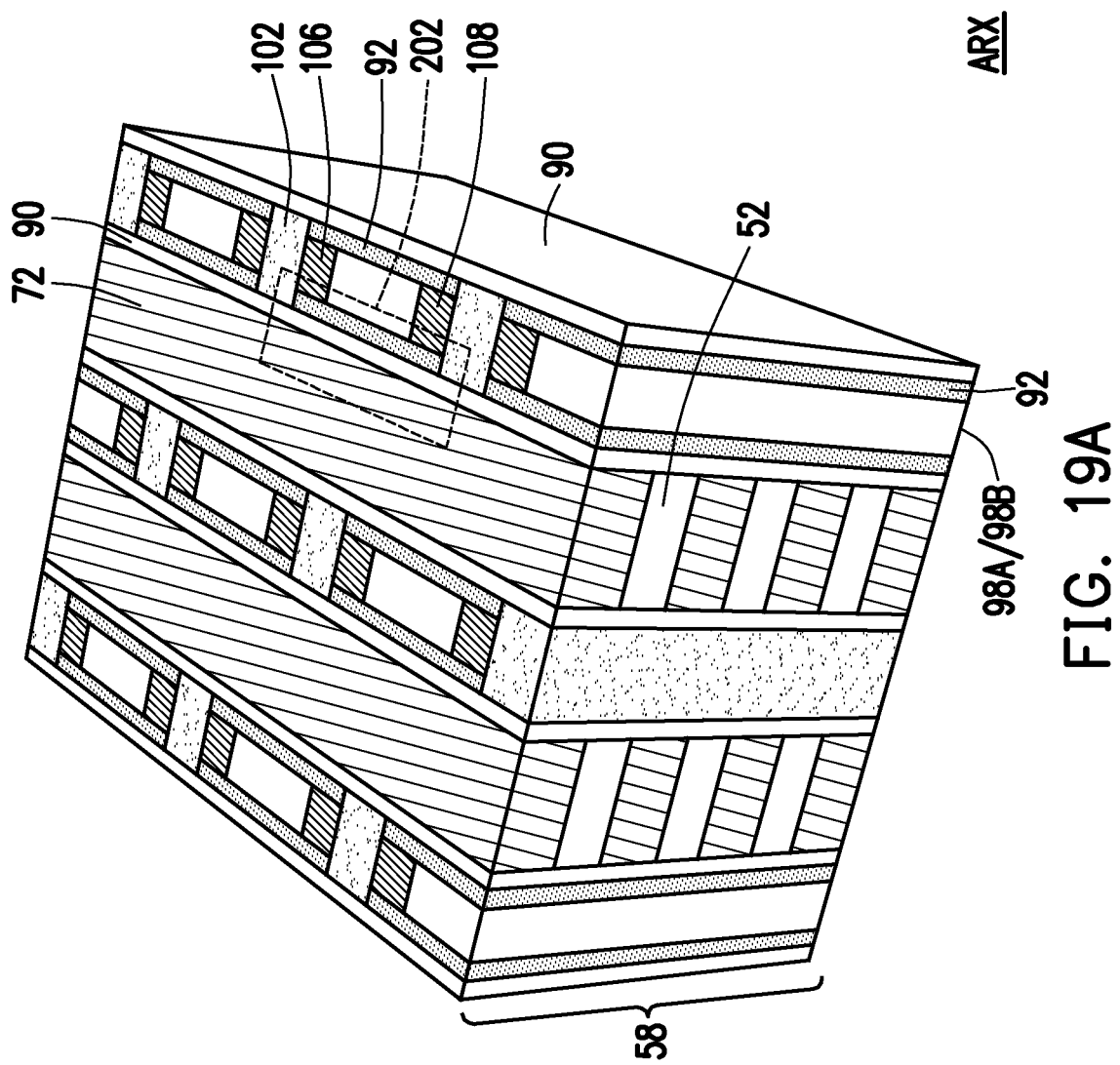
Figure 19B:
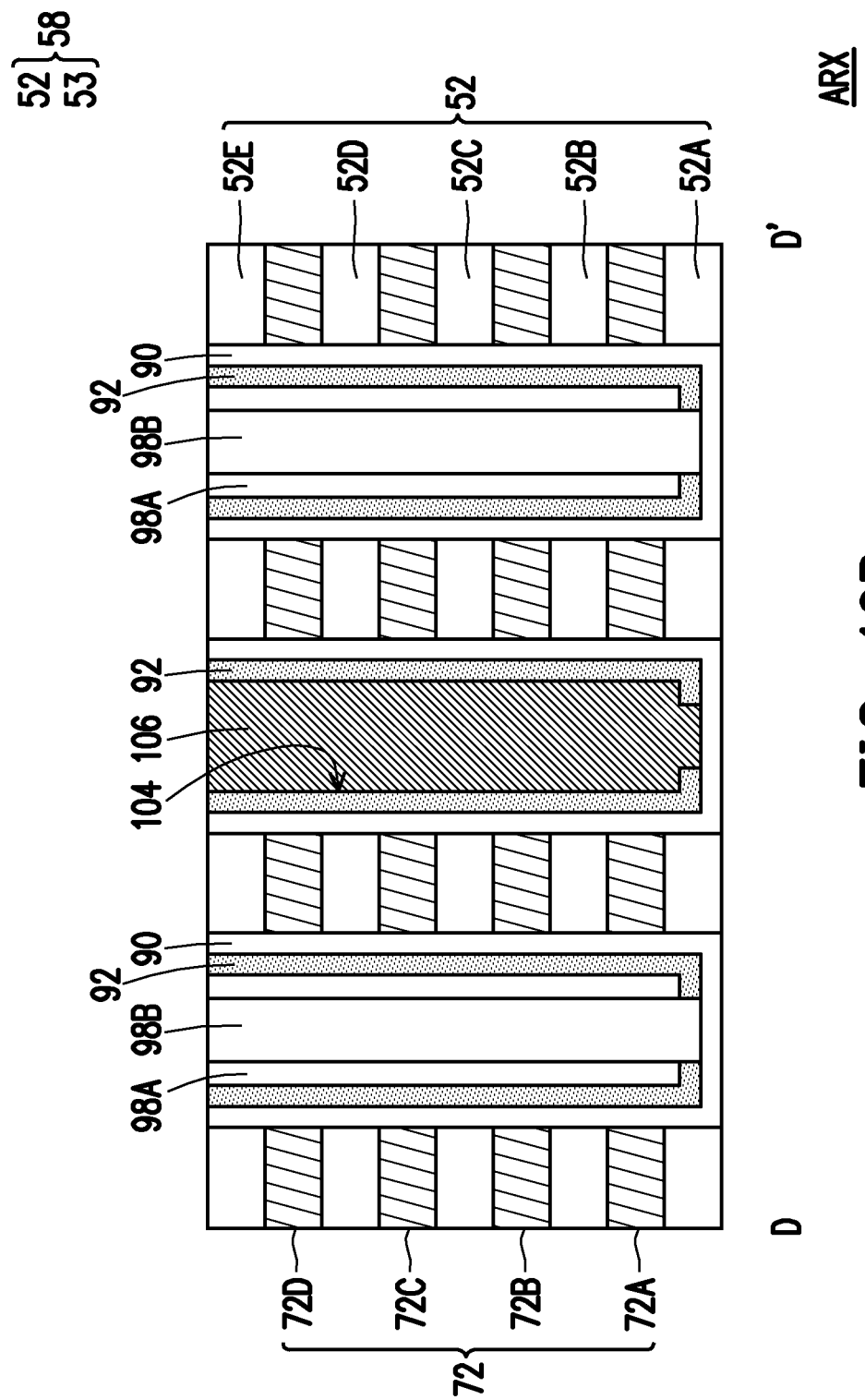

FIG. 16A through FIG. 19B illustrate intermediate steps of manufacturing conductive pillars 106 and 108 (e.g., source/drain pillars) in the memory device 200. The conductive pillars 106 and 108 may extend along a direction perpendicular to the conductive lines 72 such that individual cells of the memory device 200 may be selected for read and write operations. FIGS. 16A, 17A, 18A and 19A are illustrated in a partial three-dimensional view. In FIGS. 16B and 17B, cross-sectional views are provided along line C-C' of FIG. 1A. In FIGS. 18B and 19B, cross-sectional views are provided along line D-D' of FIG. 1A.

Figure 16B:
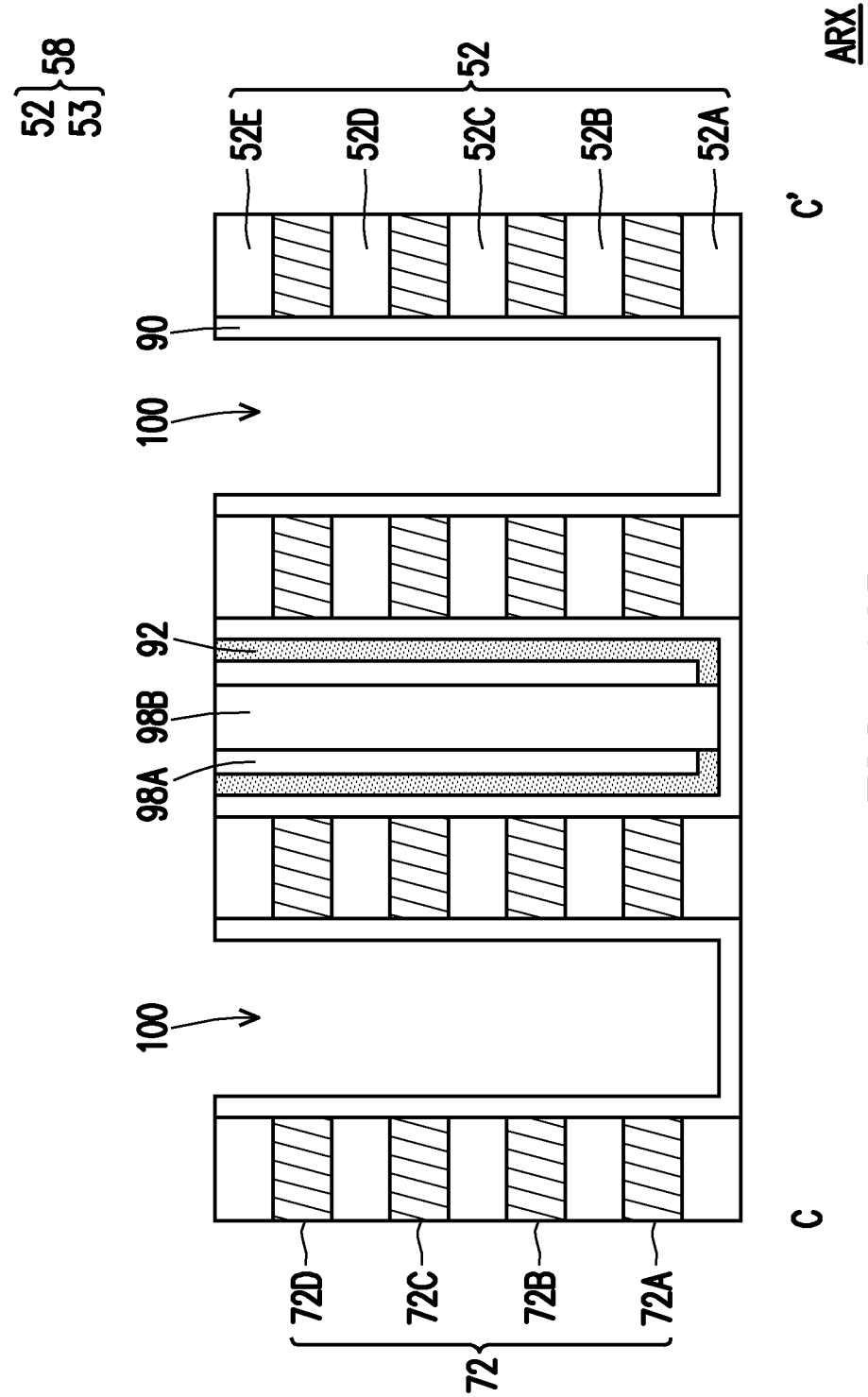

As illustrated in FIGS. 16A and 16B, trenches 100 are patterned through the channel layer 92 and the dielectric materials 98A/98B. For example, the dielectric materials 98A/98B are patterned to form dielectric pillars separated by the trenches 100. Patterning the trenches 100 may be performed through a combination of photolithography and etching, for example. The trenches 100 may be disposed between opposing sidewalls of the dielectric layer 90, and the trenches 100 may physically separate adjacent stacks of memory cells in the memory device 200 (see FIG. 1A).

As illustrated in FIGS. 17A and 17B, isolation pillars 102 are formed in the trenches 100. In some embodiments, an isolation layer is deposited over the multi-stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel layer 92. After deposition, a planarization process (e.g., a CMP, etch back, or the like) may be performed to remove excess portions of the isolation layer to form the isolation pillars 102. In the resulting structure, top surfaces of the multi-layer stack 58 (e.g., dielectric layer 52), the dielectric layer 90, the channel layer 92, and the isolation pillars 102 may be substantially leveled (e.g., within process variations). In some embodiments, materials of the dielectric materials 98A/98B and isolation pillars 102 may be selected so that they may be etched selectively relative to each other. For example, in some embodiments, the dielectric materials 98A/98B include oxide and the isolation pillars 102 include nitride. In some embodiments, the dielectric materials 98A/98B (or dielectric pillars) include nitride and the isolation pillars 102 include oxide. Other materials are also possible.

As illustrated in FIG. 18A and FIG. 18B, trenches 104 are defined for the subsequently formed conductive pillars 106 and 108. For example, the dielectric materials 98A/98B (or dielectric pillars) are further patterned to define the trenches 104. The trenches 104 are formed by patterning the dielectric materials 98A/98B (or dielectric pillars) with a combination of photolithography and etching, for example. In some embodiments, as shown in FIG. 18A, a photoresist 118 is formed over the multi-layer stack 58, the dielectric materials 98A/98B, the isolation pillars 102, the channel layer 92, and the dielectric layer 90. In some embodiments, the photoresist 118 is patterned by an acceptable photolithography technique to define openings 120. Each of the openings 120 may expose the corresponding isolation pillar 102 and two separate regions of the dielectric materials 98A/98B beside the isolation pillar 102. In this way, each of the openings 120 may define a pattern of a conductive pillar 106 and an adjacent conductive pillar 108 that are separated by the isolation pillars 102.

Subsequently, portions of the dielectric materials 98A/98B (or dielectric pillars) exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric materials 98A/98B without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIGS. 19A and 19B). After the trenches 104 are patterned, the photoresist 118 may be removed by ashing, for example.

As illustrated in FIG. 19A to FIG. 19B, the trenches 104 are filled with a conductive material to form the conductive pillars 106 and 108. The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52), the dielectric layer 90, the channel layer 92, the conductive pillars 106, and the conductive pillars 108 may be substantially leveled (e.g., within process variations). In some embodiments, the conductive pillars 106 correspond to and are electrically connected to the bit lines in the memory device 200, and the conductive pillars 108 correspond to and are electrically connected to the source lines in the memory device 200.

Thus, stacked memory cells 202 may be formed in the memory device 200, as shown in FIG. 19A. Each memory cell 202 includes a gate electrode (e.g., a portion of a corresponding conductive line 72), a gate dielectric (e.g., a portion of a corresponding dielectric layer 90), a channel region (e.g., a portion of a corresponding channel layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

Figure 20A:
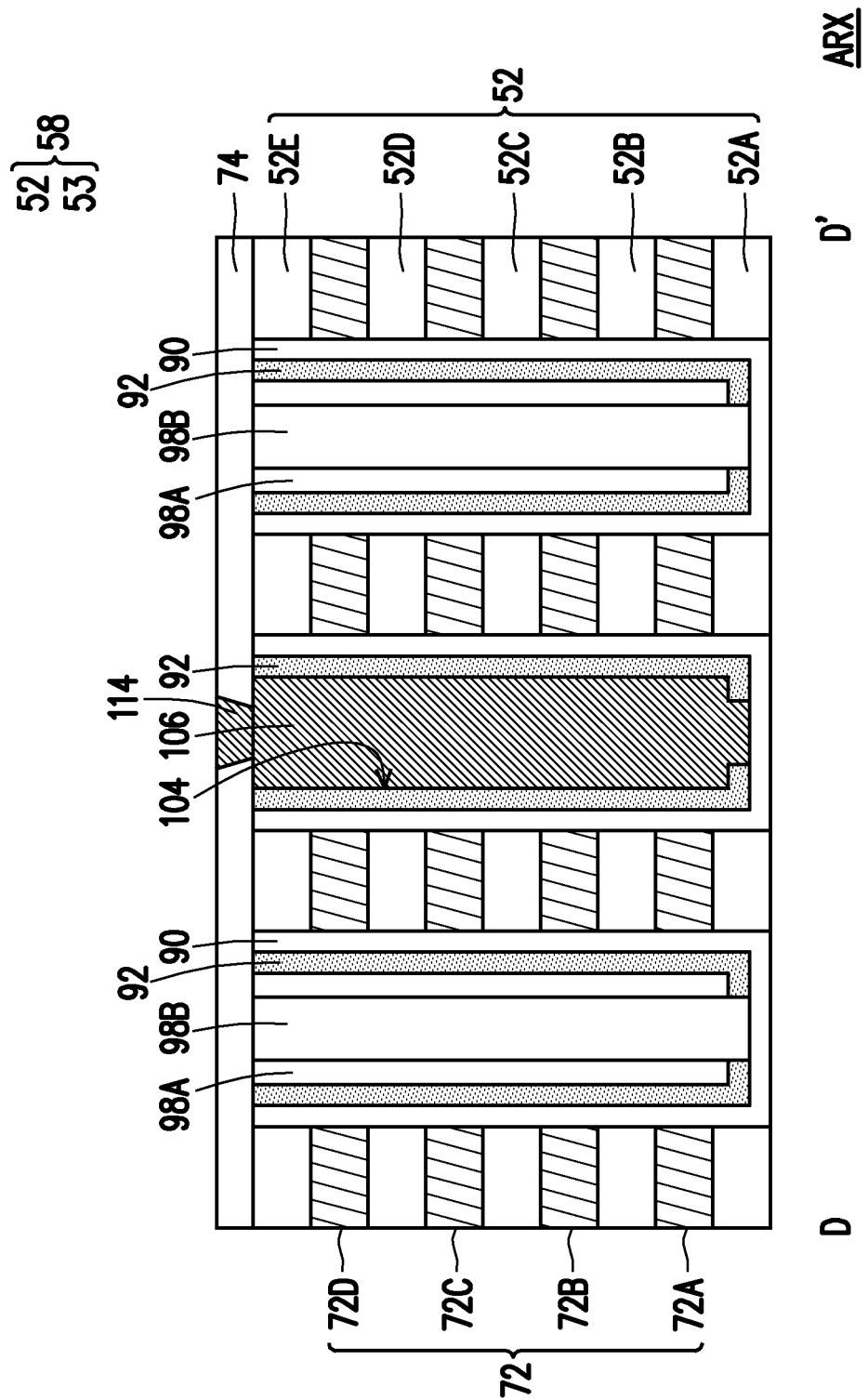
Figure 20B:
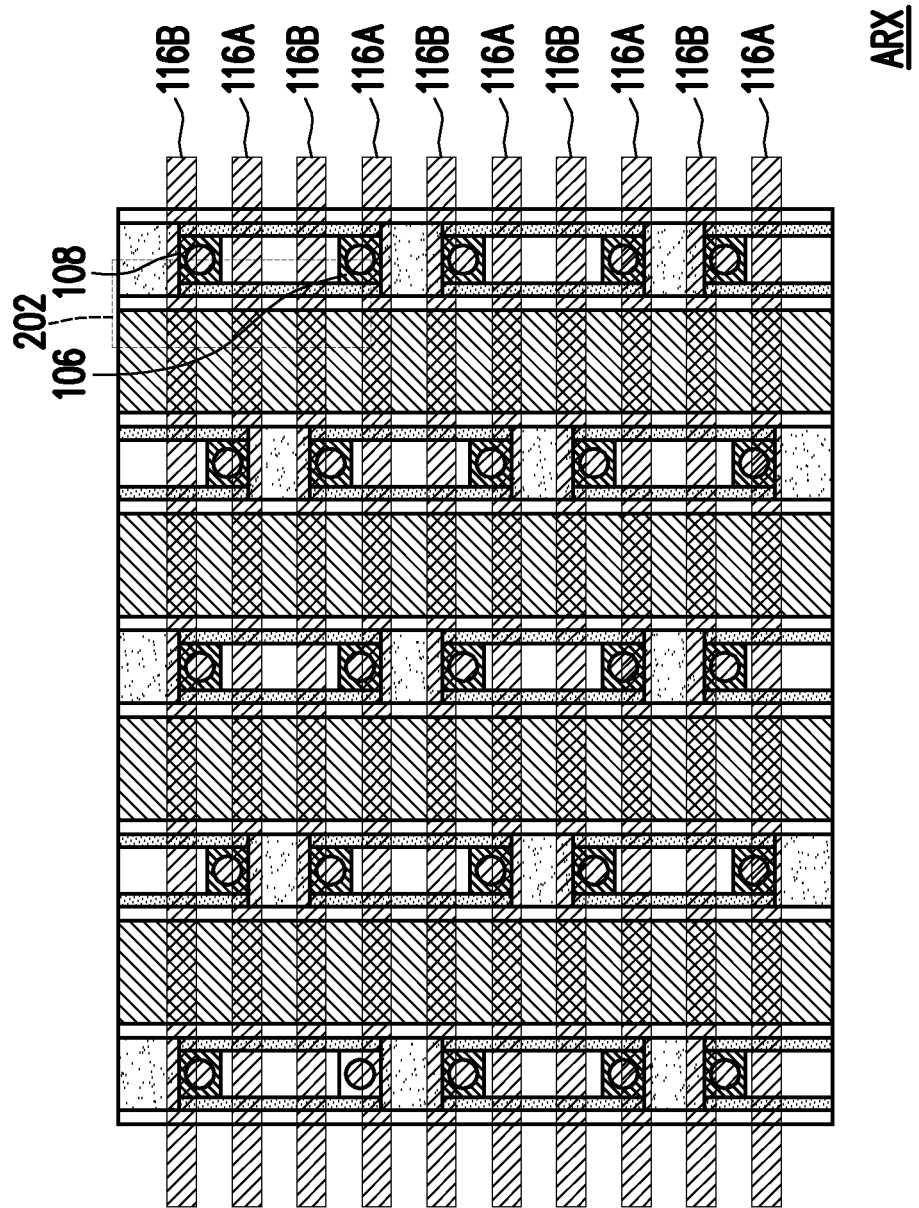

As illustrated in FIG. 20A and FIG. 20B, an inter-metal dielectric (IMD) layer 74 is formed on top surfaces of the multi-layer stack 58 (e.g., the dielectric layer 52E), the dielectric layer 90, the channel layer 92, the conductive pillars 106, and the conductive pillars 108. Conductive contacts 114 are made on the conductive pillars 106 and the conductive pillars 108 respectively. FIG. 20A illustrates a cross-sectional view of the device along line D-D' of FIG. 1A. FIG. 20B illustrates a top-down view of portions of the array region ARX.

In some embodiments, the IMD layer 74 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD layer 74 may include an oxide (e.g., silicon oxide or the like), a nitride (e.g., silicon nitride or the like), a combination thereof or the like. Other dielectric materials formed by any acceptable process may be used. Thereafter, a removal process is applied to the IMD layer 74 to remove excess dielectric material over the multi-layer stack 58. In some embodiments, the removal process may be a planarization process, such as a chemical mechanical polish (CMP), an etch-back process, combinations thereof, or the like.

In some embodiments, the conductive contacts 114 are made on the conductive pillars 106 and the conductive pillars 108, respectively. The conductive contacts 114 may be electrically connected to conductive lines 116A and conductive lines 116B, respectively, which connect the memory device to an underlying/overlying circuitry (e.g., control circuitry) and/or signal, power, and ground lines in the semiconductor die. Other conductive contacts or vias may be formed through the IMD layer 74 to electrically connect the conductive lines 116A and 116B to the underlying active devices on the substrate. In some embodiments, the conductive lines 116A are source lines, while the conductive lines 116B are bit lines.

Figure 21:
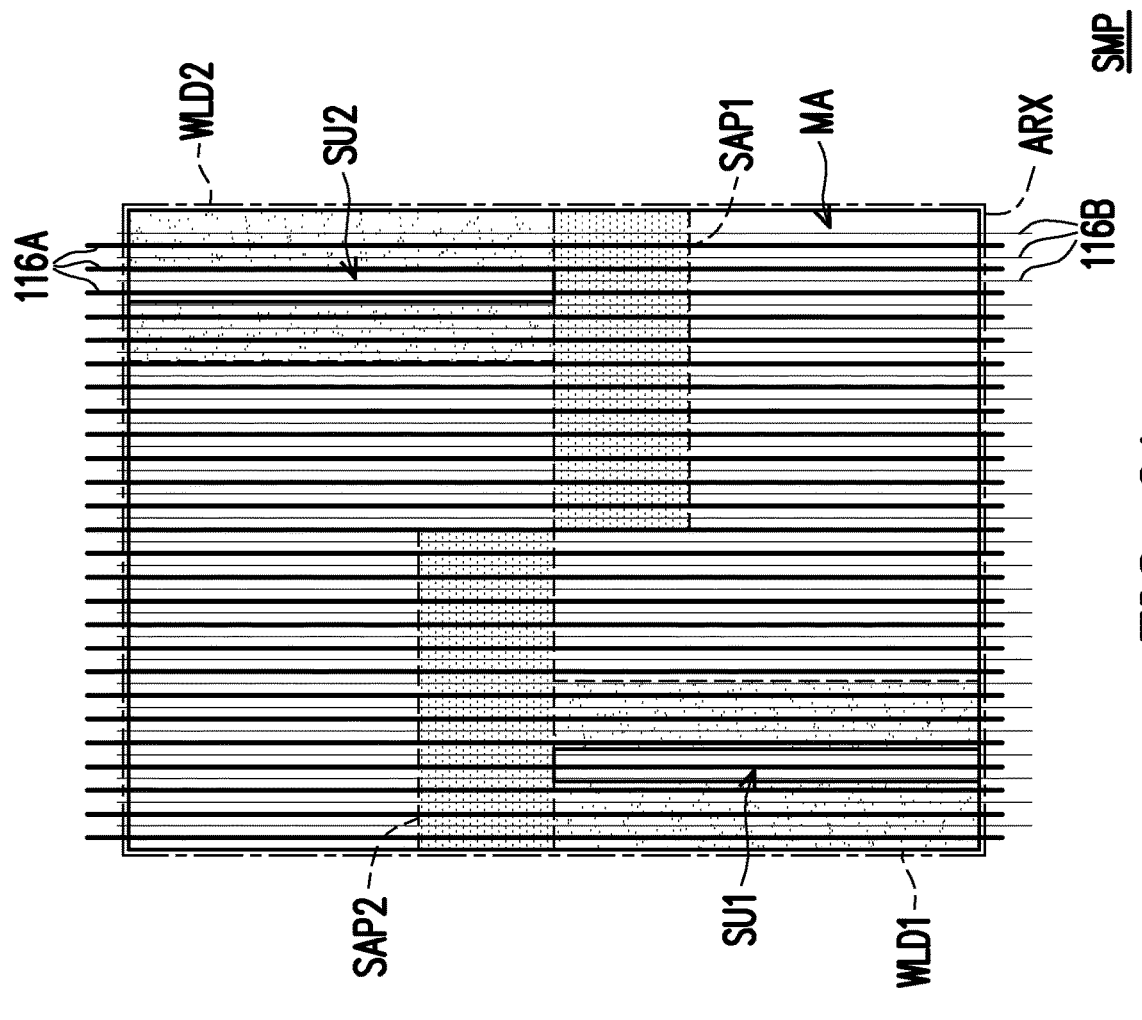

After forming the conductive lines 116A and 116B, a semiconductor structure SMP in accordance with some embodiments of the present disclosure may be accomplished. FIG. 21 illustrates a top down view of the semiconductor structure SMP according to some embodiments. As shown in FIG. 21, the conductive lines 116A and 116B (source lines and bit lines) are electrically connected to the underlying memory array MA through the conductive contacts 114 described in FIG. 20A and FIG. 20B. In some embodiments, the conductive lines 116A and 116B (source lines and bit lines) are extending in a Y-direction, while the conductive lines 72 (word lines) in the memory array MA are extending in a X-direction. In other words, an extension direction of the conductive lines 116A and 116B (source lines and bit lines) may be perpendicular to an extension direction of the conductive lines 72 (word lines). In some embodiments, the first staircase unit SU1 and the second staircase unit SU2 are arranged on the substrate 500 (FIG. 6B) so that the first staircase unit SU1 and the second staircase unit SU2 do not overlap one another in the extension direction (Y-direction) of the conductive lines 116A and 116B (source lines and bit lines).

Figure 22:
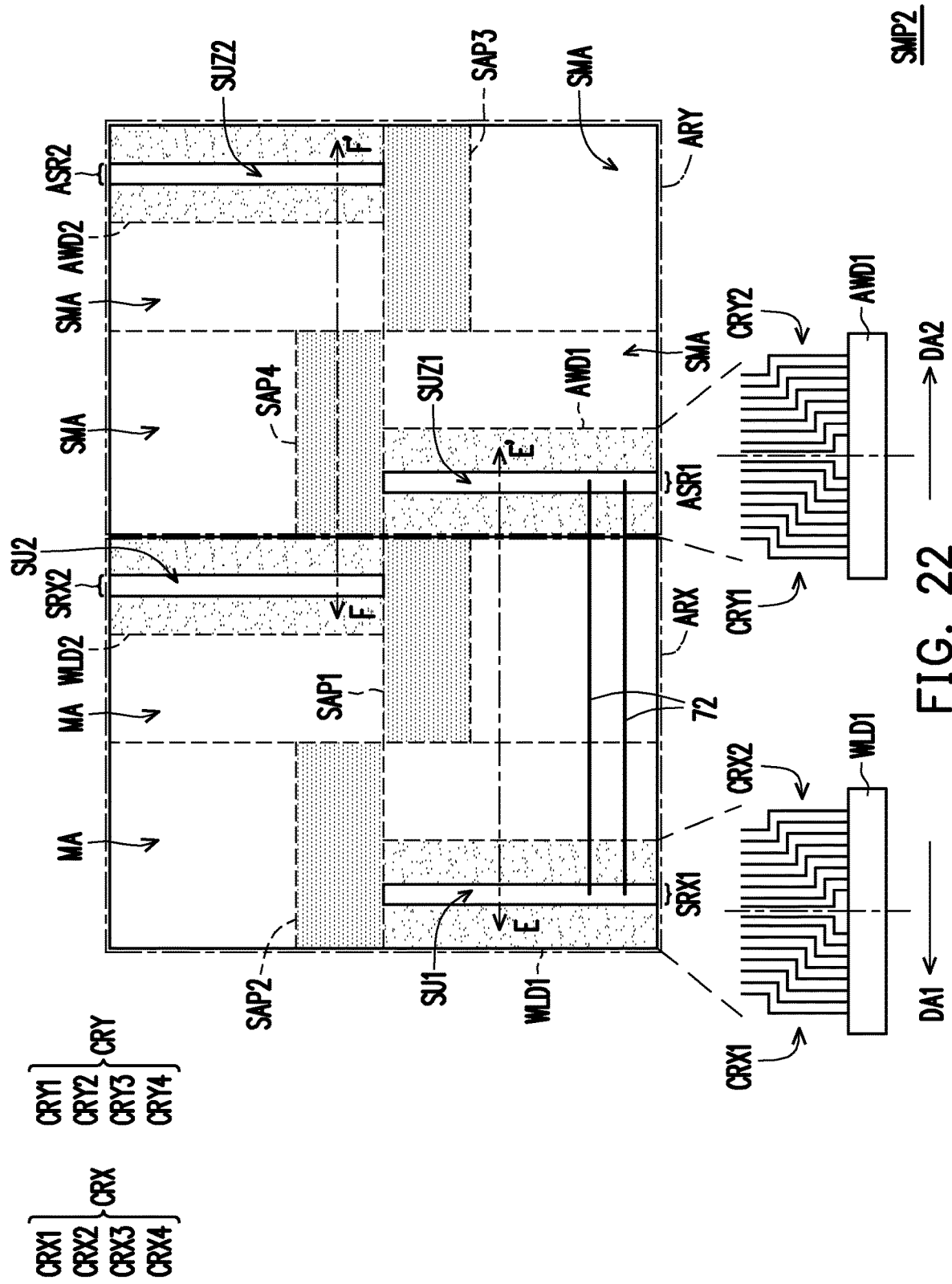
FIG. 22 illustrates a simplified top down view of a semiconductor structure in accordance with some other embodiments of the disclosure.

FIG. 22 illustrates a simplified top down view of a semiconductor structure in accordance with some other embodiments of the disclosure. The semiconductor structure SMP2 illustrated in FIG. 22 is similar to the semiconductor structure SMP described in FIG. 2 to FIG. 21, therefore, the same reference numerals are used to refer to the same or liked parts, and its detailed description will not be repeated herein.

As illustrated in FIG. 22, the semiconductor structure SMP2 includes a memory array MA disposed in an array region ARX, a first staircase unit SU1 disposed in a first staircase region SRX1 and a second staircase unit SU2 disposed in a second staircase region SRX2. The arrangements and fabrication process of the memory array MA, the first staircase unit SU1 and the second staircase unit SU2 are the same as that described for the semiconductor structure SMP shown in FIG. 2 to FIG. 21, thus its details will be omitted herein. Referring to FIG. 22, in some embodiments, the semiconductor structure SMP2 further includes a sub memory array SMA disposed in a sub-array region ARY of the semiconductor structure SMP2 aside the memory array MA. For example, the sub memory array SMA include the same components and are made from the same fabrication processes as with the memory array MA. In some embodiments, the conductive layers 53 (or word lines 72 when patterned) of the memory array MA extends to form the word lines 72 of the sub memory array SMA. In other words, the memory array MA and the sub memory array SMA may share the same word lines 72.

In some embodiments, a first auxiliary staircase unit SUZ1 is disposed in a first auxiliary staircase region ASR1 of the semiconductor structure SMP2 surrounded by the sub-array region ARY. The first auxiliary staircase unit SUZ1 includes first auxiliary staircase steps SUZ1A and second auxiliary staircase steps SUZ1B (see FIG. 23A), wherein the first auxiliary staircase steps SUZ1A and the second auxiliary staircase steps SUZ1B face towards each other. In some embodiments, the first auxiliary staircase unit SUZ1 in the sub-array region ARY overlaps with the first staircase unit SU1 in the array region ARX in the extension direction of the word lines 72. Furthermore, a first auxiliary word line driver AWD1 is disposed below the sub-memory array ARY and below the first auxiliary staircase unit SUZ1, wherein a central portion of the first auxiliary word line driver AWD1 is overlapped with a central portion of the first auxiliary staircase unit SUZ1. In certain embodiments, the first auxiliary word line driver AWD1 overlaps with a third sense amplifier SAP3 along the extension direction of the word lines 72.

In a similar way, a second auxiliary staircase unit SUZ2 is disposed in a second auxiliary staircase region ASR2 of the semiconductor structure SMP2 surrounded by the sub-array region ARY. The second auxiliary staircase unit SUZ2 includes third auxiliary staircase steps SUZ2A and fourth auxiliary staircase steps SUZ2B (see FIG. 23B), wherein the third auxiliary staircase steps SUZ2A and the fourth auxiliary staircase steps SUZ2B face towards each other. In some embodiments, the second auxiliary staircase unit SUZ2 in the sub-array region ARY overlaps with the second staircase unit SU2 in the array region ARX in the extension direction of the word lines 72. Furthermore, a second auxiliary word line driver AWD2 is disposed below the sub-memory array ARY and below the second auxiliary staircase unit SUZ2, wherein a central portion of the second auxiliary word line driver AWD2 is overlapped with a central portion of the second auxiliary staircase unit SUZ2. In certain embodiments, the second auxiliary word line driver AWD2 overlaps with a fourth sense amplifier SAP4 along the extension direction of the word lines 72.

In some embodiments, auxiliary conductive routings CRY are used for electrically connecting the first auxiliary staircase unit SUZ1 to the first auxiliary word line driver AWD1, and are used for electrically connecting the second auxiliary staircase unit SUZ2 to the second auxiliary word line driver AWD2. The auxiliary conductive routings CRY includes first auxiliary conductive routings CRY1, second auxiliary conductive routings CRY2, third auxiliary conductive routings CRY3 and fourth auxiliary conductive routings CRY4. The detailed connections of these conductive routings CRY will be described with reference to FIG. 23A and FIG. 23B.

Figure 23A:
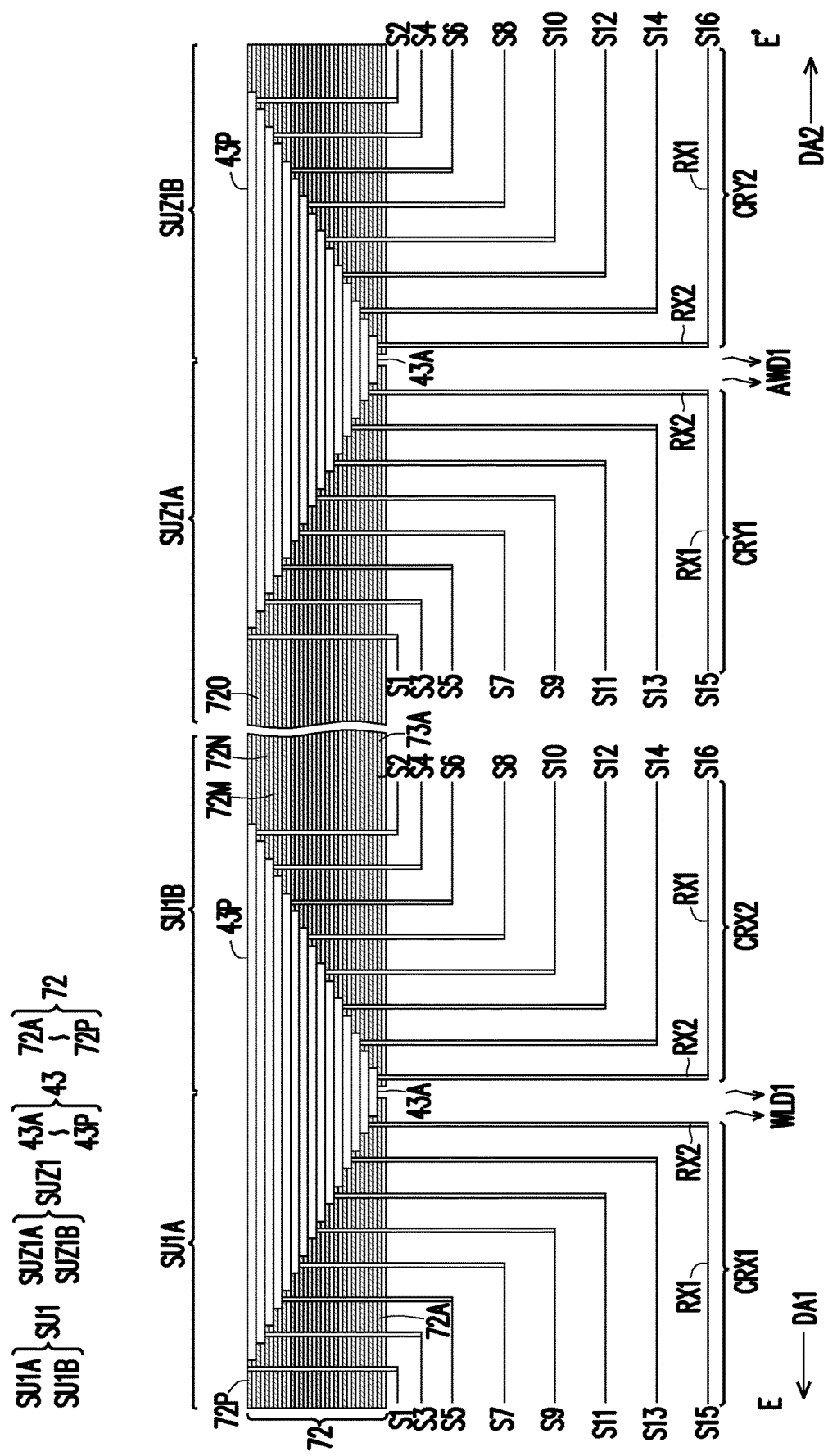
FIG. 23A and FIG. 23B illustrate simplified cross-sectional views of the semiconductor structure shown in FIG. 22.
Figure 23B:
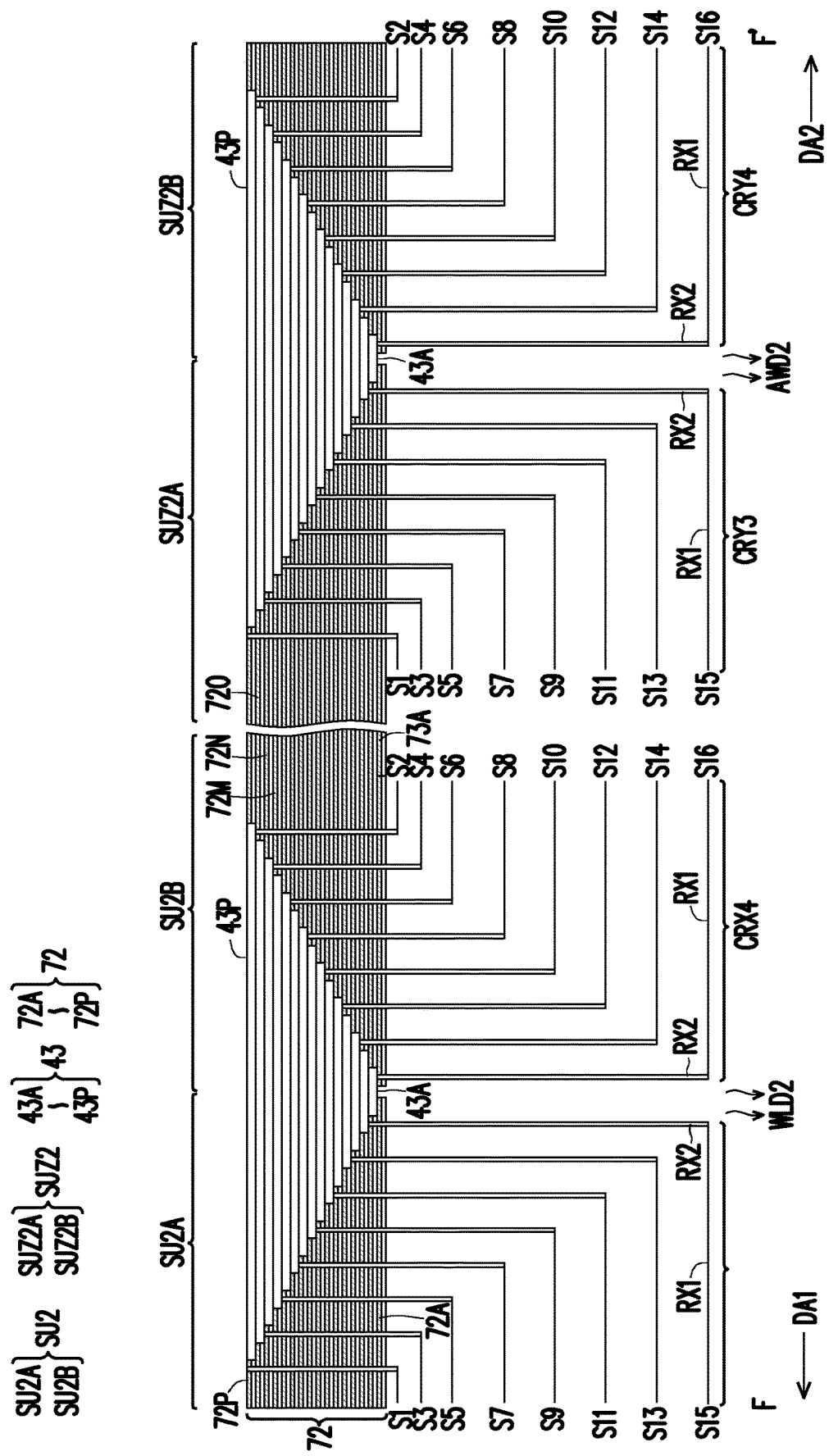

FIG. 23A and FIG. 23B illustrate simplified cross-sectional views of the semiconductor structure shown in FIG. 22 taken along line E-E' and line F-F' respectively. As illustrated in FIG. 23A, in some embodiments, the first auxiliary staircase unit SUZ1 is formed with sixteen layers of word lines 72 (72A~72P; formed by patterning conductive layers 52A~52P). In other words, the first auxiliary staircase steps SUZ1A and the second auxiliary staircase steps SUZ1B respectively include sixteen steps. In the exemplary embodiment, sixteen conductive bridge structures 43 (43A~43P) are respectively used to connect each of the first auxiliary staircase steps SUZ1A to each of the second auxiliary staircase steps SUZ1B. The dielectric layers 42 in between the conductive bridge structures 43 are omitted for ease of illustration. In some embodiments, the first auxiliary staircase steps SUZ1A and the second auxiliary staircase steps SUZ1B respectively include odd number steps (steps S1, S3, S5, S7, S9, S11, S13 and S15; counting from top to bottom) and even number steps (steps S2, S4, S6, S8, S10, S12, S14 and S16; counting from top to bottom). It is noted that the number of layers of steps in the first auxiliary staircase unit SUZ1 may be adjusted depending on the number of layers of steps in the first staircase unit SU1.

In the first auxiliary staircase steps SUZ1A, the odd number steps (steps S1, S3, S5, S7, S9, S11, S13 and S15) are electrically connected to the first auxiliary word line driver AWD1 directly through the first auxiliary conductive routings CRY1. Furthermore, the even numbers steps (steps S2, S4, S6, S8, S10, S12, S14 and S16) are electrically connected to the first auxiliary word line driver AWD1 through the conductive bridge structures 43 and the second auxiliary conductive routings CRY2. Similarly, in the second auxiliary staircase steps SUZ1B, the odd number steps (steps S1, S3, S5, S7, S9, S11, S13 and S15) are electrically connected to the first auxiliary word line driver AWD1 through the conductive bridge structures 43 and the first auxiliary conductive routings CRY1. Furthermore, the even number steps (steps S2, S4, S6, S8, S10, S12, S14 and S16) are electrically connected to the first auxiliary word line driver AWD2 directly through the second auxiliary conductive routings CRY2. The first auxiliary conductive routings CRY1 and the second auxiliary conductive routings CRY2 extends from different side of the mirror image steps (SUZ1A, SUZ1B) towards the first auxiliary word line driver AWD1.

Since the first auxiliary staircase steps SUZ1A and the second auxiliary staircase steps SUZ1B are electrically connected to one another through the conductive bridge structures 43, the number of conductive routings (CRY1, CRY2) extending from the first auxiliary staircase steps SUZ1A and the second auxiliary staircase steps SUZ1B may be reduced to half. For example, when a first conductive routing CRY1 is electrically connecting the first step S1 (word line 72P) of the first auxiliary staircase steps SUZ1A to the first auxiliary word line driver AWD1, then the need of a conductive routing connecting the first step S1 (word line 72P) of the second auxiliary staircase steps SUZ1B to the first auxiliary word line driver AWD1 is omitted.

Furthermore, in the exemplary embodiment, since the word lines 72 extend from the array region ARX to the sub-array region ARY, each of the word lines 72 may be connected to both of the first word line driver WLD1 and the first auxiliary word line driver AWD1. For example, a word line 72P (the topmost word line at step S1) is physically and electrically connected to the first conductive routings CRX1 and the first auxiliary conductive routings CRY1 and driven by the first word line driver WLD1 and the first auxiliary word line driver AWD1 respectively. In a similar way, another word line 72O (the word line at step S2) is physically and electrically connected to the second conductive routings CRX2 and the second auxiliary conductive routings CRY2, and driven by the first word line driver WLD1 and the first auxiliary word line driver AWD1.

Similarly, referring to FIG. 23B, in some embodiments, the second auxiliary staircase unit SUZ2 is formed with sixteen layers of word lines 72 (72A~72P; formed by patterning conductive layers 52A~52P). In other words, the third auxiliary staircase steps SUZ2A and the fourth auxiliary staircase steps SUZ2B respectively include sixteen steps. In the exemplary embodiment, sixteen conductive bridge structures 43 (43A~43P) are respectively used to connect each of the third auxiliary staircase steps SUZ2A to each of the fourth auxiliary staircase steps SUZ2B. The dielectric layers 42 in between the conductive bridge structures 43 are omitted for ease of illustration. In some embodiments, the third auxiliary staircase steps SUZ2A and the fourth auxiliary staircase steps SUZ2B respectively include odd number steps (steps S1, S3, S5, S7, S9, S11, S13 and S15; counting from top to bottom) and even number steps (steps S2, S4, S6, S8, S10, S12, S14 and S16; counting from top to bottom). It is noted that the number of layers of steps in the second auxiliary staircase unit SUZ2 may be adjusted depending on the number of layers of steps in the second staircase unit SU2.

In the third auxiliary staircase steps SUZ2A, the odd number steps (steps S1, S3, S5, S7, S9, S11, S13 and S15) are electrically connected to the second auxiliary word line driver AWD2 directly through the third auxiliary conductive routings CRY3. Furthermore, the even numbers steps (steps S2, S4, S6, S8, S10, S12, S14 and S16) are electrically connected to the second auxiliary word line driver AWD2 through the conductive bridge structures 43 and the fourth auxiliary conductive routings CRY4. Similarly, in the fourth auxiliary staircase steps SUZ2B, the odd number steps (steps S1, S3, S5, S7, S9, S11, S13 and S15) are electrically connected to the second auxiliary word line driver AWD2 through the conductive bridge structures 43 and the third auxiliary conductive routings CRY3. Furthermore, the even number steps (steps S2, S4, S6, S8, S10, S12, S14 and S16) are electrically connected to the second auxiliary word line driver AWD2 directly through the fourth auxiliary conductive routings CRY4. The third auxiliary conductive routings CRY3 and the fourth auxiliary conductive routings CRY4 extends from different side of the mirror image steps (SUZ2A, SUZ2B) towards the second auxiliary word line driver AWD2.

Since the third auxiliary staircase steps SUZ2A and the fourth auxiliary staircase steps SUZ2B are electrically connected to one another through the conductive bridge structures 43, the number of conductive routings (CRY3, CRY4) extending from the third auxiliary staircase steps SUZ2A and the fourth auxiliary staircase steps SUZ2B may be reduced to half. For example, when a third conductive routing CRY3 is electrically connecting the first step S1 (word line 72P) of the third auxiliary staircase steps SUZ2A to the second auxiliary word line driver AWD2, then the need of a conductive routing connecting the first step S1 (word line 72P) of the fourth auxiliary staircase steps SUZ2B to the second auxiliary word line driver AWD2 is omitted.

Furthermore, in the exemplary embodiment, since the word lines 72 extend from the array region ARX to the sub-array region ARY, each of the word lines 72 may be connected to both of the first word line driver WLD1 and the first auxiliary word line driver AWD1. For example, a word line 72P (the topmost word line at step S1) is physically and electrically connected to the third conductive routings CRX3 and the third auxiliary conductive routings CRY3 and driven by the second word line driver WLD2 and the second auxiliary word line driver AWD2 respectively. In a similar way, another word line 72O (the word line at step S2) is physically and electrically connected to the fourth conductive routings CRX4 and the fourth auxiliary conductive routings CRY4, and driven by the second word line driver WLD2 and the second auxiliary word line driver AWD2.

Therefore, in the exemplary embodiment, in a case when the number of layers of the word lines 72 is X, then the number A1 of the first conductive routings CRX1 extending from the first staircase steps SU1A in the first staircase region SRX1, the number A2 of the second conductive routings CRX2 extending from the second staircase steps SU1B in the first staircase region SRX1, the number A3 of the third conductive routings CRX3 extending from the third staircase steps SU2A in the second staircase region SRX2, the number A4 of the fourth conductive routings CRX4 extending from the fourth staircase steps SU2B in the second staircase region SRX2 will fulfill: X/A1=2; X/A2=2; X/A3=2 and X/A4=2.

Similarly, in a case when the number of layers of the word lines 72 is X, then the number B1 of the first auxiliary conductive routings CRY1 extending from the first auxiliary staircase steps SUZ1A in the first auxiliary staircase region ASR1, the number B2 of the second auxiliary conductive routings CRY2 extending from the second auxiliary staircase steps SUZ1B in the first auxiliary staircase region ASR1, the number B3 of the third auxiliary conductive routings CRY3 extending from the third auxiliary staircase steps SUZ2A in the second auxiliary staircase region ASR2, the number B4 of the fourth auxiliary conductive routings CRY4 extending from the fourth auxiliary staircase steps SUZ2B in the second auxiliary staircase region ASR2 will fulfill: X/B1=2; X/B2=2; X/B3=2 and X/B4=2.

Figure 24:
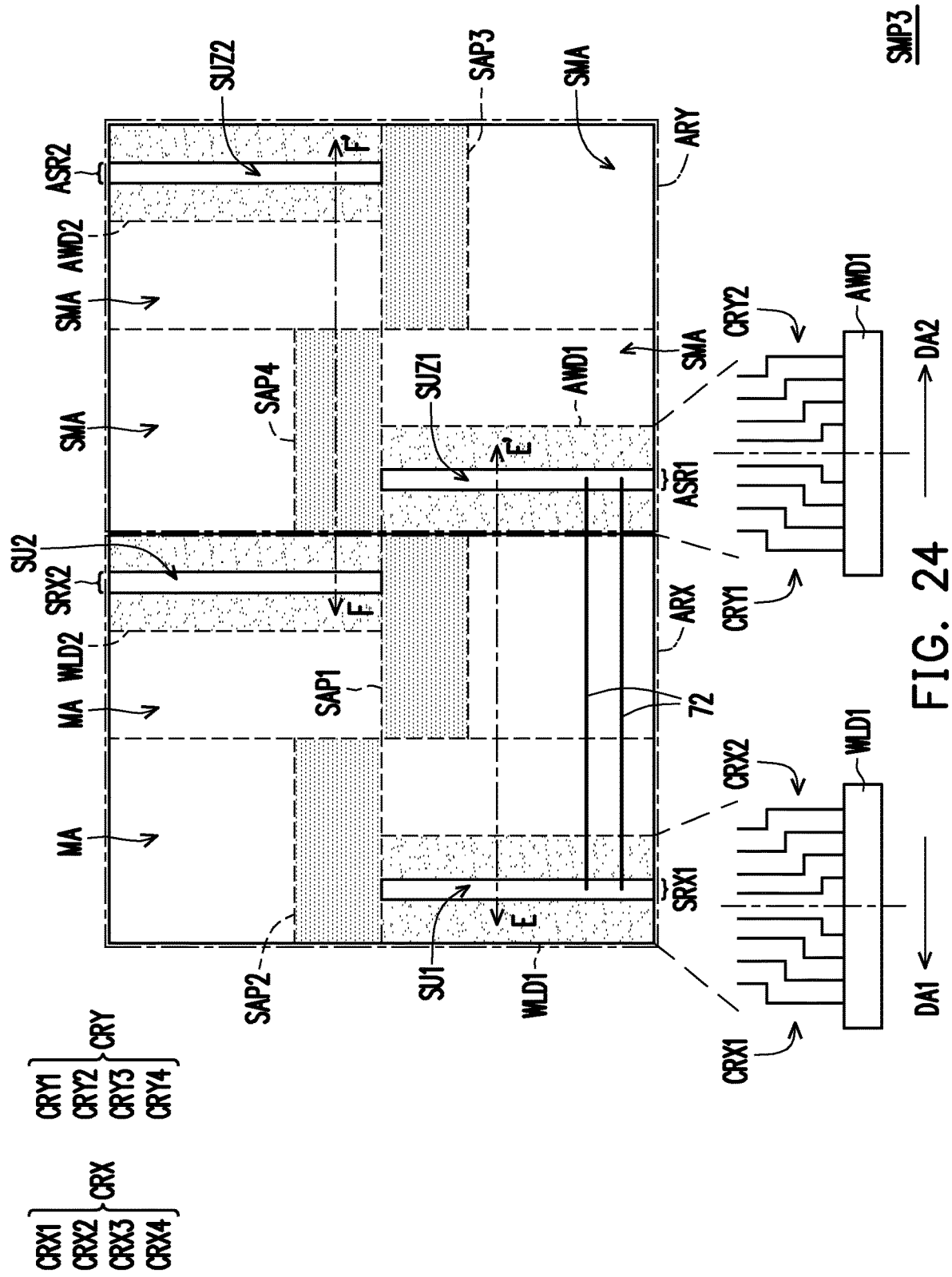
FIG. 24 illustrates a simplified top down view of a semiconductor structure in accordance with some other embodiments of the disclosure.
Figure 25A:
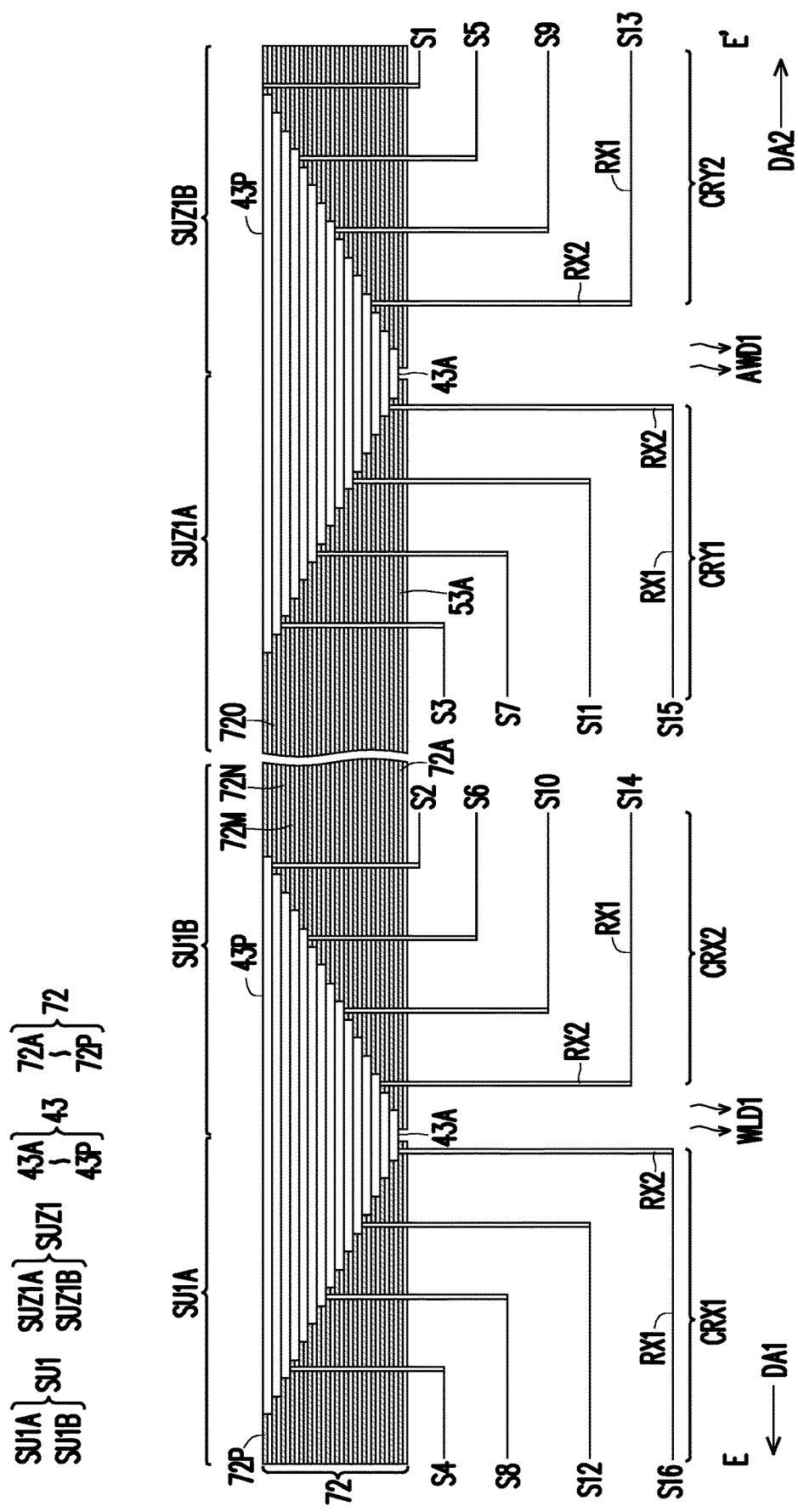
FIG. 25A and FIG. 25B illustrate simplified cross-sectional views of the semiconductor structure shown in FIG. 24.
Figure 25B:
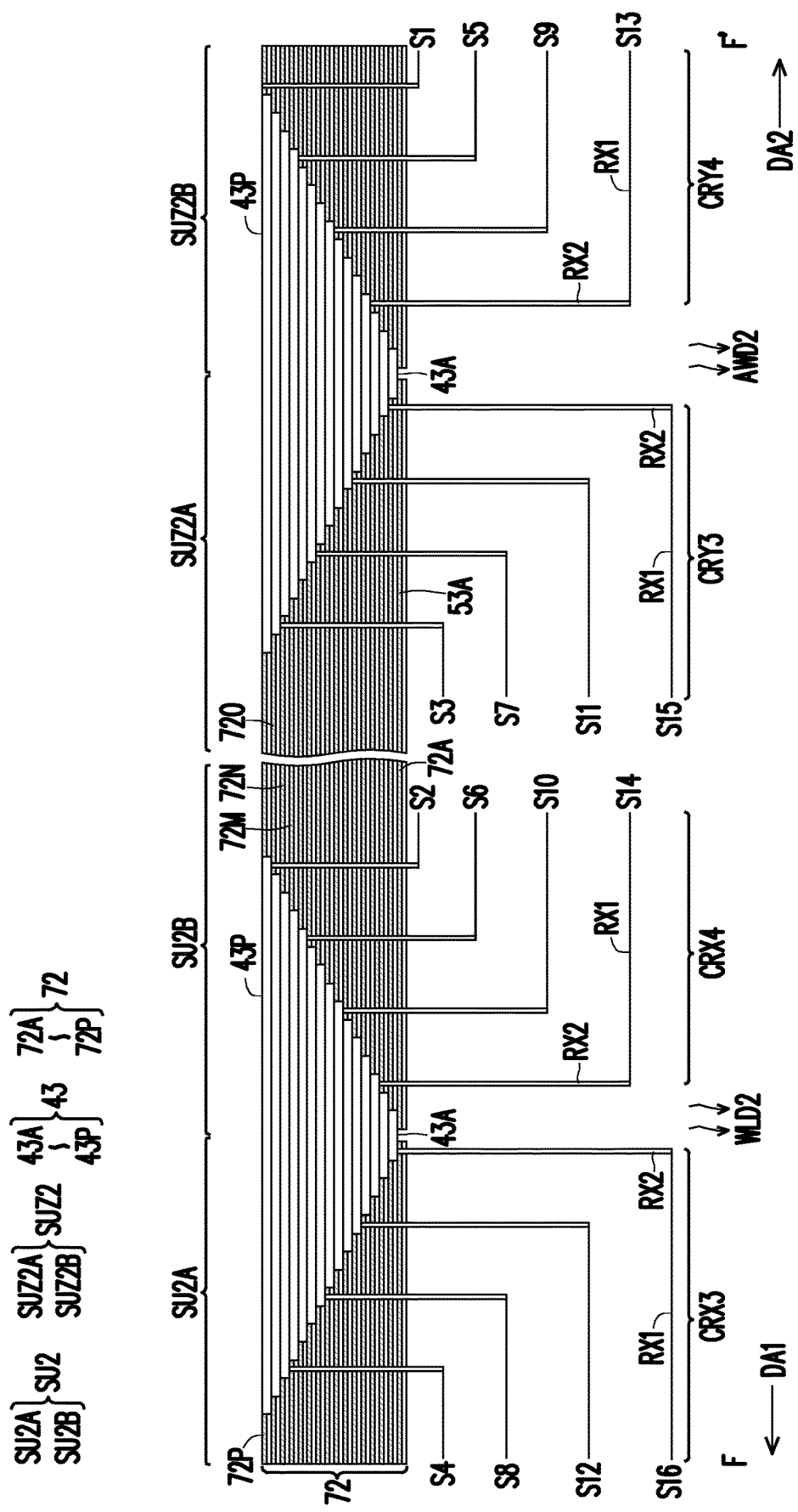

FIG. 24 illustrates a simplified top down view of a semiconductor structure in accordance with some other embodiments of the disclosure. FIG. 25A and FIG. 25B illustrate simplified cross-sectional views of the semiconductor structure shown in FIG. 24. The semiconductor structure SMP3 illustrated in FIG. 24 and FIGS. 25A~25B is similar to the semiconductor structure SMP2 illustrated in FIG. 22 and FIGS. 23A~23B. Therefore, the same reference numerals are used to refer to the same or liked parts, and its detailed description will not be repeated herein. The difference between the semiconductor structure SMP3 and the semiconductor structure SMP2 is that the number of conductive routings CRX and the number conductive routings CRY used for connection are further reduced.

As illustrated in FIG. 25A, since the word lines 72 extends from the array region ARX to the sub-array region ARY, and the mirror image steps (SU1A and SU1B; SUZ1A and SUZ1B) are connected together through the conductive bridge structures 43, thus each layer of word lines 72 may be electrically connected to the first word line driver WLD1 or the first auxiliary word line driver AWD1 by a single conductive routing (CRX1, CRX2, CRY1 or CRY2). For example, a word line 72P (the topmost word line at step S1) is physically and electrically connected to the second auxiliary conductive routings CRY2 and driven by the first auxiliary word line driver AWD1. A second word line 72O (word line at step S2) is physically and electrically connected to the second conductive routings CRX2 and driven by the first word line driver WLD1. A third word line 72N (word line at step S3) is physically and electrically connected to the first auxiliary conductive routings CRY1 and driven by the first auxiliary word line driver AWD1. A fourth word line 72M (word line at step S4) is physically and electrically connected to the first conductive routings CRX1 and driven by the first word line driver WLD1. As such, each of the word lines 72 is respectively connected to either one of the first word line driver WLD1 and the first auxiliary word line driver AWD1, and driven by one of the word line drivers (WLD1 or AWD1).

Similarly, as illustrated in FIG. 25B, since the word lines 72 extends from the array region ARX to the sub-array region ARY, and the mirror image steps (SU2A and SU2B; SUZ2A and SUZ2B) are connected together through the conductive bridge structures 43, thus each layer of word lines 72 may be electrically connected to the second word line driver WLD2 or the second auxiliary word line driver AWD2 by a single conductive routing (CRX3, CRX4, CRY3 or CRY4). For example, a word line 72P (the topmost word line at step S1) is physically and electrically connected to the fourth auxiliary conductive routings CRY4 and driven by the second auxiliary word line driver AWD2. A second word line 72O (word line at step S2) is physically and electrically connected to the fourth conductive routings CRX4 and driven by the second word line driver WLD2. A third word line 72N (word line at step S3) is physically and electrically connected to the third auxiliary conductive routings CRY3 and driven by the second auxiliary word line driver AWD2. A fourth word line 72M (word line at step S4) is physically and electrically connected to the third conductive routings CRX3 and driven by the second word line driver WLD2. As such, each of the word lines 72 is respectively connected to either one of the second word line driver WLD2 and the second auxiliary word line driver AWD2, and driven by one of the word line drivers (WLD2 or AWD2).

Therefore, in the exemplary embodiment, in a case when the number of layers of the word lines 72 is X, then the number A1 of the first conductive routings CRX1 extending from the first staircase steps SU1A in the first staircase region SRX1, the number A2 of the second conductive routings CRX2 extending from the second staircase steps SU1B in the first staircase region SRX1, the number A3 of the third conductive routings CRX3 extending from the third staircase steps SU2A in the second staircase region SRX2, the number A4 of the fourth conductive routings CRX4 extending from the fourth staircase steps SU2B in the second staircase region SRX2 will fulfill: X/A1=4; X/A2=4; X/A3=4 and X/A4=4.

Similarly, in a case when the number of layers of the word lines 72 is X, then the number B1 of the first auxiliary conductive routings CRY1 extending from the first auxiliary staircase steps SUZ1A in the first auxiliary staircase region ASR1, the number B2 of the second auxiliary conductive routings CRY2 extending from the second auxiliary staircase steps SUZ1B in the first auxiliary staircase region ASR1, the number B3 of the third auxiliary conductive routings CRY3 extending from the third auxiliary staircase steps SUZ2A in the second auxiliary staircase region ASR2, the number B4 of the fourth auxiliary conductive routings CRY4 extending from the fourth auxiliary staircase steps SUZ2B in the second auxiliary staircase region ASR2 will fulfill: X/B1=4; X/B2=4; X/B3=4 and X/B4=4. As such, the total amount of conductive routings CRX (or metallization layers) and conductive routings CRY (or metallization layers) extending from the mirror images steps of the staircase units (SU1, SU2, SUZ1 and SUZ2) may be further reduced.

In the above-mentioned embodiments, the semiconductor structure is designed to include staircase units having mirror image steps in an area surrounded by the array region (memory array). Furthermore, conductive bridge structures are used to electrically connected the mirror image steps in each of the staircase units. As such, when using conductive routings to electrically connect the staircase steps to their respective word line drivers through bi-directional routing, the total amount of conductive routings (or metallization layers) used may be significantly reduced. Overall, the fabrication process may be simplified and the fabrication costs are reduced.

In accordance with some embodiments of the present disclosure, a semiconductor structure includes a memory array, a staircase unit, conductive bridge structures, a word line driver and conductive routings. The memory array is disposed in an array region of the semiconductor structure, wherein the memory array includes a plurality of word lines. The staircase unit is disposed in a staircase region of the semiconductor structure and surrounded by the array region, wherein the staircase unit includes first staircase steps and second staircase steps extending from the plurality of word lines of the memory array. The first staircase steps and the second staircase steps face towards each other. The conductive bridge structures are electrically connecting the first staircase steps to the second staircase step. The word line driver is disposed below the memory array and the staircase unit, wherein a central portion of the word line driver is overlapped with a central portion of the staircase unit. The conductive routings extend from the first staircase steps and the second staircase steps to the word line driver.

In accordance with some other embodiments of the present disclosure, a semiconductor structure includes a bottom interconnection array and a memory device. The bottom interconnection array includes a first word line driver and an auxiliary word line driver spaced apart from one another in a first direction. The memory device is disposed above the bottom interconnection array and includes an array region, a first staircase region, a sub-array region, an auxiliary staircase region, conductive bridge structures and conductive routings. The array region is disposed on the bottom interconnection array and partially overlapped with the first word line driver. The first staircase region is disposed on the first word line driver and surrounded by the array region, wherein the first staircase region includes mirror image steps. The sub-array region is disposed on the bottom interconnection array and partially overlapped with the auxiliary word line driver. The auxiliary staircase region is disposed on the auxiliary word line driver and surrounded by the sub-array region, wherein the auxiliary staircase includes mirror image steps. The conductive bridge structures are disposed on the first word line driver and the auxiliary word line driver, wherein the conductive bridge structures extend along the first direction and are electrically connected to the mirror image steps of the first staircase region and the mirror image steps of the auxiliary staircase region. The conductive routings are extending from the mirror image steps of the first staircase region to the first word line driver, and extending from the mirror image steps of the auxiliary staircase region to the auxiliary word line driver.

In accordance with yet another embodiment of the present disclosure, a method of fabricating a semiconductor structure is described. The method includes the following steps. A word line driver is provided over a semiconductor substrate. A first portion of routings is formed to be electrically connected to the word line driver. A multilayer stack is formed over the word line driver and over the first portion of routings. The multilayer stack is patterned to form a memory array and a staircase unit, wherein the memory array is disposed in an array region of the semiconductor structure and includes a plurality of word lines, and the stair case unit is disposed in a staircase region of the semiconductor structure and surrounded by the array region, wherein the staircase unit includes first staircase steps and second staircase steps extending from the plurality of word lines of the memory array, and the first staircase steps and the second staircase steps face towards each other. Conductive bridge structures are formed to connect the first staircase steps to the second staircase steps. A second portion of routings are formed to be electrically connected to the first portion of routings and the stair case unit. The conductive routings constituted by the first portion of routings and the second portion of routings are extending from the first staircase steps and the second staircase steps towards the word line driver.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a memory array disposed in an array region of the semiconductor structure, wherein the memory array comprises a plurality of word lines;
a staircase unit disposed in a staircase region of the semiconductor structure and surrounded by the array region, wherein the staircase unit comprises first staircase steps and second staircase steps extending from the plurality of word lines of the memory array, and the first staircase steps and the second staircase steps face towards each other;
a plurality of conductive bridge structures electrically connecting the first staircase steps to the second staircase steps, wherein each of the plurality of conductive bridge structures are extending from one step of the first staircase steps to one step of the second staircase steps in a horizontal direction, and wherein each of the plurality of conductive bridge structures extending in the horizontal direction are physically separated from one another and are arranged in parallel to one another;
a word line driver disposed below the memory array and the staircase unit, wherein a central portion of the word line driver is overlapped with a central portion of the staircase unit; and
conductive routings, extending from the first staircase steps and the second staircase steps to the word line driver; and
a plurality of dielectric layers extending from the first staircase steps to the second staircase steps in the horizontal direction, wherein each of the plurality of dielectric layers are separated from one another by the plurality of conductive bridge structures, and the plurality of dielectric layers cover and physically contact top surfaces of the conductive routings.

2. The semiconductor structure according to claim 1, wherein the conductive routings comprise:
first conductive routings extending in a first direction from the first staircase steps to a first half of the word line driver; and
second conductive routings extending in a second direction from the second staircase steps to a second half of the word line driver, wherein the second direction is opposite to the first direction.

3. The semiconductor structure according to claim 2, wherein the first staircase steps and the second staircase steps respectively comprises odd number steps and even number steps, and wherein,
in the first staircase steps, the odd number steps are electrically connected to the word line driver directly through the first conductive routings, and the even numbers steps are electrically connected to the word line driver through the plurality of conductive bridge structures and the second conductive routings, and
in the second staircase steps, the odd number steps are electrically connected to the word line driver through the plurality of conductive bridge structures and the first conductive routings, and the even number steps are electrically connected to the word line driver directly through the second conductive routings.

4. The semiconductor structure according to claim 1, wherein the first staircase steps and the second staircase steps are mirror image steps.

5. The semiconductor structure according to claim 1, further comprising:
a plurality of source lines and a plurality of bit lines electrically connected to the memory array, wherein an extension direction of the plurality of source lines and the plurality of bit lines is perpendicular to an extension direction of the plurality of word lines.

6. The semiconductor structure according to claim 5, further comprising:
a second staircase unit disposed in a second staircase region of the semiconductor structure and surrounded by the array region, wherein the second staircase unit comprises third staircase steps and fourth staircase steps extending from the plurality of word lines of the memory array, and the third staircase steps and the fourth staircase steps face towards each other, and wherein the second staircase unit and the first staircase unit do not overlap one another in the extension direction of the plurality of source lines and the plurality of bit lines, and do not overlap one another in the extension direction of the plurality of word lines; and a second word line driver disposed below the memory array and the second staircase unit, wherein a central portion of the second word line driver is overlapped with a central portion of the second staircase unit.

7. The semiconductor structure according to claim 5, further comprising: a sub memory array disposed in a sub-array region of the semiconductor structure aside the memory array, wherein the sub memory array comprises the plurality of word lines extending out from the memory array; a first auxiliary staircase unit disposed in an auxiliary staircase region of the semiconductor structure surrounded by the sub-array region, wherein the first auxiliary staircase unit comprises first auxiliary staircase steps and second auxiliary staircase steps, the first auxiliary staircase steps and the second auxiliary staircase steps face towards each other, and wherein the first auxiliary staircase unit in the sub-array region overlaps with the first staircase unit in the array region in the extension direction of the plurality of word lines; and an auxiliary word line driver disposed below the sub-memory array and the first auxiliary staircase unit, wherein a central portion of the auxiliary word line driver is overlapped with a central portion of the first auxiliary staircase unit.

8. The semiconductor structure according to claim 7, wherein each of the plurality of word lines is respectively connected to both of the word line driver and the auxiliary word line driver.

9. The semiconductor structure according to claim 7, wherein each of the plurality of word lines is respectively connected to either one of the word line driver and the auxiliary word line driver.

10. A semiconductor structure, comprising:
a bottom interconnection array, comprising a first word line driver and an auxiliary word line driver spaced apart from one another in a first direction;
a memory device disposed above the bottom interconnection array, wherein the memory device comprises:
an array region disposed on the bottom interconnection array and partially overlapped with the first word line driver;
a first staircase region disposed on the first word line driver and surrounded by the array region, wherein the first staircase region comprises mirror image steps;
a sub-array region disposed on the bottom interconnection array and partially overlapped with the auxiliary word line driver;
an auxiliary staircase region disposed on the auxiliary word line driver and surrounded by the sub-array region, wherein the auxiliary staircase region comprises mirror image steps;
conductive bridge structures disposed on the first word line driver and the auxiliary word line driver, wherein the conductive bridge structures extend along the first direction and are electrically connected to the mirror image steps of the first staircase region and the mirror image steps of the auxiliary staircase region; and conductive routings, extending from the mirror image steps of the first staircase region to the first word line driver, and extending from the mirror image steps of the auxiliary staircase region to the auxiliary word line driver.

11. The semiconductor structure according to claim 10, wherein the conductive routings comprise:
first conductive routings extending from one side of the mirror image steps of the first staircase region to the first word line driver;
second conductive routings extending from another side of the mirror image steps of the first staircase region to the first word line driver;
first auxiliary conductive routings extending from one side of the mirror image steps of the auxiliary staircase region to the auxiliary word line driver; and
second auxiliary conductive routings extending from another side of the mirror image steps of the auxiliary staircase region to the auxiliary word line driver.

12. The semiconductor structure according to claim 11, wherein the memory device further comprises a plurality of word lines disposed in the array region and the sub-array region, and extending towards the first staircase region and the auxiliary staircase region, and the plurality of word lines comprises:
a first word line physically and electrically connected to the first conductive routings and the first auxiliary conductive routings and driven by the first word line driver and the auxiliary word line driver; and
a second word line physically and electrically connected to the second conductive routings and the second auxiliary conductive routings, and driven by the first word line driver and the auxiliary word line driver.

13. The semiconductor structure according to claim 12, wherein in a case when the number of layers of the plurality of word lines is X, then the number A1 of the first conductive routings extending from the mirror image steps of the first staircase region, the number A2 of the second conductive routings extending from the mirror image steps of the first staircase region, the number B1 of the first auxiliary conductive routings extending from the mirror image steps of the auxiliary staircase region, and the number B2 of the second auxiliary conductive routings extending from the mirror image steps of the auxiliary staircase region will fulfill: X/A1=2; X/A2=2; X/B1=2 and X/B2=2.

14. The semiconductor structure according to claim 11, wherein the memory device further comprises a plurality of word lines disposed in the array region and the sub-array region, and extending towards the first staircase region and the auxiliary staircase region, and the plurality of word lines comprises:
a first word line physically and electrically connected to the second auxiliary conductive routings and driven by the auxiliary word line driver;
a second word line physically and electrically connected to the second conductive routings and driven by the first word line driver;
a third word line physically and electrically connected to the first auxiliary conductive routings and driven by the auxiliary word line driver; and
a fourth word line physically and electrically connected to the first conductive routings and driven by the first word line driver.

15. The semiconductor structure according to claim 14, wherein in a case when the number of layers of the plurality of word lines is X, then the number A1 of the first conductive routings extending from the mirror image steps of the first staircase region, the number A2 of the second conductive routings extending from the mirror image steps of the first staircase region, the number B1 of the first auxiliary conductive routings extending from the mirror image steps of the auxiliary staircase region, and the number B2 of the second auxiliary conductive routings extending from the mirror image steps of the auxiliary staircase region will fulfill: X/A1=4; X/A2=4; X/B1=4 and X/B2=4.

16. A method of fabricating a semiconductor structure, comprising:
    providing a word line driver over a semiconductor substrate;
    forming a first portion of routings electrically connected to the word line driver;
    forming a multilayer stack over the word line driver and over the first portion of routings;
    patterning the multilayer stack to form a memory array and a staircase unit, wherein the memory array is disposed in an array region of the semiconductor structure and comprises a plurality of word lines, and the staircase unit is disposed in a staircase region of the semiconductor structure and surrounded by the array region, wherein the staircase unit comprises first staircase steps and second staircase steps extending from the plurality of word lines of the memory array, and the first staircase steps and the second staircase steps face towards each other, and wherein the word line driver is disposed below the memory array and the staircase unit, and a central portion of the word line driver is overlapped with a central portion of the staircase unit;
    forming a plurality of conductive bridge structures connecting the first staircase steps to the second staircase steps, wherein each of the plurality of conductive bridge structures are extending from one step of the first staircase steps to one step of the second staircase steps in a horizontal direction, and wherein each of the plurality of conductive bridge structures extending in the horizontal direction are physically separated from one another and are arranged in parallel to one another;
    forming a plurality of dielectric layers extending from the first staircase steps to the second staircase steps in the horizontal direction, wherein each of the plurality of dielectric layers are separated from one another by the plurality of conductive bridge structures; and
    forming a second portion of routings electrically connected to the first portion of routings and the stair case unit, wherein conductive routings constituted by the first portion of routings and the second portion of routings are extending from the first staircase steps and the second staircase steps towards the word line driver, and the plurality of dielectric layers cover and physically contact top surfaces of the conductive routings.

17. The method of fabricating a semiconductor structure according to claim 16, further comprising:
    forming a plurality of source lines and a plurality of bit lines electrically connected to the memory array, wherein an extension direction of the plurality of source lines and the plurality of bit lines is perpendicular to an extension direction of the plurality of word lines.

18. The method of fabricating a semiconductor structure according to claim 16, further comprising: providing an auxiliary word line driver over the semiconductor substrate, wherein the auxiliary word line driver is spaced apart from the word line driver; and patterning the multilayer stack to form a sub memory array and a first auxiliary staircase unit, wherein the sub memory array is disposed aside the memory array and comprises the plurality of word lines extending out from the memory array, the first auxiliary staircase unit comprises first auxiliary staircase steps and second auxiliary staircase steps, the first auxiliary staircase steps and the second auxiliary staircase steps face towards each other, and wherein the first auxiliary staircase unit in the sub-array region overlaps with the first staircase unit in the array region in the extension direction of the plurality of word lines, while a central portion of the auxiliary word line driver is overlapped with a central portion of the first auxiliary staircase unit.

19. The method of fabricating a semiconductor structure according to claim 16, wherein the conductive routings are formed with first conductive routings and second conductive routings, the first conductive routings are extending in a first direction from the first staircase steps to a first half of the word line driver, the second conductive routings are extending in a second direction from the second staircase steps to a second half of the word line driver, wherein the first direction is opposite to the first direction.

20. The method of fabricating a semiconductor structure according to claim 19, wherein the first staircase steps and the second staircase steps are formed with odd number steps and even number steps, and wherein the first conductive routings are formed to directly connect the odd number steps of the first staircase steps to the word line driver, and the second conductive routings are formed to directly connect the even number steps of the second staircase steps to the word line driver.

* * * * *